(12) United States Patent
Miyamoto et al.

(10) Patent No.: US 10,154,175 B2
(45) Date of Patent: Dec. 11, 2018

(54) CIRCUIT BOARD, IMAGING DEVICE, AND ELECTRONIC APPARATUS

(71) Applicant: SONY CORPORATION, Tokyo (JP)

(72) Inventors: Takashi Miyamoto, Kanagawa (JP); Yoshiyuki Akiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/572,234

(22) PCT Filed: May 2, 2016

(86) PCT No.: PCT/JP2016/063532
§ 371 (c)(1),
(2) Date: Nov. 7, 2017

(87) PCT Pub. No.: WO2016/181874
PCT Pub. Date: Nov. 17, 2016

(65) Prior Publication Data
US 2018/0131846 A1    May 10, 2018

(30) Foreign Application Priority Data
May 14, 2015 (JP) .................................. 2015-098787

(51) Int. Cl.
*H04N 5/217*    (2011.01)
*H01L 21/3205*    (2006.01)
(Continued)

(52) U.S. Cl.
CPC ......... *H04N 5/217* (2013.01); *H01L 21/3205* (2013.01); *H01L 21/768* (2013.01);
(Continued)

(58) Field of Classification Search
CPC . H01L 21/3205; H01L 21/768; H01L 27/146; H04N 5/217; H04N 5/357;
(Continued)

(56) References Cited

U.S. PATENT DOCUMENTS 5,639,989 A * 6/1997 Higgins, III .......... H01L 23/552
174/386
5,864,088 A * 1/1999 Sato ...................... H01L 23/552
174/386

(Continued)

FOREIGN PATENT DOCUMENTS

JP   05-120928    5/1993
JP   09-502304    3/1997

(Continued)

OTHER PUBLICATIONS

International Search Report prepared by the Japan Patent Office dated Jul. 8, 2016, for International Application No. PCT/JP2016/063532.

*Primary Examiner* — Chia Wei A Chen
(74) *Attorney, Agent, or Firm* — Sheridan Ross P.C.

(57) ABSTRACT

The present technology relates to a circuit board, an imaging device, and an electronic apparatus capable of suppressing the generation of a noise in a conductor loop according to a magnetic field on the periphery of a side end portion of a conductor group. A circuit board of the present technology includes: a conductor group, in which a conductor through which a current flows in a first direction and a conductor through which a current flows in a second direction are aligned in a third direction. A conductor of at least one end portion of the conductor group in the third direction suppresses an induced electromotive force generated in the conductor loop in accordance with a magnetic field generated on the periphery of the conductor group in the third direction. The present technology can be, for example, applied to an imaging device and an electronic apparatus.

20 Claims, 32 Drawing Sheets

(51) Int. Cl.
H01L 23/522 (2006.01)
H01L 21/768 (2006.01)
H01L 27/146 (2006.01)
H04N 5/369 (2011.01)
H05K 1/02 (2006.01)
H04N 5/357 (2011.01)

(52) U.S. Cl.
CPC .......... H01L 23/522 (2013.01); H01L 27/146 (2013.01); H04N 5/357 (2013.01); H04N 5/369 (2013.01); H05K 1/02 (2013.01); *H01L 27/14618* (2013.01); *H01L 27/14634* (2013.01); *H01L 2224/16145* (2013.01); *H01L 2224/48091* (2013.01); *H01L 2224/48227* (2013.01); *H01L 2224/73257* (2013.01); *H01L 2924/15311* (2013.01); *H01L 2924/181* (2013.01)

(58) Field of Classification Search
CPC .... H04N 5/369; H04N 5/2253; H04N 5/3658; H04N 3/1568; H04N 5/3577; H04N 5/363; H05K 1/02; G06K 9/40
See application file for complete search history.

(56) References Cited

U.S. PATENT DOCUMENTS

| | | | | |
|---|---|---|---|---|
| 2003/0132494 | A1* | 7/2003 | Tuttle | H01L 23/3107 257/433 |
| 2003/0231093 | A1* | 12/2003 | Hsu | H01F 17/0006 336/200 |
| 2005/0275061 | A1* | 12/2005 | Ohguro | H01L 21/6835 257/531 |
| 2007/0278628 | A1* | 12/2007 | Katti | H01L 23/552 257/659 |
| 2011/0304015 | A1* | 12/2011 | Kim | H01L 23/552 257/532 |
| 2014/0240588 | A1* | 8/2014 | Sakuragi | H04N 5/2252 348/373 |
| 2016/0178758 | A1* | 6/2016 | Sano | H04N 5/32 250/394 |

FOREIGN PATENT DOCUMENTS

| | | |
|---|---|---|
| JP | 2007-150000 A | 6/2007 |
| JP | 2007-180110 A | 7/2007 |
| JP | 2014-44785 A | 3/2014 |

* cited by examiner

FIG. 7
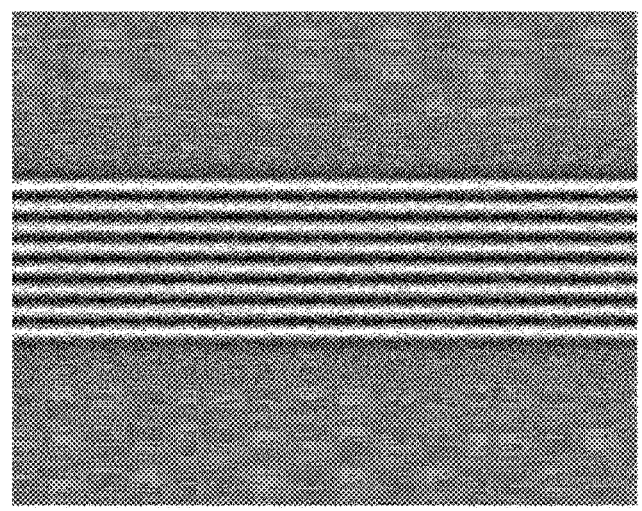
A
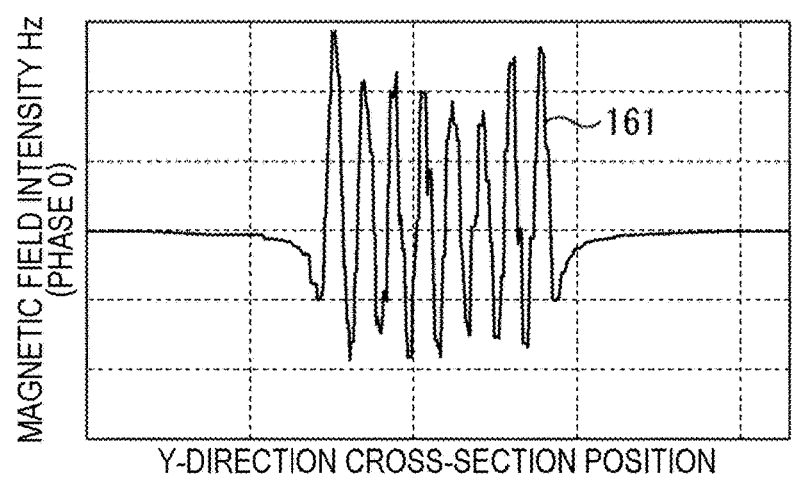
B

FIG. 18
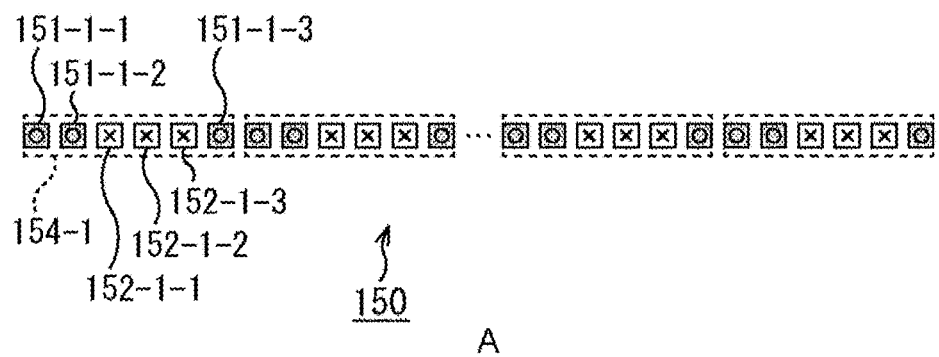
A
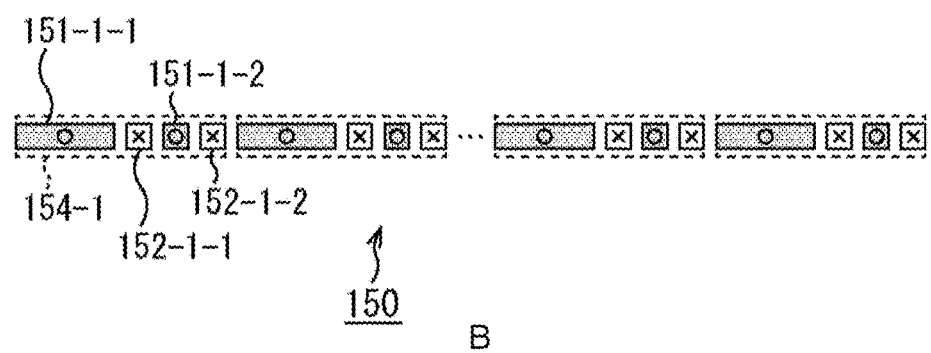
B
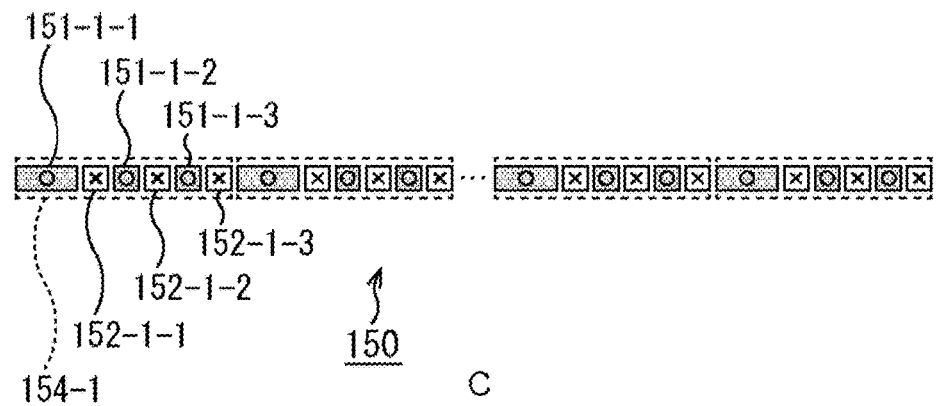
C

CIRCUIT BOARD, IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2016/063532 having an international filing date of 2 May 2016, which designated the United States, which PCT application claimed the benefit of Japanese Patent Application No. 2015-098787 filed 14 May 2015, the disclosures of which are incorporated herein by reference in their entirety.

TECHNICAL FIELD

The present technology relates to a circuit board, an imaging device, and an electronic apparatus, and more particularly, a circuit board, an imaging device, and an electronic apparatus capable of suppressing the generation of a noise in a conductor loop according to a magnetic field on the periphery of a side end portion of a conductor group.

BACKGROUND ART

For example, in a semiconductor integrated circuit or the like, in a case where a circuit in which a conductor loop is formed near a wiring is present, a magnetic field intensity near the wiring changes according to a change in a current flowing through the wiring, and there is concern that an induced electromotive force generated in the conductor loop in accordance therewith, and a noise is generated in the conductor loop.

Meanwhile, a wiring structure offsetting a magnetic flux generated according to a current flowing through a conductor is considered (for example, Patent Document 1 and Patent Document 2).

CITATION LIST

Patent Document

Patent Document 1: Japanese Patent Application Laid-Open No. 05-120928
Patent Document 2: Japanese Translation of PCT International Application Publication No. 09-502304

SUMMARY OF THE INVENTION

Problems to be Solved by the Invention

However, even in such a set of wirings having a structure offsetting a magnetic flux, the magnetic flux is not offset on the periphery of a side end portion of the set, and thus, there is concern that an induced electromotive force is generated in a conductor loop in accordance therewith, and accordingly, a noise is generated in a conductor loop.

The present technology is proposed in consideration of such situations, and an object thereof is to suppress the generation of a noise in a conductor loop according to a magnetic field on the periphery of a side end portion of a conductor group.

Solutions to Problems

One aspect of the present technology is a circuit board including: a conductor group, in which a conductor through which a current flows in a first direction and a conductor through which a current flows in a second direction that is approximately the opposite direction of the first direction are aligned in a third direction at positions at which an induced electromotive force is generated in a conductor loop in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

A current of the conductor of the end portion may be smaller than a current of another conductor.

A cross-sectional area of a face of the conductor of the end portion that is vertical to the first direction may be narrower than a cross-sectional area of a face of another conductor that is vertical to the first direction.

The cross-sectional area of the face of the conductor of the end portion that is vertical to the first direction may be about ½ of the cross-sectional area of the face of another conductor that is vertical to the first direction.

A width of the conductor of the end portion may be narrower than a width of another conductor.

A thickness of the conductor of the end portion may be smaller than a thickness of another conductor.

Electric resistance of the conductor of the end portion may be higher than electric resistance of another conductor.

Series electric resistance for the conductor of the end portion may be higher than series electric resistance for another conductor.

A conductor through which the current flows in the opposite direction of the direction of the current of the conductor of the end portion near the conductor of the end portion may further be included.

The current of the conductor through which the current flows in the opposite direction of the direction of the current of the conductor of the end portion may be smaller than the current of the conductor of the end portion.

A cross-sectional area of a face of the conductor through which the current flows in the opposite direction of the direction of the current of the conductor of the end portion that is vertical to the first direction may be narrower than a cross-sectional area of a face of the conductor of the end portion that is vertical to the first direction.

Electric resistance of the conductor through which the current flows in the opposite direction of the direction of the current of the conductor of the end portion may be higher than electric resistance of the conductor of the end portion.

Series electric resistance for the conductor through which the current flows in the opposite direction of the direction of the current of the conductor of the end portion may be higher than series electric resistance for the conductor of the end portion.

A gap between the conductor of the end portion and another conductor adjacent to the conductor of the end portion and a gap between other conductors may be different from each other.

A position of the conductor of the end portion in a fourth direction vertical to the first direction and the third direction may be different from a position of another conductor in the fourth direction.

A current changing with respect to a time may flow at approximately same timing in each conductor of the conductor group as the current.

The conductor group may have a periodical structure in which a plurality of conductor sets each formed by the conductors through which the current flows in the first direction aligned in predetermined order in the third direction and the conductor through which the current flows in the second direction are aligned in the third direction.

At least any one of a width, a thickness, a length, conductivity, electric resistance, series electric resistance, joint impedance, series joint impedance, a gap, the number, a position in a fourth direction vertical to the first direction and the third direction, and the number of layers in the fourth direction may be different between the conductor through which the current flows in the first direction and the conductor through which the current flows in the second direction in the conductor set.

Another aspect of the present technology is an imaging device including: a pixel unit including a plurality of pixels that performs photoelectric conversion of light transmitted from a subject in which a conductor loop formed by conductors having a size and a shape according to a selected pixel in selecting the pixel is substantially configured; and a conductor group, in which a conductor through which a current flows in a first direction and a conductor through which a current flows in a second direction that is approximately the opposite direction of the first direction are aligned in a third direction at positions at which an induced electromotive force is generated in the conductor loop formed by the pixel unit in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

Still another aspect of the present technology is an electronic apparatus including: an imaging unit that images a subject; and an image processing unit that performs image processing of image data acquired by imaging performed by the imaging unit, in which the imaging unit includes: a pixel unit including a plurality of pixels that performs photoelectric conversion of light transmitted from the subject in which a conductor loop formed by conductors having a size and a shape according to a selected pixel in selecting the pixel is substantially configured; and a conductor group, in which a conductor through which a current flows in a first direction and a conductor through which a current flows in a second direction that is approximately the opposite direction of the first direction are aligned in a third direction at positions at which an induced electromotive force is generated in the conductor loop formed by the pixel unit in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

According to one aspect of the present technology, there is provided a conductor group, in which a conductor through which a current flows in a first direction and a conductor through which a current flows in a second direction that is approximately the opposite direction of the first direction are aligned in a third direction at positions at which an induced electromotive force is generated in a conductor loop in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

According to another aspect of the present technology, there is provided an imaging device including: a pixel unit including a plurality of pixels that performs photoelectric conversion of light transmitted from a subject in which a conductor loop formed by conductors having a size and a shape according to a selected pixel in selecting the pixel is substantially configured; and a conductor group, in which a conductor through which a current flows in a first direction and a conductor through which a current flows in a second direction that is approximately the opposite direction of the first direction are aligned in a third direction at positions at which an induced electromotive force is generated in the conductor loop formed by the pixel unit in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

According to another aspect of the present technology, there is provided an electronic apparatus including: an imaging unit that images a subject; and an image processing unit that performs image processing of image data acquired by imaging performed by the imaging unit, in which the imaging unit includes: a pixel unit including a plurality of pixels that performs photoelectric conversion of light transmitted from the subject in which a conductor loop formed by conductors having a size and a shape according to a selected pixel in selecting the pixel is substantially configured; and a conductor group, in which a conductor through which a current flows in a first direction and a conductor through which a current flows in a second direction that is approximately the opposite direction of the first direction are aligned in a third direction at positions at which an induced electromotive force is generated in the conductor loop formed by the pixel unit in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

Effects of the Invention

According to the present technology, a captured image can be acquired. In addition, according to the present technology, the occurrence of a noise in a conductor loop according to a magnetic field on the periphery of a side end portion of a conductor group can be suppressed.

BRIEF DESCRIPTION OF DRAWINGS

FIG. 7 is a diagram that illustrates an example of the distribution of a magnetic field intensity.

FIG. 18 is a diagram that illustrates an example of the configuration of a conductor group.

MODE FOR CARRYING OUT THE INVENTION

Hereinafter, embodiments for performing the present disclosure (hereinafter, referred to as embodiments) will be described. Note that the description will be presented in the following order.

1. First Embodiment (Image Sensor)
2. Second Embodiment (Imaging Apparatus)

1. First Embodiment

<Conductor Loop and Magnetic Flux>

For example, in a semiconductor integrated circuit or the like, in a case where a circuit in which a conductor loop is formed is present near a power source wiring, an induced electromotive force is generated in a conductor loop orthogonal to a magnetic force line generated from the power source wiring, and accordingly, there is concern that a noise is generated in the conductor loop.

Figure 1:
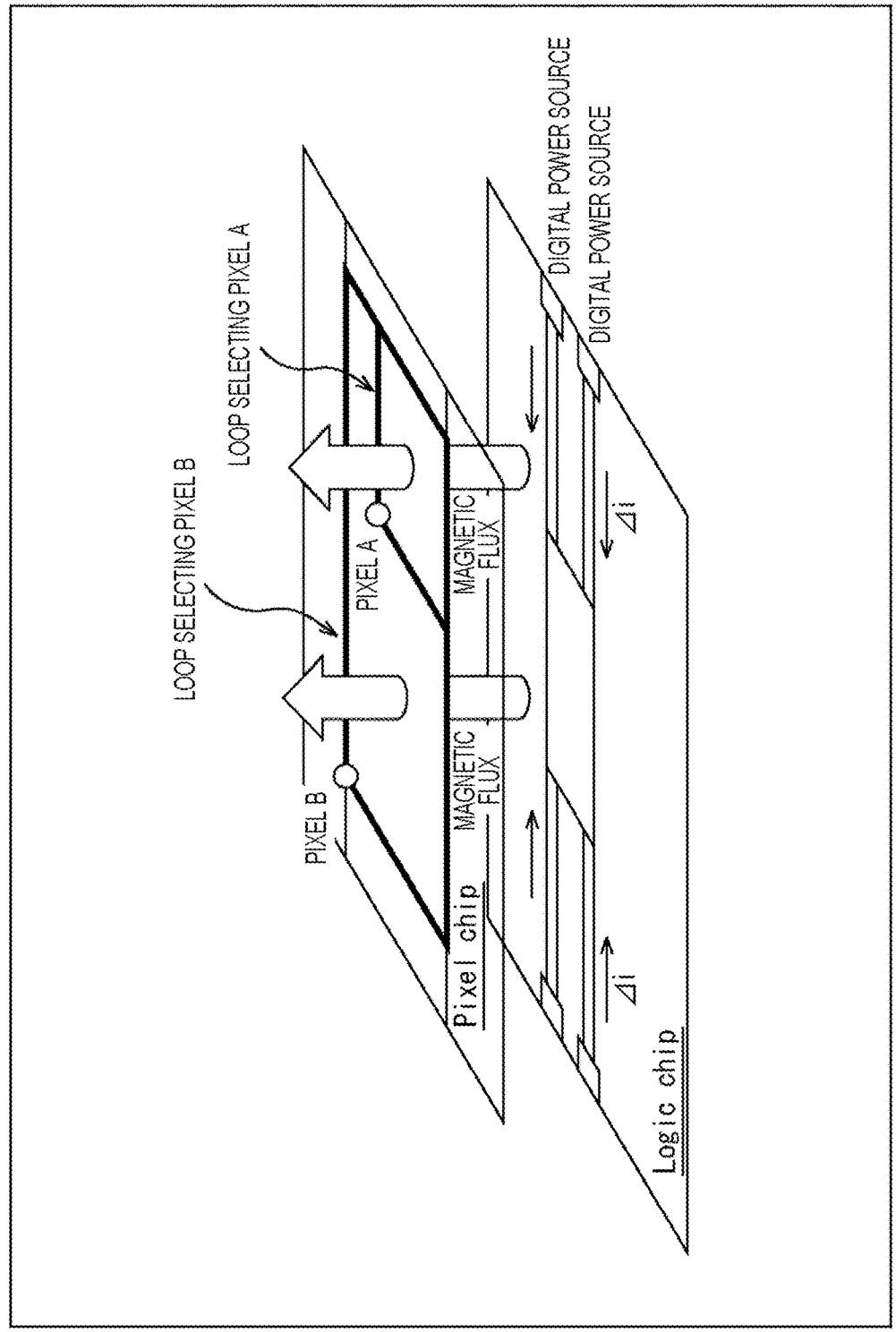
FIG. 1 is a diagram that illustrates a change in an induced electromotive force according to a change in a conductor loop.

For example, in a semiconductor device for imaging such as a so-called image sensor as illustrated in FIG. 1, a conductor loop is formed in a pixel area of a pixel chip, and, near the conductor loop in logic chip stacked in the pixel chip, a power source wiring used for supplying digital power is formed. Thus, magnetic fluxes according to the power source wiring pass though the inside of a loop plane of the conductor loop, and an induced electromotive force is generated in the conductor loop in accordance therewith.

The size of the conductor loop formed in this pixel area changes according to the position of a selected pixel. In the case of the example illustrated in FIG. 1, the size and the shape of a conductor loop formed when a pixel A is selected are different from the size and the shape of a conductor loop formed when a pixel B located at a position different from that of the pixel A.

When the size of the conductor loop changes in this way, a magnetic flux passing through the inside of the loop plane of the conductor loop changes, and there is concern that an induced electromotive force generated in the conductor loop significantly changes in accordance therewith. In addition, there is concern that a noise is generated in a pixel signal read from a pixel in accordance with the change in the induced electromotive force. Thus, there is concern that an image noise having a stipe shape is generated in a captured image in accordance with the noise. In other words, there is concern that the image quality of a captured image is degraded.

Thus, the generation of a noise in a conductor loop according to an induced electromotive force is configured to be suppressed.

<Image Sensor>

Figure 2:
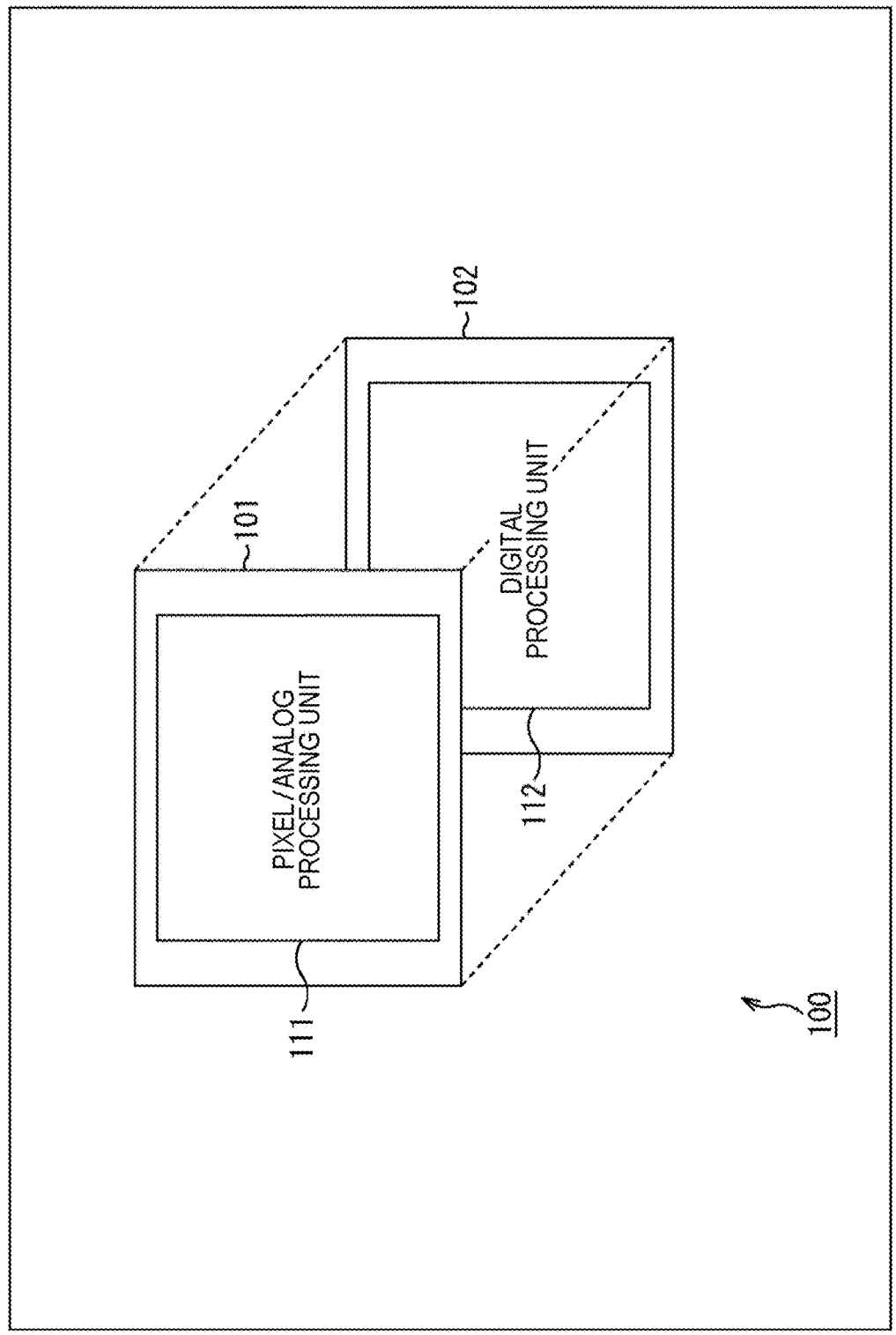
FIG. 2 is a diagram that illustrates an example of a main configuration of an image sensor.

FIG. 2 is a diagram that illustrates an example of a main configuration of an image sensor that is an embodiment of a circuit board (or an imaging device) to which the present technology is applied.

The image sensor 100 illustrated in FIG. 2 is a device that performs a photoelectric conversion of light transmitted from a subject and outputs the converted light as image data. For example, the image sensor 100 is configured as a CMOS image sensor using a complementary metal oxide semiconductor (CMOS), a CCD image sensor using a charge coupled device (CCD), or the like.

As illustrated in FIG. 2, the image sensor 100 includes two semiconductor substrates (stacking chip (a pixel chip 101 and a logic chip 102)) overlapping each other.

In the pixel chip 101, a pixel/analog processing unit 111 in which a unit pixel configuration, an analog circuit, and the like are formed is formed. In addition, in the logic chip 102, a digital processing unit 112 in which a digital circuit and the like are formed is formed.

The pixel chip 101 and the logic chip 102 overlap each other in a state of being insulated from each other. In other words, the configuration of the pixel/analog processing unit 111 and the configuration of the logic chip 102 are basically insulated from each other. Note that, while not illustrated in the drawing, the configuration formed in the pixel/analog processing unit 111 and the configuration formed in the digital processing unit 112 are electrically connected to each other, for example, through a via or the like as is necessary (necessary parts).

Note that, in the case illustrated in FIG. 2, while an image sensor formed by chips of two layers has been described as an example, the number of layers of the image sensor 100 is arbitrary. For example, the number of layers may be one as a single layer or three or more. In description presented below, similar to the example illustrated in FIG. 2, a case where the image sensor is configured by chips of two layers will be described.

<Pixel/Analog Processing Unit>

Figure 3:
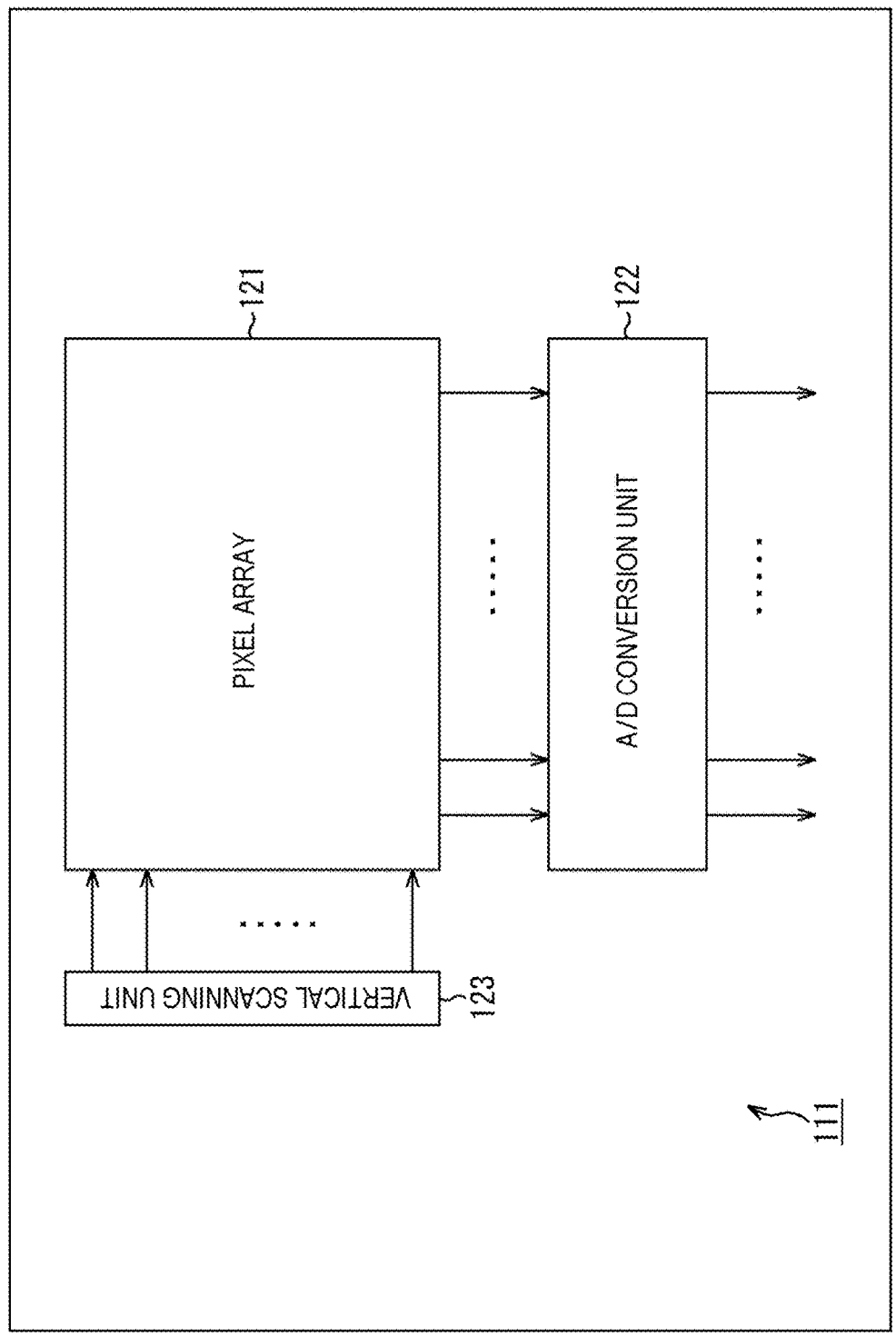
FIG. 3 is a diagram that illustrates an example of a main configuration of a pixel/analog processing unit.

FIG. 3 is a diagram that illustrates an example of a main configuration of a circuit formed in the pixel/analog processing unit 111.

As illustrated in FIG. 3, a pixel array 121, an A/D converter 122, a vertical scanning unit 123, and the like are formed in the pixel/analog processing unit 111.

The pixel array 121 is a pixel region in which pixel configurations (unit pixels 131) each including a photoelectric conversion device such as a photo diode are arranged in a planar shape or a curved shape.

The A/D converter 122 performs an A/D conversion of an analog signal read from each unit pixel of the pixel array 121 or the like and outputs digital data thereof.

The vertical scanning unit 123 controls the operation of transistors of each unit pixel of the pixel array 121. In other words, electric charge accumulated in each unit pixel of the pixel array 121 is read under the control of the vertical scanning unit 123, is supplied to the A/D converter 122 through a vertical signal line (VSL) for each column of the unit pixels as a pixel signal, and is converted from analog to digital.

The A/D converter 122 supplies a result (digital data (image data) of each pixel signal) of the A/D conversion to a logic circuit (digital circuit) formed in the digital processing unit 112 for each column of the unit pixels.

<Pixel Array>

Figure 4:
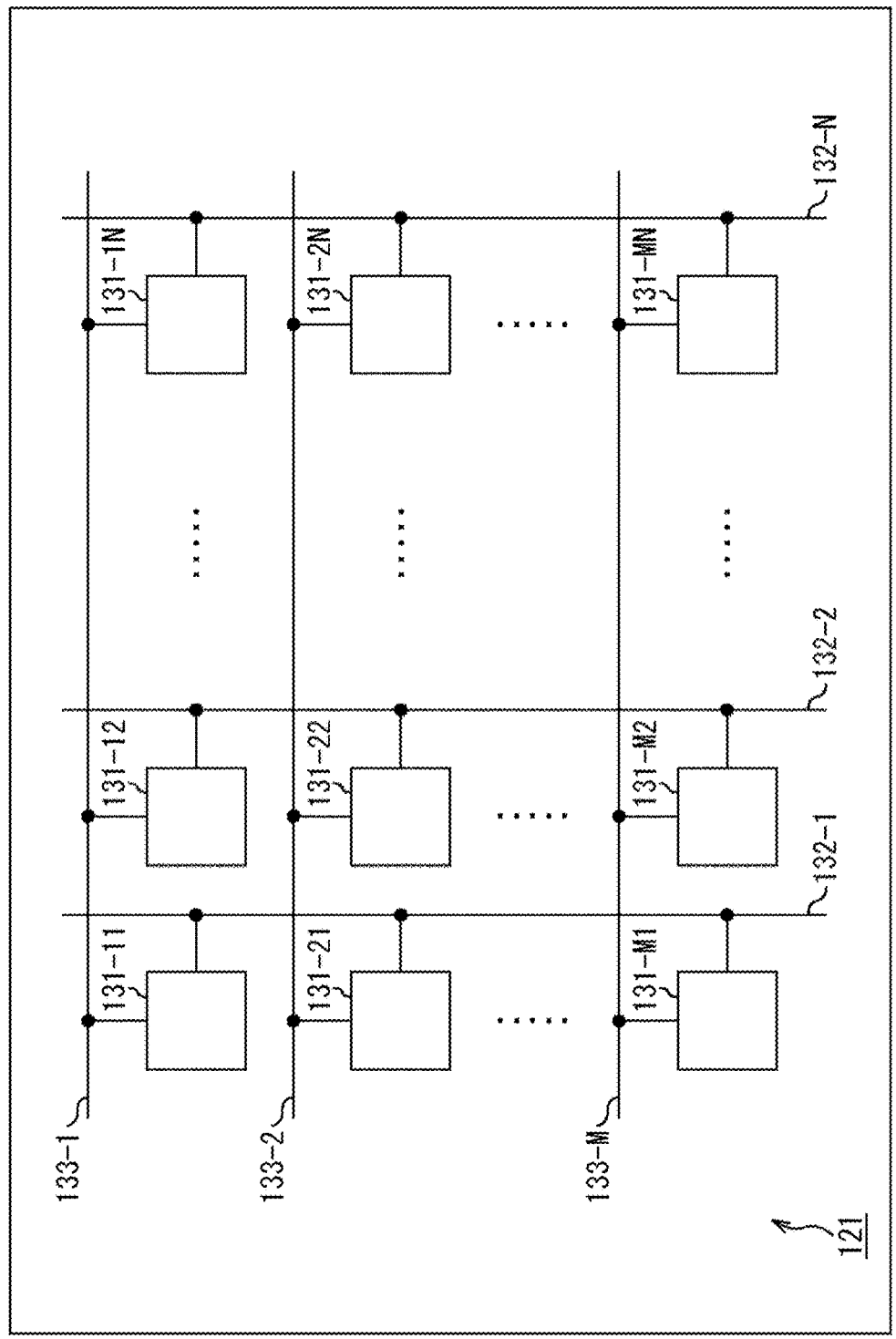
FIG. 4 is a diagram that illustrates an example of a main configuration of a pixel array.

As illustrated in FIG. 4, in the pixel array 121, unit pixel 131-11 to unit pixel 131-MN are formed (here, M and N are arbitrary natural numbers). In a case where the unit pixel 131-11 to the unit pixel 131-MN do not need to be discriminated from each other in description, each thereof will be referred to as a unit pixel 131. In other words, as illustrated in FIG. 4, in the pixel array 121, unit pixels 131 of M rows×N columns are arranged in a matrix pattern (array pattern).

In addition, as illustrated in FIG. 4, in the pixel array 121, vertical signal line 132-1 to vertical signal line 132-N and control signal line 133-1 to control signal line 133-M are formed. In a case where the vertical signal line 132-1 to the vertical signal line 132-N do not need to be discriminated from each other, each thereof will be referred to as a vertical signal line 132. In addition, in a case where control line 133-1 to control line 133-M do not need to be discriminated from each other, each thereof will be referred to as a control line 133.

For each column, a vertical signal line 132 corresponding to the column is connected to the unit pixel 131, and, for each row, the unit pixel 131 is connected to a control line 133 corresponding to the row. A control signal is transmitted from the vertical scanning unit 123 to each unit pixel (each row) 131 through each control line 133.

A signal read from the unit pixel 131 in accordance with a control signal supplied from the vertical scanning unit 123 through the control line 133 is transmitted to the A/D converter 122 through the vertical signal line 132. Note that, in FIG. 4, while the control line 133 of each row is represented as one line, actually, the control line is configured by a plurality of control lines for various transistors within the unit pixel 131.

In addition, in the case illustrated in FIG. 4, while the signal line transmitting a pixel signal is described to be disposed for each column, and the control line is described to be disposed for each row, the arrangement of the unit pixels, the signal lines, and the control lines are not limited to that of the example illustrated in FIG. 4. In other words, for example, the arrangement of the unit pixels 131 is arbitrary but is not limited to an array pattern. For example, the unit pixels 131 may be arranged to form a honeycomb structure. In addition, for example, the signal line may be disposed for each row, and a signal read from each unit pixel may be transmitted for each row. Alternatively, the signal line may be disposed for each area of the pixel array 121, and a signal read from each unit pixel may be transmitted for each area. In addition, for example, the control line may be disposed in an array pattern, and a target to be controlled may be selected for each unit pixel.

<Configuration of Unit Pixel>

Figure 5:
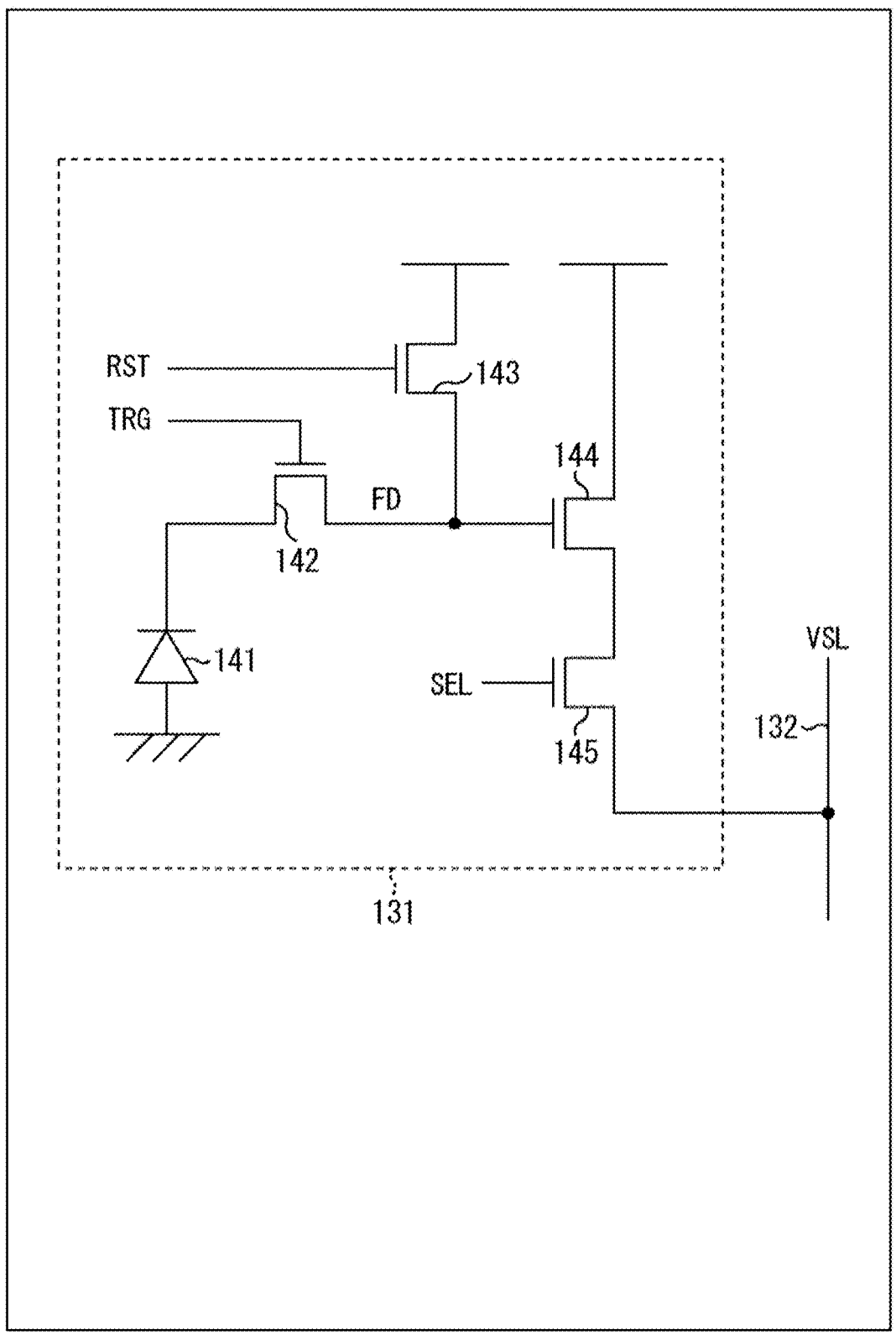
FIG. 5 is a diagram that illustrates an example of a main configuration of a unit pixel.

FIG. 5 is a diagram that illustrates an example of a main configuration of the circuit configuration of the unit pixel 131. In the case of the example illustrated in FIG. 5, the unit pixel 131 includes a photodiode (PD) 141, a transfer transistor 142, a reset transistor 143, an amplification transistor 144, and a select transistor 145.

The photodiode (PD) 141 performs a photoelectric conversion of received light into photo electric charge (here, photo electrons) of a charge amount according to the light amount thereof and accumulates the photo electric charge. The photodiode (PD) 141 has an anode electrode connected to the ground (pixel ground) of the pixel area and a cathode electrode connected to a floating diffusion (FD) through the transfer transistor 142. It is apparent that a system may be employed in which the cathode electrode of the photodiode (PD) 141 is connected to a power source (pixel power source) of the pixel area, the anode electrode is connected to the floating diffusion (FD) through the transfer transistor 142, and photo electric charge is read as photo holes.

The transfer transistor 142 controls reading of photo electric charge from the photodiode (PD) 141. The transfer transistor 142 has a drain electrode connected to the floating diffusion and a source electrode connected to the cathode electrode of the photodiode (PD) 141. In addition, a transmission control line (TRG) transmitting a transmission control signal supplied from the vertical scanning unit 123 (FIG. 3) is connected to a gate electrode of the transfer transistor 142. When the transmission control line (TRG) (in other words, the electric potential of the gate of the transfer transistor 142) is in an Off state, the transmission of photo electric charge from the photodiode (PD) 141 is not performed (photoelectric charge is accumulated in the photodiode (PD) 141). On the other hand, when the transmission control line (TRG) (in other words, the electric potential of the gate of the transfer transistor 142) is in an On state, photo electric charge accumulated in the photodiode (PD) 141 is transmitted to the floating diffusion (FD).

The reset transistor 143 resets the electric potential of the floating diffusion (FD). The reset transistor 143 has a drain electrode connected to power source electric potential and a source electrode connected to the floating diffusion (FD). In addition, a reset control line (RST) transmitting a reset control signal supplied from the vertical scanning unit 123 (FIG. 3) is connected to a gate electrode of the reset transistor 143. When the reset control signal (RST) (in other words, the electric potential of the gate of the reset transistor 143) is in the Off state, the floating diffusion (FD) is disconnected from the power source electric potential. On the other hand, when the reset control signal (RST) (in other words, the electric potential of the gate of the reset transistor 143) is in the On state, the electric charge of the floating diffusion (FD) is discarded to the power source electric potential, and the floating diffusion (FD) is reset.

The amplification transistor 144 amplifies a change in the electric potential of the floating diffusion (FD) and outputs the amplified change as an electric signal (analog signal). The amplification transistor 144 has a gate electrode connected to the floating diffusion (FD), a drain electrode connected to a source follower power source voltage, and a source electrode connected to the drain electrode of the select transistor 145. For example, the amplification transistor 144 outputs the electric potential of the floating diffusion (FD) reset by the reset transistor 143 to the select transistor 145 as a reset signal (reset level). In addition, the amplification transistor 144 outputs the electric potential of the floating diffusion (FD) to which photo electric charge has been transmitted by the transfer transistor 142 to the select transistor 145 as a photo accumulation signal (signal level).

The select transistor 145 controls the output of an electric signal supplied from the amplification transistor 144 to the vertical signal line (VSL) 132 (in other words, the A/D converter 122). The select transistor 145 has a drain electrode connected to the source electrode of the amplification transistor 144 and a source electrode connected to the vertical signal line 132. In addition, a select control line (SEL) transmitting a select control signal supplied from the vertical scanning unit 123 (FIG. 3) is connected to a gate electrode of the select transistor 145. When the select control signal (SEL) (in other words, the electric potential of the select transistor 145) is in the Off state, the amplification transistor 144 and the vertical signal line 132 are electrically disconnected from each other. Accordingly, at the time of this state, a reset signal, a pixel signal, or the like is not output from the unit pixel 131. On the other hand, when the select control signal (SEL) (in other words, the electric potential of the gate of the select transistor 145) is in the On state, the unit pixel 131 is in a selected state. In other words, the amplification transistor 144 and the vertical signal line 132 are electrically connected to each other, and a signal output from the amplification transistor 144 is supplied to the vertical signal line 132 as a pixel signal of the unit pixel 131. In other words, a reset signal, a pixel signal, or the like is read from the unit pixel 131.

Here, the configuration of the unit pixel 131 is arbitrary but is not limited to that of the example illustrated in FIG. 5.

<Conductor Loop>

In the pixel/analog processing unit 111 having the configuration described above, when a unit pixel is selected as a target for signal reading or the like, various conductor loops (conductors having loop shapes (circular shapes)) are formed by control lines (the control line 133) controlling various transistors described above, the vertical signal line 132, an analog power source wiring, a digital power source wiring, and the like. As a magnetic flux generated from a wiring disposed near or the like passes through the inside of the loop plane of each conductor loop, an induced electromotive force is generated.

For example, when a high frequency signal flows through the wiring disposed near, a magnetic field intensity on the periphery of the wiring changes. An induced electromotive force generated in the conductor loop changes according thereto, and there is concern that a noise is caused (in other words, a noise is generated in the conductor loop). Particularly, a change in the magnetic field intensity increases in a place in which wirings through which currents flow in a same direction are densely disposed, and a change (in other words, a noise) in the induced electromotive force generated in the conductor loop increases.

<Conductor Group Suppressing Influence on Conductor Loop>

Thus, by arranging wirings (conductors) through which currents flow in approximately opposite directions to be near, changes in the magnetic field intensity according to changes in the currents are cancelled out, and the influence (the magnitude of the induced electromotive force generated in a conductor loop) on a conductor loop is suppressed.

Figure 6:
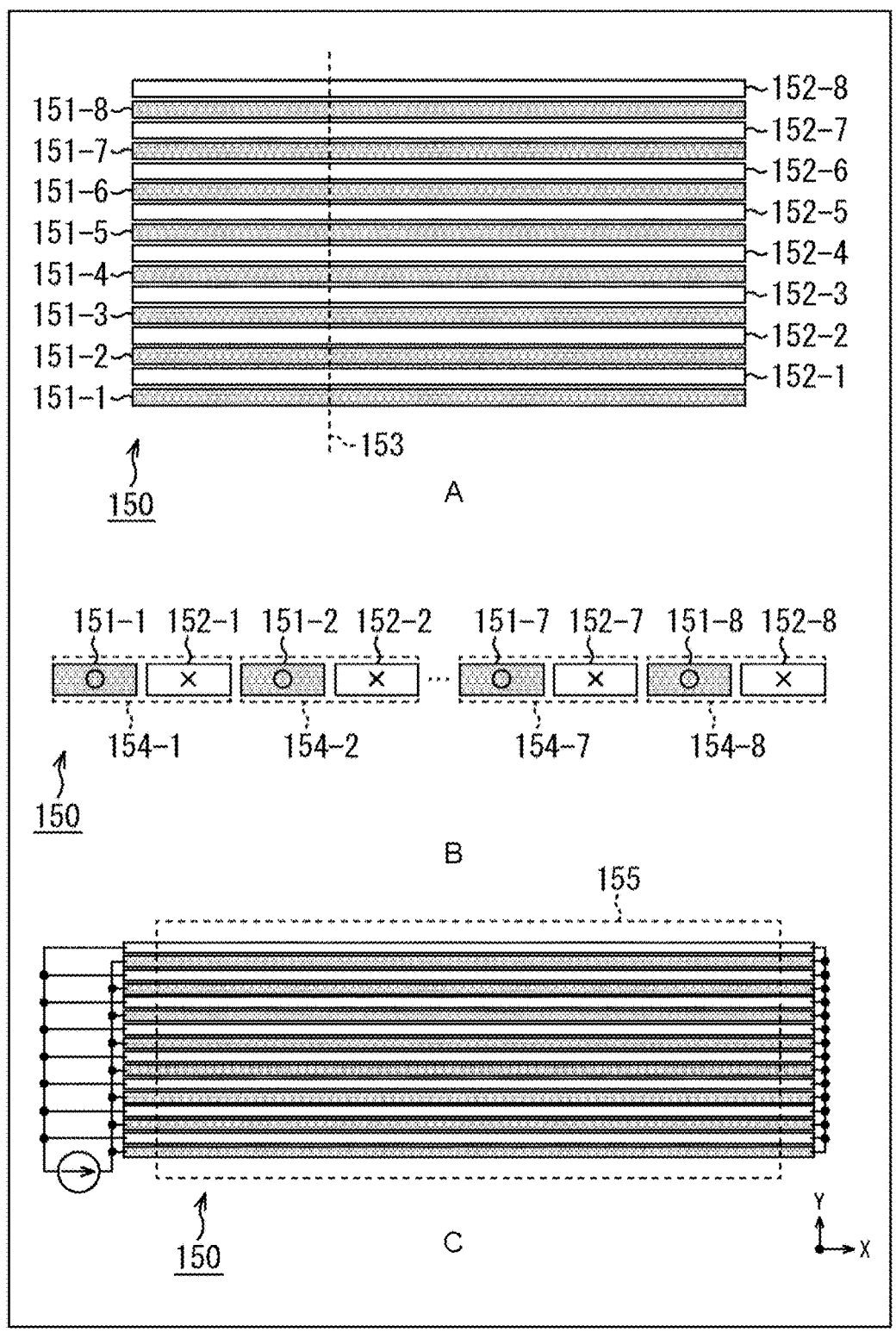
FIG. 6 is a diagram that illustrates an example of wirings of a digital processing unit.

FIG. 6 illustrates an example of a conductor group configured as such. A differential wiring group 150 illustrated in A of FIG. 6 is a conductor group formed by a plurality of conductors through which current flow and is configured by normal phase wiring 151-1 to normal phase wiring 151-8 and reverse phase wiring 152-1 to reverse phase wiring 152-8 that are conductors. Hereinafter, in a case where the normal phase wiring 151-1 to the normal phase wiring 151-8 do not need to be discriminated from each other in description, each thereof will be referred to as a normal phase wiring 151. In addition, in a case where the reverse phase wiring 152-1 to the reverse phase wiring 152-8 do not need to be discriminated from each other in description, each thereof will be referred to as a reverse phase wiring 152.

The normal phase wiring 151 and the reverse phase wiring 152 are wirings (also referred to as differential wirings) transmitting differential signals formed from signals of opposite phases. In other words, currents flow in opposite directions in the normal phase wiring 151 and the reverse phase wiring 152. For example, at certain timing, a current flows from the left side to the right side in the drawing (in a first direction) in the normal phase wiring 151, and a current flows from the right side to the left side (in a second direction) in the drawing in the reverse phase wiring 152. The magnitudes of the currents are the same.

Through the normal phase wiring 151 and the reverse phase wiring 152, any signals may flow, as long as the signals are differential signals having currents changing in the time direction. In other words, signals (a micro current change in a micro time dt is dI) having a current I changing according to a time t may flow through the normal phase wiring 151 and the reverse phase wiring 152.

For example, the magnitude of a current flowing through the normal phase wiring 151 and the magnitude of a current flowing through the reverse phase wiring 152 may not the same. To the contrary, the magnitude of a current flowing through the normal phase wiring 151 and the magnitude of a current flowing through the reverse phase wiring 152 may be the same (currents changing according to time flow through the normal phase wiring 151 and the reverse phase wiring 152 at approximately same timing). Generally, in the latter case, the magnitude of an induced electromotive force generated in a conductor loop can be suppressed more than in the former case.

In addition, frequency signals having a predetermined frequency, for example, that is the same as that of a clock signal may be configured to flow through each conductor of the conductor group, in other words, each normal phase wiring 151 and each reverse phase wiring 152. Furthermore, for example, an AC power source current may be configured to flow through each normal phase wiring 151 and each reverse phase wiring 152. In addition, for example, a same frequency signal may be configured to flow through each normal phase wiring 151 and each reverse phase wiring 152. Furthermore, signals each including a plurality of frequency components may be configured to flow through each normal phase wiring 151 and each reverse phase wiring 152.

Furthermore, as illustrated in A of FIG. 6, the normal phase wiring 151 and the reverse phase wiring 152 may be alternately aligned in the direction (third direction) of a dotted line 153 to be approximately in parallel with each other. A combination of the normal phase wiring 151 and the reverse phase wiring 152 will be also referred to as a differential wiring set. For example, in the case of A of FIG. 6, a wiring pair configured by the normal phase wiring 151 and the reverse phase wiring 152 adjacent to each other can be regarded to form a differential wiring set. Then, in the case, a differential wiring group 150 is configured by a plurality of such differential wiring sets.

In other words, this conductor group may be configured to have a periodical structure in which a plurality of conductor sets each configured by a conductor through which a current flows in a first direction and a conductor through which a current flows in a second direction, which are aligned in predetermined order in a third direction, are aligned in the third direction.

An example of a section, which is cut in the direction of the dotted line 153, of the differential wiring group 150 is illustrated in B of FIG. 6. In B of FIG. 6, "O" and "X" attached to wirings represent the types of direction in which a current flows. In other words, currents flow in the same direction through wirings of "O" or wirings of "X". In addition, currents flow in opposite directions through wirings of "O" and wirings of "X".

Furthermore, as illustrated in B of FIG. 6, a differential wiring set 154-1 is formed by a normal phase wiring 151-1 and a reverse phase wiring 152-1. Similarly, a differential wiring set 154-2 is formed by a normal phase wiring 151-2 and a reverse phase wiring 152-2, a differential wiring set 154-3 is formed by a normal phase wiring 151-3 and a reverse phase wiring 152-3, a differential wiring set 154-4 is formed by a normal phase wiring 151-4 and a reverse phase wiring 152-4, a differential wiring set 154-5 is formed by a normal phase wiring 151-5 and a reverse phase wiring 152-5, a differential wiring set 154-6 is formed by a normal phase wiring 151-6 and a reverse phase wiring 152-6, a differential wiring set 154-7 is formed by a normal phase wiring 151-7 and a reverse phase wiring 152-7, and a differential wiring set 154-8 is formed by a normal phase wiring 151-8 and a reverse phase wiring 152-8. In a case where the differential wiring set 154-1 to the differential wiring set 154-8 do not need to be discriminated from each other, each thereof will be referred to as a differential wiring set 154.

Such a differential wiring group 150, for example, as illustrated in C of FIG. 6, can be realized by connecting wirings and a current source.

As above, the differential wiring group 150 is a conductor group in which a conductor (normal phase wiring 151) through which a current flows in a first direction and a conductor (revere phase wiring 152) through which a current flows in a second direction that is approximately the opposite direction of the first direction are aligned in a third direction. In addition, this differential wiring group 150 is disposed in the conductor loop at a position at which an induced electromotive force is generated according to a magnetic field generated by the currents flowing therethrough.

Note that, while the differential wiring group 150 (conductor group) has been described to be configured by a plurality of conductors (wirings), this represents the configuration within a predetermined area. For example, in the case of C of FIG. 6, outside a dotted-line range 155, while normal phase wirings 151 are connected to each other, and reverse phase wirings 152 are connected to each other, the illustrated configuration of the differential wiring group 150 is the configuration of only within the dotted-line range 155, and connections outside the dotted-line range 155 are not considered. In other words, the differential wiring group 150, as illustrated in A of FIG. 6, is configured by 16 wirings including normal phase wiring 151-1 to normal phase wiring 151-8 and reverse phase wiring 152-1 to reverse phase wiring 152-8.

For example, the normal phase wiring 151-1 to the normal phase wiring 151-8 and the reverse phase wiring 152-1 to the reverse phase wiring 152-8 may be connected in series outside the dotted-line range 155 to form one meandering wiring. However, also in such a case, the illustrated configuration of the differential wiring group 150 is the configuration of the inside of the dotted-line range 155, and the differential wiring group 150, as illustrated in A of FIG. 6, is configured by 16 wirings including the normal phase wiring 151-1 to the normal phase wiring 151-8 and the reverse phase wiring 152-1 to the reverse phase wiring 152-8. In other words, the differential wiring group 150 having the configuration as illustrated in A of FIG. 6 can be realized by one meandering wiring.

<Distribution of Magnetic Field Intensity>

An example of the distribution of the magnetic field intensity of the differential wiring group 150 is illustrated in FIG. 7. A of FIG. 7 illustrates an example of the distribution of the magnetic field intensity in a case of being seen from the same direction as that of A of FIG. 6, and a curve 161 of a graph illustrated in B of FIG. 7 illustrates an example of the distribution of the magnetic field intensity in a case of being seen from the same direction as that of B of FIG. 6. As illustrated in B of FIG. 7, since the directions of currents are opposite to each other, the direction of a magnetic field generated according to a current flowing through the normal phase wiring 151 and the direction of a magnetic field generated according to a current flowing through the reverse phase wiring 152 are opposite to each other. Accordingly, such magnetic fields are offset, and the intensity is suppressed to be low. In other words, the magnetic field intensity of the whole differential wiring group 150 is suppressed to below. Accordingly, for the whole differential wiring group 150, an induced electromotive force generated in a conductor loop according to the magnetic field is suppressed to be low. In other words, the occurrence of a noise generated in the conductor loop is suppressed as well.

<Distribution of Induced Electromotive Force>

Figure 8:
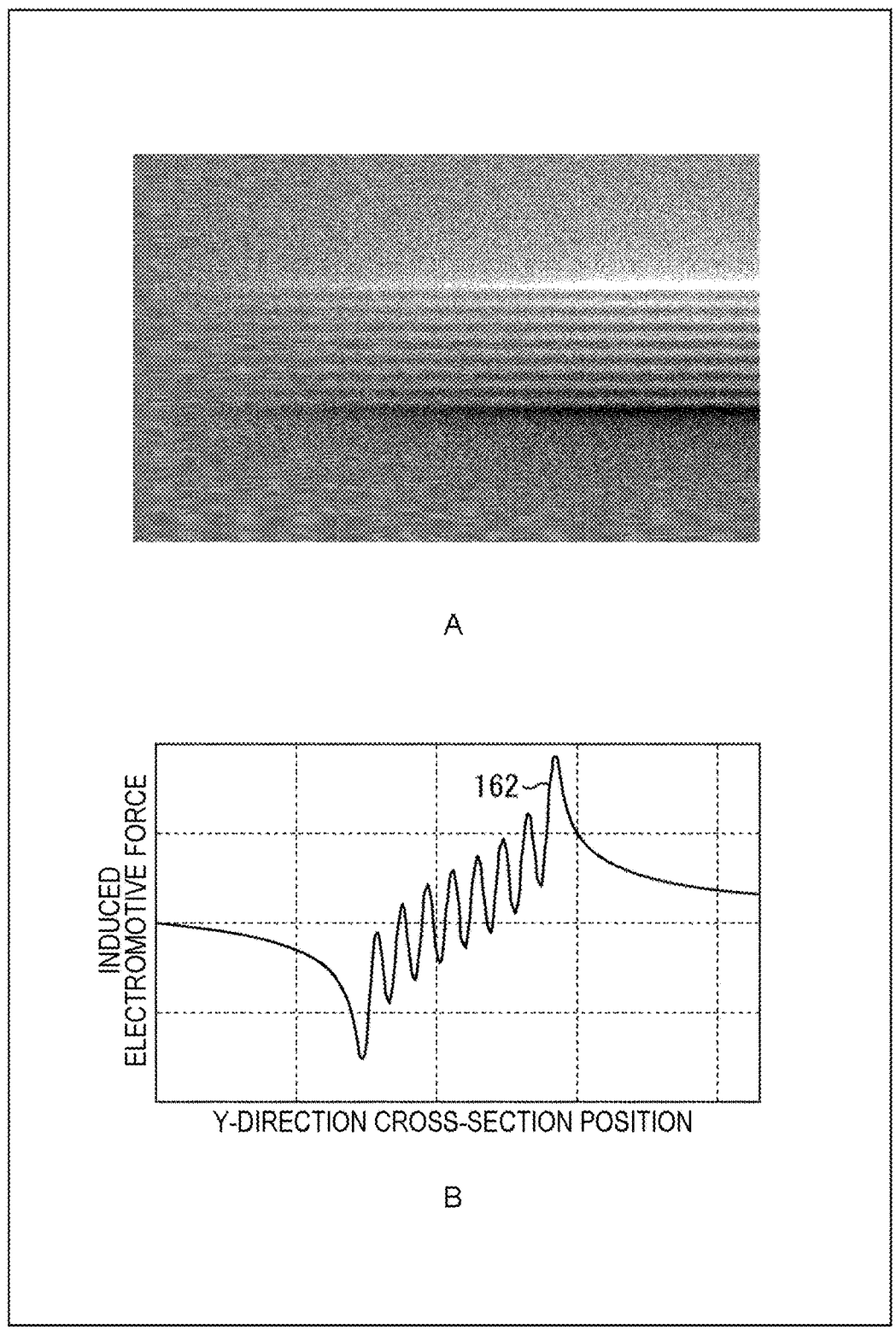
FIG. 8 is a diagram that illustrates an example of the distribution of an induced electromotive force.

An example of the distribution of the induced electromotive force generated in the conductor loop according to the differential wiring group 150 is illustrated in FIG. 8. Note that an induced electromotive force $V_{emf}$ generated in the conductor loop is calculated as in the following Equation (1) and Equation (2). Here, $\Phi$ represents a magnetic flux, H represents a magnetic field intensity, μ represents permeability, and S represents an area of a conductor loop orthogonal to the magnetic flux Φ.

[Mathematical Formula 1]

$$\Phi = \int_S \mu H \cdot dS \quad (1)$$

[Mathematical Formula 2]

$$V_{emf} = -\frac{d\Phi}{dt} \quad (2)$$

The distribution of the induced electromotive force in a case of being seen from the same direction as that of A of FIG. 6, for example, is as illustrated in A of FIG. 8, and the distribution of the induced electromotive force in a case of being seen from the same direction as that of B of FIG. 6, for example, is a curve 162 of a graph illustrated in B of FIG. 8. As illustrated in the curve 162 of B of FIG. 8, a large induced electromotive force is generated on the periphery of a wiring of a side end portion (an end portion in the third direction) of the differential wiring group 150.

<Magnetic Field Intensity of Side End Portion>

Figure 9:
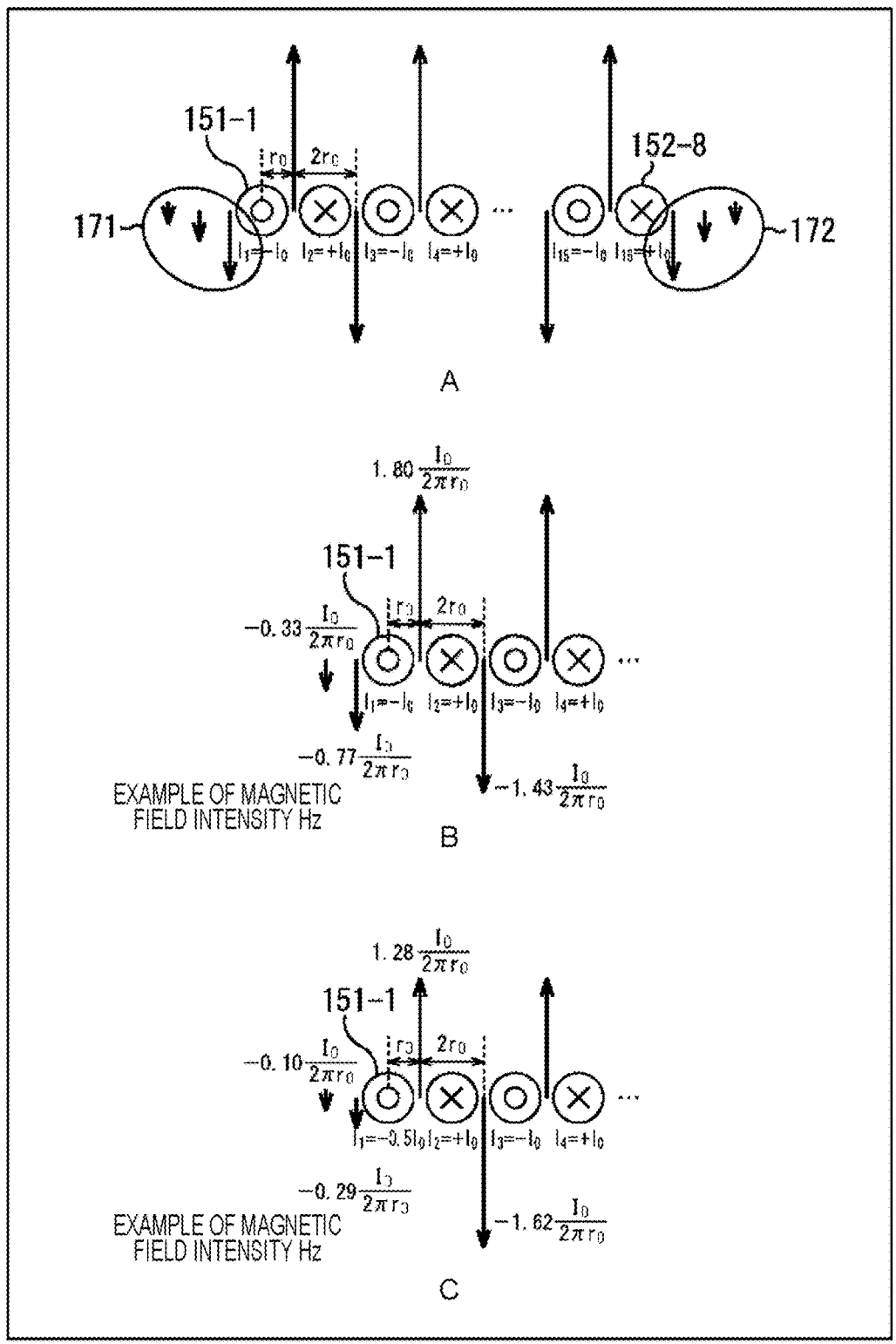
FIG. 9 is a diagram that illustrates an example of a magnetic field intensity of a side end portion.

FIG. 9 illustrates an example of the distribution of the magnetic field intensity of the differential wiring group 150 in a case of being seen from the same direction as that of B of FIG. 6. An arrow in the vertical direction in the drawing represents a magnetic field intensity. As illustrated in A of FIG. 9, in an area disposed on a further inner side than an end of the differential wiring group 150 in the third direction, magnetic fields of opposite directions having intensities of a same level are alternately generated. Since such magnetic fields are offset, the magnetic field intensity of the whole area is suppressed to be low.

In contrast to this, in a further outer area (a portion represented inside a circle 171 or a circle 172) than the end of the differential wiring group 150 in the third direction, magnetic fields of the same direction are generated in a wiring area from the end of the differential wiring group 150 to infinity. Since magnetic field intensities of the same direction in the wide range are accumulated in correspondence with the area, similar to the example illustrated in FIG. 8, there is concern that an induced electromotive force of the periphery of the side end portion of the differential wiring group 150 becomes large. In other words, there is concern that a noise generated in the conductor loop increases.

<Calculation of Magnetic Field Intensity>

A magnetic field intensity $H_z$ (phase 0°) of the vertical direction in the drawing is calculated as in the following Equation (3).

[Mathematical Formula 3]

$$H_Z = \sum_{k=1}^{2n} \frac{I_k}{2\pi r_k} \quad (3)$$

A Z-direction magnetic field intensity $H_z$ under the condition of a phase of 0° can be calculated on the basis of the Ampere's law. Equation (3) is an example of a calculation equation of a case where the differential wiring group 150 is configured by n sets of differential wirings each set configured by two differential wirings of which the directions of currents are approximately opposite directions. Here, k represents a wiring number that is sequentially assigned from an end portion wiring of one side, $I_k$ represents the amount of a current flowing through a k-th wiring, and $r_k$ represents a distance from the k-th wiring to a place at which the Z-direction magnetic field intensity $H_z$ is calculated.

An example of calculation of a magnetic field intensity $H_z$ (a phase of 0°) of the vertical direction in FIG. 9 on the periphery of a side end portion wiring (normal phase wiring 151-1) of the differential wiring group 150 using such Equation (3) is illustrated in B of FIG. 9. In the example of B of FIG. 9, wirings of the differential wiring group 150 are arranged to be disposed at a wiring gap of $2r_0$. The wiring period of the differential wirings is $4r_0$, and the absolute value of the amount of a current of each wiring is $I_0$.

In such a case, as described above, in an area disposed on a further outer side than the side end portion wiring (normal phase wiring 151-1) of the differential wiring group 150, a magnetic field intensity of the same direction is added, for example, as in the following Equation (4).

$$H_z = -0.77(I_0/2\pi r_0) - 0.33(I_0/2\pi r_0) - \ldots \quad (4)$$

<Decrease in Magnetic Field Intensity of Side End Portion>

Thus, a wiring of at least one end portion of the differential wiring group 150 in the third direction is configured to have a structure suppressing an induced electromotive force generated in a conductor loop by using magnetic fields generated on the periphery of the differential wiring group 150 in the third direction.

In other words, in a circuit board, at a position at which an induced electromotive force is generated in a conductor loop in accordance with a magnetic field generated according to a current, in a conductor group (for example, the differential wiring group 150) in which a conductor (for example, the normal phase wiring 151) through which a current flows in a first direction (for example, in A of FIG. 6, from the left side to the right side in the drawing) and a conductor (for example, the reverse phase wiring 152) through which a current flows in a second direction (for example, in A of FIG. 6, from the right side to the left side in the drawing) that is approximately an opposite direction of the first direction are aligned in a third direction (for example, in A of FIG. 6, the extending direction of a dotted line 153 in the drawing), a conductor group having a structure in which a conductor (for example, the normal phase wiring 151-1) of at least one end of the conductor group in the third direction suppresses an induced electromotive force generated in a conductor loop in accordance with a magnetic field generated on the periphery of the conductor group in the third direction is included.

In this way, the generation of a noise in a conductor loop according to a magnetic field on the periphery of the side end portion of the conductor group can be suppressed.

<Control of Amount of Current in Side End Portion>

As a structure suppressing an induced electromotive force generated in a conductor loop in accordance with a magnetic field generated on the periphery of a conductor group in a third direction that is included in a conductor of at least one end of the conductor group in the third direction, for example, a current flowing through the conductor of the end portion may be configured to be smaller than currents flowing through the other conductors.

For example, the current flowing through the conductor of the end portion may be configured to be about ½ of the currents flowing through the other conductors.

In the example illustrated in C of FIG. 9, the absolute value of the amount of the current flowing through the normal phase wiring 151-1 that is a side end portion wiring is configured to be a half of the absolute value of the amount of each of the currents flowing through wirings other than the side end portion wiring (normal phase wiring 151-1). For this reason, in an area disposed on a further outer side than the normal phase wiring 151-1 of the differential wiring group 150, the addition of magnetic field intensities of the same direction, for example, is as represented in the following Equation (5).

$$H_z = -0.29(I_0/2\pi r_0) - 0.10(I_0/2\pi r_0) - \ldots \quad (5)$$

In other words, a magnetic field intensity of a further outer side than the normal phase wiring 151-1 of the differential wiring group 150 is suppressed to be lower than that of the case of the example of B of FIG. 9. The reason for this is that, by configuring the absolute value ($0.5I_0$) of the amount of the current flowing through the normal phase wiring 151-1 to be a half of the absolute value ($I_0$) of the amount of each of currents flowing through wirings other than the normal phase wiring 151-1, a magnetic field intensity generated from the normal phase wiring 151-1 becomes a half, and, in an area disposed on a further outer side than the normal phase wiring 151-1, the magnetic field is offset by magnetic fields generated from the other wirings.

<Comparison of Induced Electromotive Force According to Amount of Current>

Next, relations between the amounts of currents flowing through side end portion wirings and an induced electromotive force will be compared with each other. For example, the amounts of currents flowing through the side end portion wirings (the normal phase wiring 151-1 and the reverse phase wiring 152-8) are set as A of FIG. 10 to E of FIG. 10.

Figure 10:
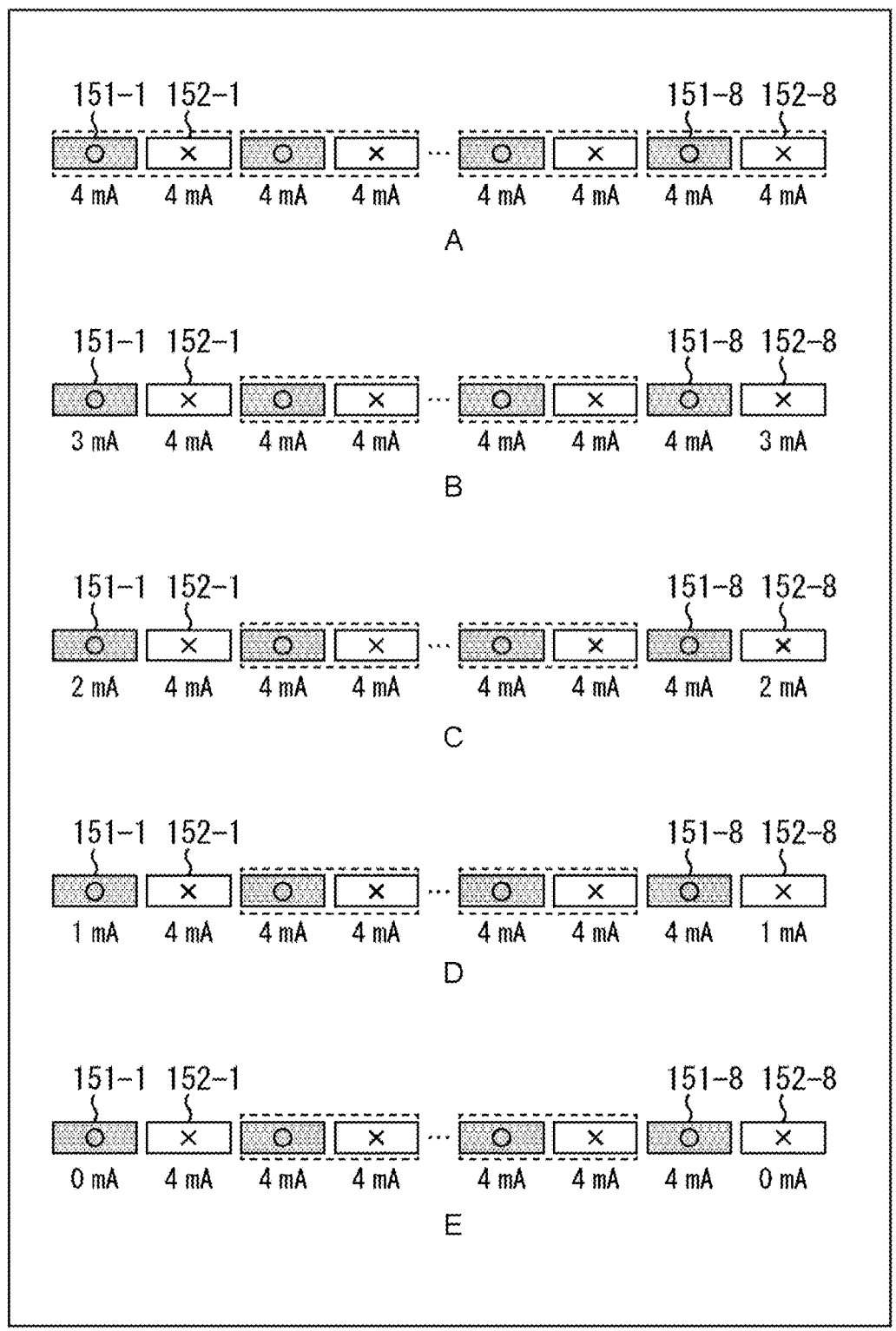
FIG. 10 is a diagram that illustrates an example of the control of a current amount of a side end portion.

In the example illustrated in A of FIG. 10, the amounts of currents flowing through the side end portion wirings (the normal phase wiring 151-1 and the reverse phase wiring 152-8) are set to be the same (4 mA) as the amounts of currents flowing through the other wirings (the reverse phase wiring 152-1 to the normal phase wiring 151-8). In the example illustrated in B of FIG. 10, the amounts of the currents flowing through the side end portion wirings are set to 3 mA that is lower than the amounts (4 mA) of the currents flowing through the other wirings. In the example illustrated in C of FIG. 10, the amounts of the currents flowing through the side end portion wirings are set to 2 mA that is ½ of the amounts (4 mA) of the currents flowing through the other wirings. In the example illustrated in D of FIG. 10, the amounts of the currents flowing through the side end portion wirings are set to 1 mA that is ¼ of the amounts (4 mA) of the currents flowing through the other wirings. In the example illustrated in E of FIG. 10, the amounts of the currents flowing through the side end portion wirings are set to 0 mA.

Figure 11:
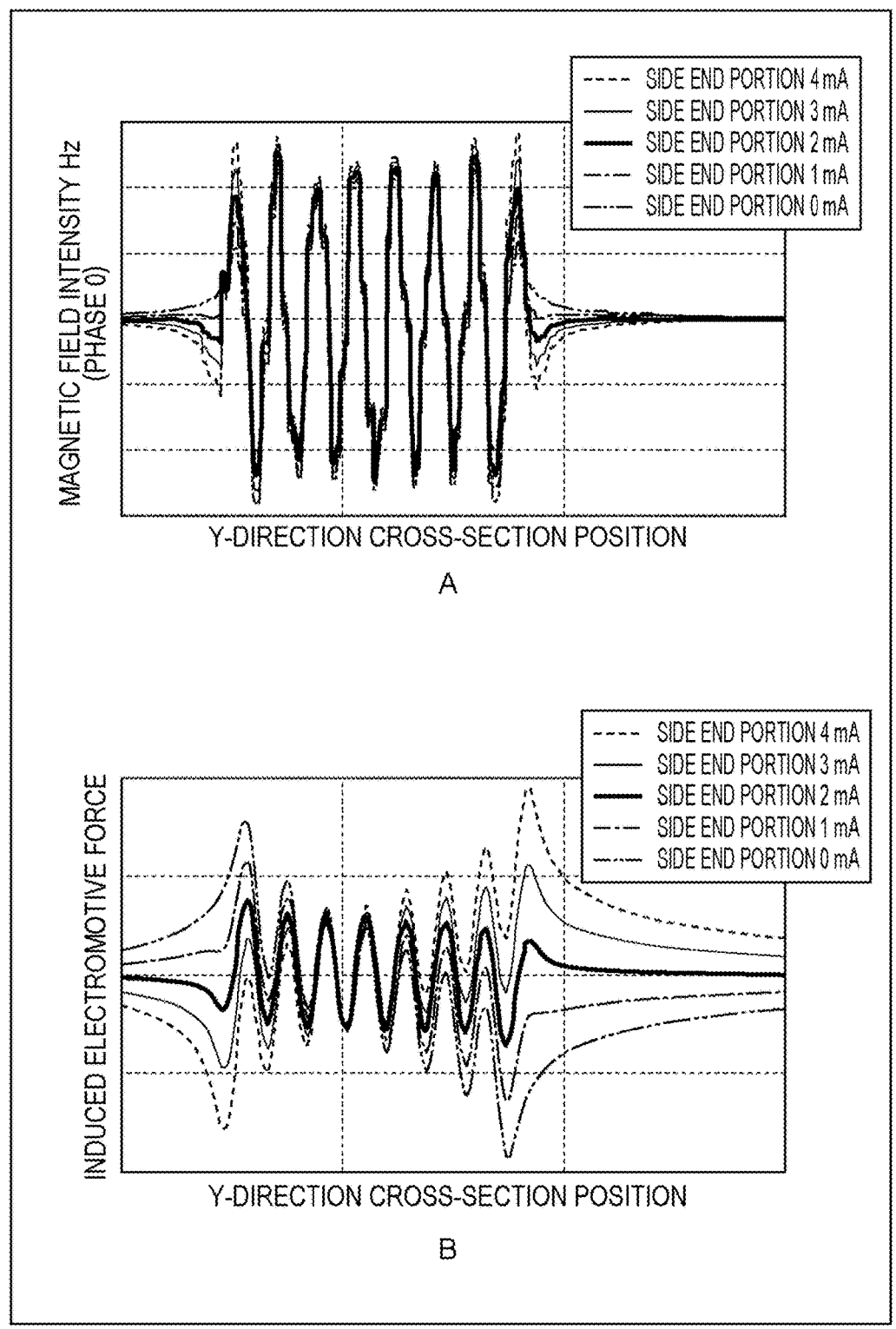
FIG. 11 is a diagram that illustrates an example of the distribution of a magnetic field intensity and the distribution of an induced electromotive force.

An example of distributions of magnetic field intensities in a case where the amounts of the currents flowing through the side end portion wirings are as such in a case of being seen from the same direction as that of B of FIG. 6 is illustrated in A of FIG. 11. In addition, an example of distributions of induced electromotive forces in such a case in a case of being seen from the same direction as that of B of FIG. 6 is illustrated in B of FIG. 11.

As illustrated in A of FIG. 11, in a case where the amounts of the currents flowing through the side end portion wirings are set to be lower than the amounts of the current flowing through the other wirings, the magnetic field intensities of the side end portions are suppressed to be low. Accordingly, as illustrated in B of FIG. 11, the induced electromotive forces of the side end portions are suppressed as well. In other words, by configuring the amounts of the currents flowing through the side end portion wirings to be lower than the amounts of the currents flowing through the other wirings, the induced electromotive forces of the side end portions can be suppressed to be low. In other words, the generation of a noise in the conductor loop can be suppressed.

In addition, as illustrated in A of FIG. 11, among the amounts of the currents, in a case where the amounts of the currents of the side end portion wirings are about ½ of the amounts of the currents of the other wirings, the magnetic field intensities of the side end portions are suppressed to be the lowest. Accordingly, as illustrated in B of FIG. 11, among such amounts of the currents, in a case where the amounts of the currents of the side end portion wirings are about ½ of the amounts of the currents of the other wirings, the induced electromotive forces of the side end portions are suppressed to be the lowest. In other words, by configuring the amounts of the currents of the side end portion wirings to be about ½ of the amounts of the currents of the other wirings, the induced electromotive forces of the side end portions can be further suppressed. In other words, the generation of a noise in the conductor loop can be further suppressed.

<Control of Conductor Cross-Sectional Area of Side End Portion>

As a structure suppressing an induced electromotive force generated in a conductor loop in accordance with a magnetic field generated on the periphery of a conductor group in the third direction, which is included in a conductor of at least one end portion of the conductor group in the third direction, for example, the cross-sectional area of the conductor of the end portion (a cross-sectional area of a face vertical to the first direction) may be configured to be smaller than the cross-sectional area (a cross-sectional area of a face vertical to the first direction) of each of the other conductors.

For example, the cross-sectional area of the face of the conductor of the end portion that is vertical to the first direction may be configured to be about ½ of the cross-sectional area of the face of each of the other conductors that is vertical to the first direction.

For example, the width (for example, the length of a face, which is vertical to the first direction, in the third direction) of the conductor of the end portion may be configured to be smaller than the width of each of the other conductors. In addition, for example, the thickness (for example, the length of a face, which is vertical to the first direction, in a fourth direction vertical to the third direction) of the conductor of the end portion may be configured to be smaller than the thickness of each of the other conductors.

Figure 12:
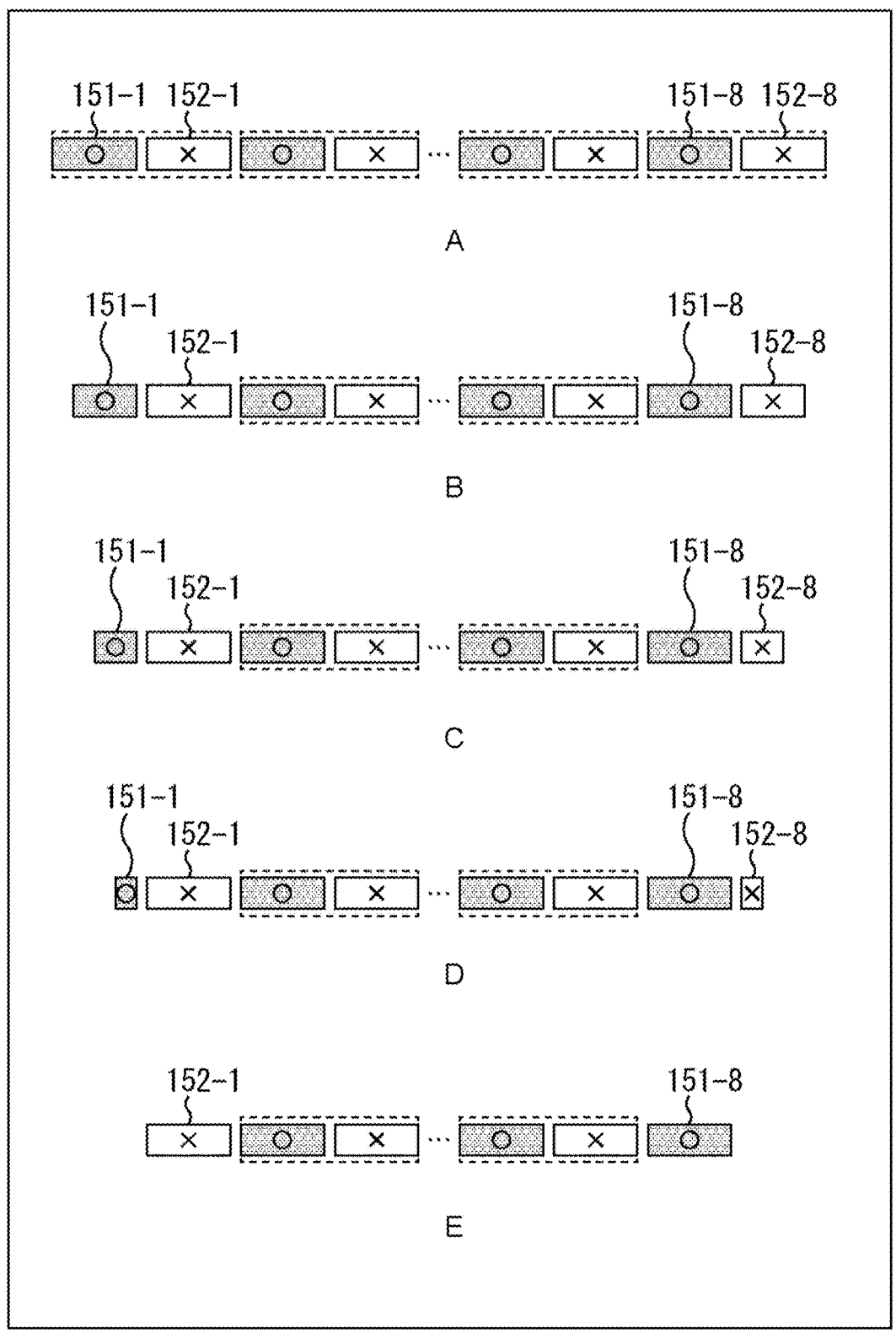
FIG. 12 is a diagram that illustrates an example of control of the width of a conductor of a side end portion.

For example, the widths of the side end portion wirings (the normal phase wiring 151-1 and the reverse phase wiring 152-8) are set to those illustrated in A of FIG. 12 to E of FIG. 12.

In the example of A of FIG. 12, the widths of the side end portion wirings (the normal phase wiring 151-1 and the reverse phase wiring 152-8) are set to be the same as the widths of the other wirings (the reverse phase wiring 152-1 to the normal phase wiring 151-8). In the example of B of FIG. 12, the widths of the side end portion wirings are set to ¾ of the widths of the other wirings. In the example of C of FIG. 12, the widths of the side end portion wirings are set to ½ of the widths of the other wirings. In the example of D of FIG. 12, the widths of the side end portion wirings are set to ¼ of the widths of the other wirings. In the example of E of FIG. 12, the widths of the side end portion wirings are set to zero, in other words, the side end portion wirings (the normal phase wiring 151-1 and the reverse phase wiring 152-8) are omitted.

Figure 13:
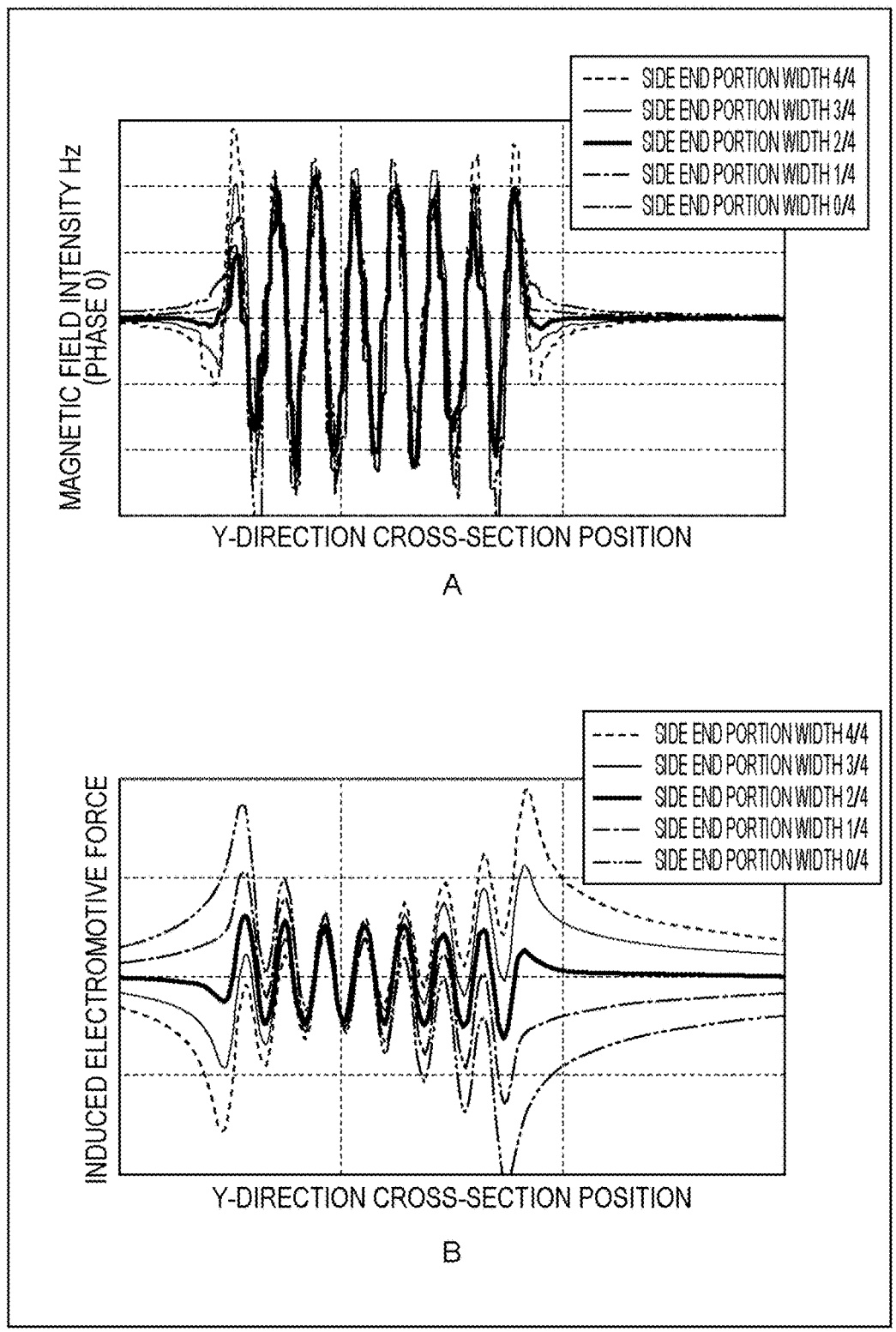
FIG. 13 is a diagram that illustrates an example of the distribution of a magnetic field intensity and the distribution of an induced electromotive force.

An example of the distribution of the magnetic field intensity in a case where the widths of the side end portion wirings are as such in a case of being seen from the same direction as that of B of FIG. 6 is illustrated in A of FIG. 13. In addition, an example of the distribution of the induced electromotive force of such a case in a case of being seen from the same direction as that of B of FIG. 6 is illustrated in B of FIG. 13.

As illustrated in A of FIG. 13, in a case where the widths of the side end portion wirings are set to be smaller than the widths of the other wirings, the magnetic field intensities of the side end portions are suppressed to be low. Accordingly, as illustrated in B of FIG. 13, the induced electromotive forces of the side end portions are suppressed as well. In other words, by configuring the widths of the side end portion wirings to be smaller than the widths of the other wirings, the induced electromotive forces of the side end portions can be suppressed to be low. In other words, the generation of a noise in a conductor loop can be suppressed.

In addition, as illustrated in A of FIG. 13, among such widths of the wirings, in a case where the widths of the wirings of the side end portions are about ½ of the widths of the other wirings, the magnetic field intensities of the side end portions are suppressed to be the lowest. Accordingly, as illustrated in B of FIG. 13, among such widths of the wirings, in a case where the widths of the wirings of the side end portions are about ½ of the widths of the other wirings, the induced electromotive forces of the side end portions are suppressed to be the lowest. In other words, by configuring the widths of the wirings of the side end portions to be about ½ of the widths of the other wirings, the induced electromotive forces of the side end portions can be suppressed to be lower. In other words, the generation of a noise in a conductor loop can be suppressed.

This similarly applies also to a case where the thicknesses of the conductors are controlled instead of the widths of the conductors. In other words, by configuring the thicknesses of the wirings of the side end portions to be smaller than the thicknesses of the other wirings, induced electromotive forces of the side end portions can be suppressed to be low. In other words, the generation of a noise in a conductor loop can be suppressed. Particularly, by configuring the thicknesses of the side end portion wirings to be about ½ of the thicknesses of the other wirings, the induced electromotive forces of the side end portions can be suppressed to be lower. In other words, the generation of a noise in a conductor loop can be further suppressed.

In other words, as described above, this similarly applies also to a case where the cross-sectional area (the cross-sectional area of a face vertical to the first direction) of the conductor is controlled. In other words, by configuring the cross-sectional areas of the wirings of the side end portion to be smaller than the cross-sectional areas of the other wirings, induced electromotive forces of the side end portions can be suppressed to be low. In other words, the generation of a noise in a conductor loop can be suppressed. Particularly, by configuring the cross-sectional areas of the side end portion wirings to be about ½ of the cross-sectional areas of the other wirings, induced electromotive forces of the side end portions can be suppressed to be lower. In other words, the generation of a noise in a conductor loop can be further suppressed.

<Control of Addition of Conductor to Side End Portion>

As a structure suppressing an induced electromotive force generated in a conductor loop in accordance with a magnetic field generated on the periphery of a conductor group in the third direction, which is included in a conductor of at least one end portion of the conductor group in the third direction, for example, a conductor through which a current flows in the opposite direction of the direction of a current flowing through the conductor of the end portion may be further arranged near the conductor of the end portion.

For example, the cross-sectional area of a face of a conductor, through which a current flows in the opposite direction of the direction of the current flowing through the conductor of the end portion, vertical to the first direction may be configured to be smaller than the cross-sectional area of a face of the conductor of the end portion that is vertical to the first direction.

For example, the cross-sectional area of a face of a conductor through which a current flows in the opposite direction of the direction of a current flowing through a conductor of an end portion that is vertical to the first direction may be configured to be about ½ of the cross-sectional area of a face of the conductor of the end portion that is vertical to the first direction.

Figure 14:
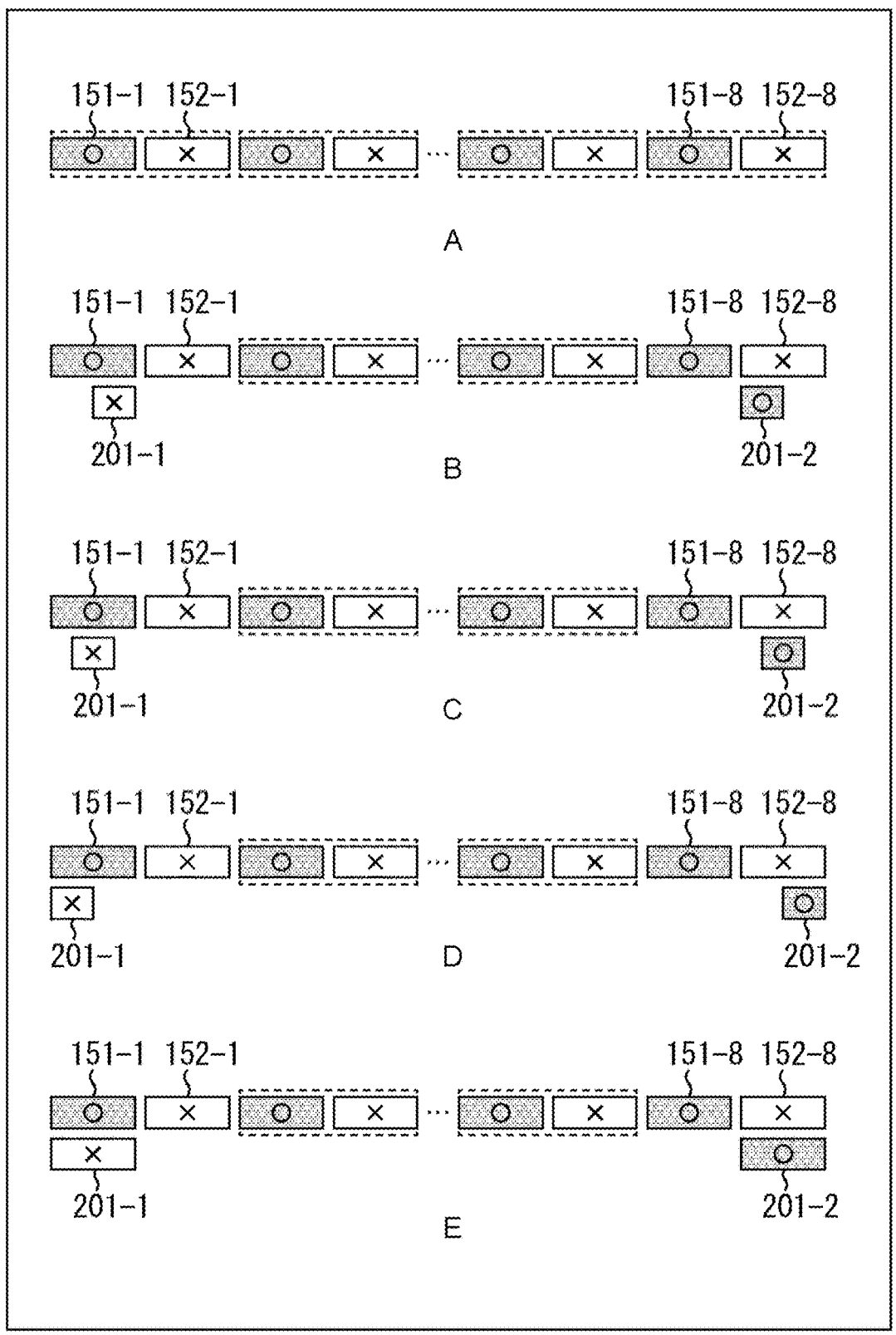
FIG. 14 is a diagram that illustrates an example of control of addition of a conductor of a side end portion.

For example, near the side end portion wirings (the normal phase wiring 151-1 and the reverse phase wiring 152-8), a conductor (an additional wiring 201) through which a current flows in the opposite direction of the direction of a current flowing through the side end portion wirings is arranged as illustrated in A of FIG. 14 to E of FIG. 14.

In the example of A of FIG. 14, an additional wiring is not disposed near the side end portion wirings (the normal phase wiring 151-1 and the reverse phase wiring 152-8).

In the examples of B of FIG. 14 to D of FIG. 14, an additional wiring 201-1 that is a reverse phase wiring of which the wiring width is about ½ of that of the normal phase wiring 151-1 is arranged near (the lower side in the drawing) the normal phase wiring 151-1, and an additional wiring 201-2 that is a normal phase wiring of which the wiring width is about ½ of that of the reverse phase wiring 152-8 is arranged near (the lower side in the drawing) the reverse phase wiring 152-8. In a case where the additional wiring 201-1 and the additional wiring 201-2 do not need to be discriminated from each other in description, each thereof will be referred to as an additional wiring 201.

In the examples of B of FIG. 14 to D of FIG. 14, the arrangement positions of the additional wiring 201 are different from each other. The additional wiring 201 is arranged near the center of the differential wiring group 150 of the side end portion wiring in the case of B of FIG. 14, is arranged near the center of the side end portion wiring in the case of C of FIG. 14, and is arranged near the end side of the differential wiring group 150 of the side end portion wiring in the case of D of FIG. 14. In other words, the additional wiring 201 is arranged on a further end side of the differential wiring group 150 in the case of C of FIG. 14 than in the case of B of FIG. 14 and is arranged on a further end side of the differential wiring group 150 in the case of D of FIG. 14 than in the cases of B and C of FIG. 14.

In the example of E of FIG. 14, an additional wiring 201-1 that is a reverse phase wiring of which the wiring width is of a same level as that of the normal phase wiring 151-1 is arranged near (the lower side in the drawing) of the normal phase wiring 151-1, and an additional wiring 201-2 that is a normal phase wiring of which the wiring width is of a same level as that of the reverse phase wiring 152-8 is arranged near (the lower side in the drawing) the reverse phase wiring 152-8.

Figure 15:
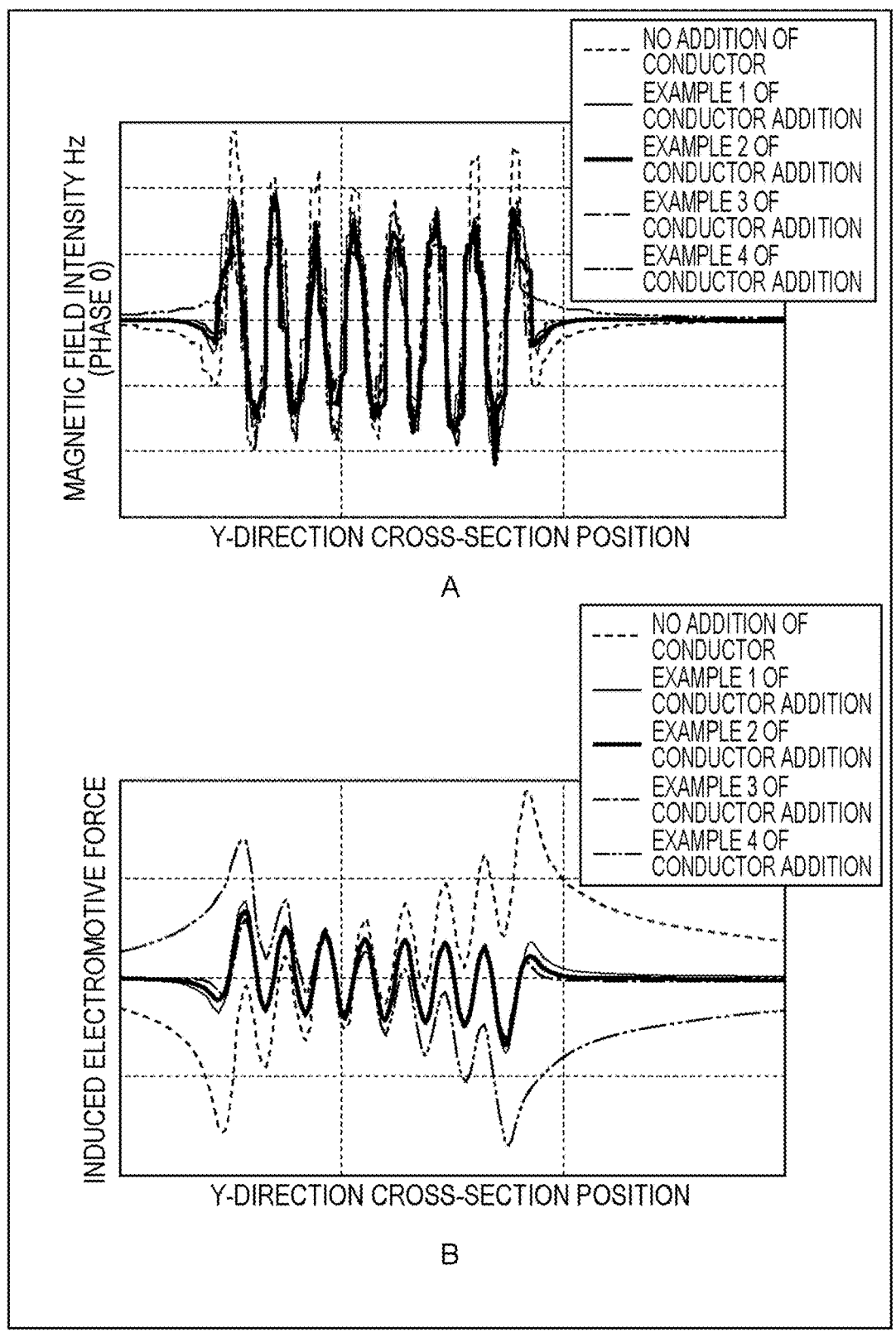
FIG. 15 is a diagram that illustrates an example of the distribution of a magnetic field intensity and the distribution of an induced electromotive force.

An example of the distribution of the magnetic field intensity of a case where the additional wirings are arranged in the side end portion in this way in a case of being seen from the same direction as that of B of FIG. 6 is illustrated in A of FIG. 15. In addition, an example of the distribution of the induced electromotive force of such a case of being seen from the same direction as that of B of FIG. 6 in these cases is illustrated in B of FIG. 15.

As illustrated in A of FIG. 15, in a case where an additional wiring 201 through which a current flows in the opposite direction of the direction of a current flowing through a side end portion wiring is arranged near the side end portion wiring, the magnetic field intensity of the side end portion is suppressed to be low. Accordingly, as illustrated in B of FIG. 15, the induced electromotive force of the side end portion is suppressed to be low as well. In other words, by arranging the additional wiring 201 through which a current flows in the opposite direction of the direction of a current flowing through the side end portion wiring near the side end portion wiring, the induced electromotive force of the side end portion can be suppressed to be low. In other words, the generation of a noise in a conductor loop can be suppressed. The reason for this is that the direction of the current flowing through the side end portion wiring and the direction of the current flowing through the additional wiring 201 are approximately opposite to each other, and accordingly, a magnetic field generated from the side end portion wiring is offset by a magnetic field generated from the additional wiring 201.

In addition, as illustrated in A of FIG. 15, among such examples, in the cases of B of FIG. 14 to D of FIG. 14, the magnetic field intensity of the side end portion is suppressed to be the lowest. Accordingly, as illustrated in B of FIG. 15, among such examples, in the cases of B of FIG. 14 to D of FIG. 14, the induced electromotive force of the side end portion is suppressed to be the lowest. In other words, by arranging the additional wiring 201 of which the wiring width is about ½ of that of the side end portion wiring and in which the direction of the current is the opposite direction of the side end portion wiring near the side end portion wiring, the induced electromotive force of the side end portion can be further suppressed. In other words, the generation of a noise in a conductor loop can be further suppressed.

Note that, as in the examples illustrated in A of FIG. 15 and B of FIG. 15, there is no big difference between the magnetic field intensities or the induced electromotive forces of the examples of B of FIG. 14 to D of FIG. 14. In other words, the arrangement position of the additional wiring 201 may be near the side end portion wiring.

<Example of Configuration of Differential Wiring Group>

Note that the configuration of the differential wiring group 150 or the differential wiring set 154 is arbitrary as long as magnetic fields generated according to the currents of the wirings are mutually suppressed but is not limited to the example of A of FIG. 6.

For example, the width (the length in the third direction) of the normal phase wiring 151 configuring the differential wiring set 154 and the width of the reverse phase wiring 152 may be different from each other. For example, as in A of FIG. 16, in each differential wiring set 154, the width of the normal phase wiring 151 may be larger than the width of the reverse phase wiring 152. For example, in the case of A of FIG. 16, in the differential wiring set 154-1, the width of the normal phase wiring 151-1 is longer than the width of the reverse phase wiring 152-2. This similarly applies also to the other differential wiring sets 154.

The width of the reverse phase wiring 152 may be longer than the width of the normal phase wiring 151. In addition, only some of the differential wiring sets 154 of the differential wiring group 150, the width of the normal phase wiring 151 and the width of the reverse phase wiring 152 may be different from each other. Furthermore, in the differential wiring group 150, a differential wiring set 154 in which the width of the normal phase wiring 151 is longer than the width of the reverse phase wiring 152 and a differential wiring set 154 in which the width of the reverse phase wiring 152 is longer than the width of the normal phase wiring 151 may be mixed.

In addition, for example, the number of normal phase wirings 151 and the number of reverse phase wirings 152 configuring a differential wiring set 154 may be different from each other. For example, in each differential wiring set 154, a reverse phase wiring 152 may be divided into two parts to have equal widths as in B of FIG. 16, be divided into three parts to have equal widths as in C of FIG. 16, or be divided into five parts to have unequal widths as in D of FIG. 16.

Figure 16:
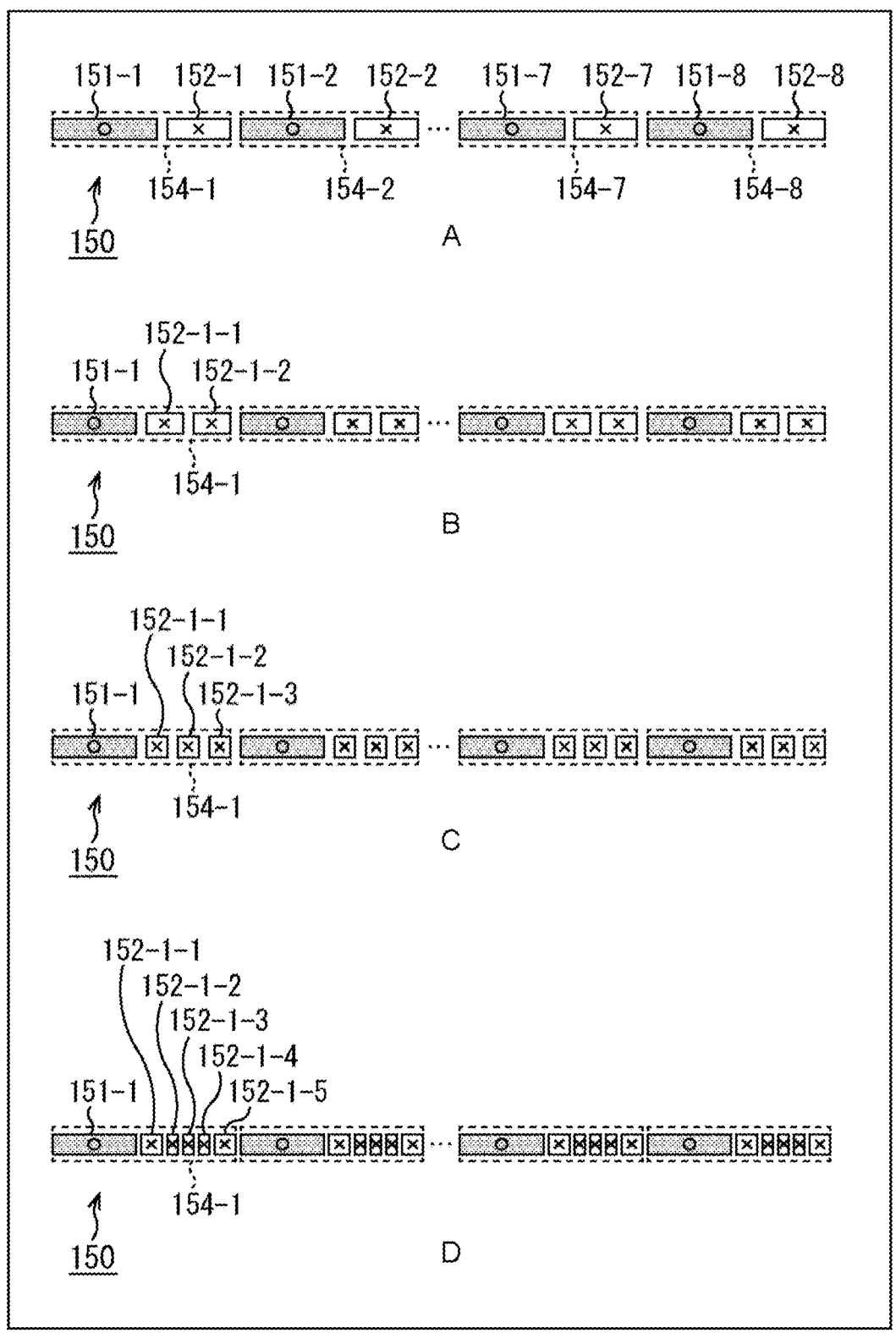
FIG. 16 is a diagram that illustrates an example of the configuration of a conductor group.

For example, in the case of B of FIG. 16, in a differential wiring set 154-1, a reverse phase wiring 152-1 is divided into a reverse phase wiring 152-1-1 and a reverse phase wiring 152-1-2 to have equal widths. This similarly applies also to the other differential wiring sets 154.

In addition, for example, in the case of C of FIG. 16, in a differential wiring set 154-1, a reverse phase wiring 152-1 is divided into a reverse phase wiring 152-1-1, a reverse phase wiring 152-1-2, and a reverse phase wiring 152-1-3 to have equal widths. This similarly applies also to the other differential wiring sets 154.

Furthermore, for example, in the case of D of FIG. 16, in a differential wiring set 154-1, a reverse phase wiring 152-1 is divided into a reverse phase wiring 152-1-1, a reverse phase wiring 152-1-2, a reverse phase wiring 152-1-3, a reverse phase wiring 152-1-4, and a reverse phase wiring 152-1-5 to have unequal widths. This similarly applies also to the other differential wiring sets 154.

The number of divisions is arbitrary. In addition, as in the case of D of FIG. 16, a method of unequal divisions may be used. Furthermore, a sum of widths of reverse phase wirings 152 after the division may be different that of the normal phase wirings 151. In addition, a dividing method (the number of divisions, the width of each wiring, and the like) for the reverse phase wirings 152 in at least some of the differential wiring sets 154 may be different from a dividing method in the other differential wiring sets 154. In other words, the dividing method may not be uniform for all the differential wiring sets 154.

It is apparent that not the reverse phase wiring 152 but the normal phase wiring 151 may be configured to be divided. Such a case is similar to the above-described case where the reverse phase wiring 152 is divided.

In addition, not only the reverse phase wiring 152 but also the normal phase wiring 151 may be configured to be divided. In such a case, in some or all of the differential wiring sets 154, the method of dividing the normal phase wiring 151 may be the same as or different from the method of dividing the reverse phase wiring 152.

Figure 17:
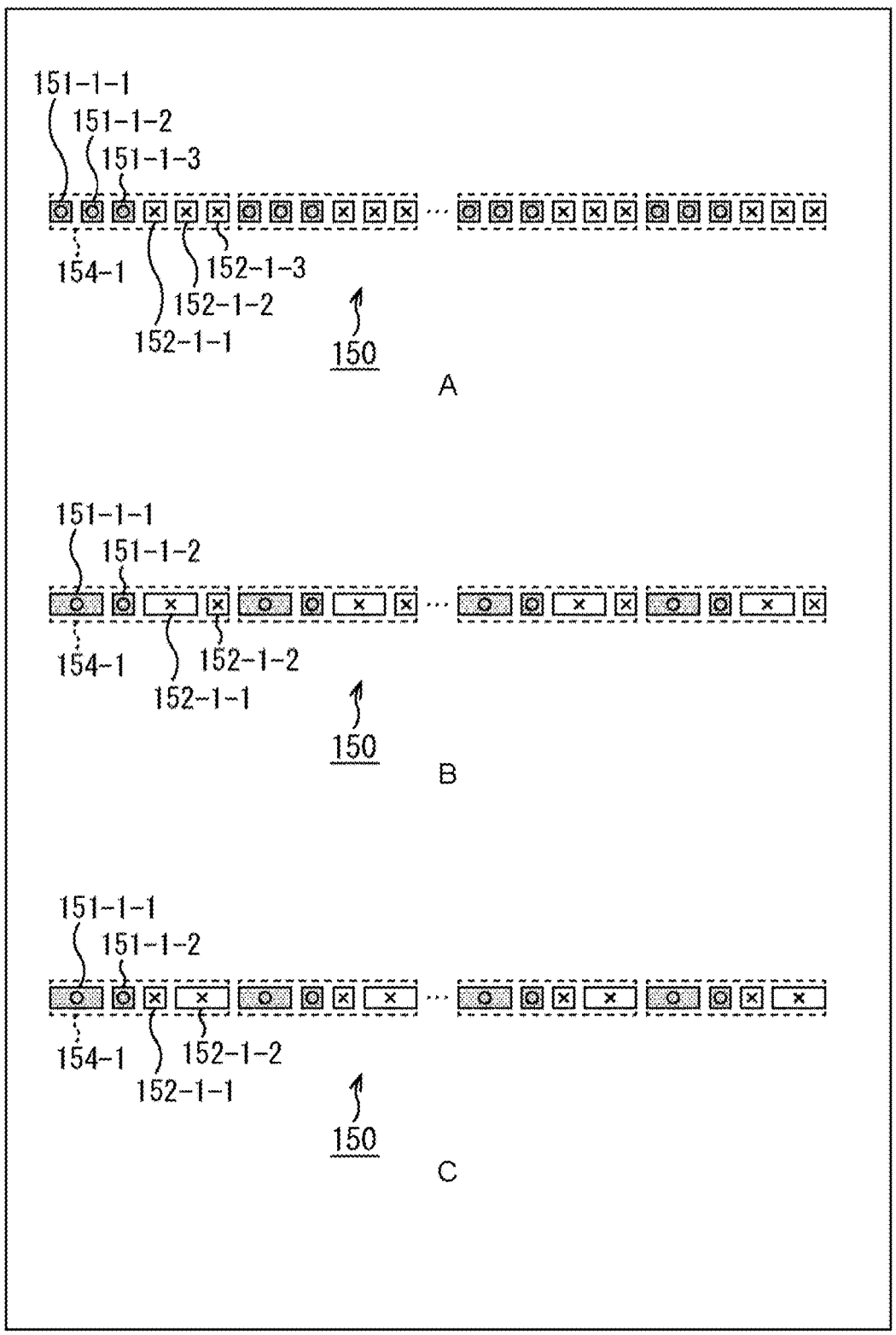
FIG. 17 is a diagram that illustrates an example of the configuration of a conductor group.

For example, in all the differential wiring set 154, each of the normal phase wiring 151 and the reverse phase wiring 152 may be similarly equally divided into three parts as in an example of A of FIG. 17 or may be similarly unequally divided into two parts as in an example of B of FIG. 17.

For example, in the case illustrated in A of FIG. 17, in a differential wiring set 154-1, a normal phase wiring 151-1 is divided into a normal phase wiring 151-1-1, a normal phase wiring 151-1-2, and a normal phase wiring 151-1-3 to have uniform widths, and a reverse phase wiring 152-1 is divided into a reverse phase wiring 152-1-1, a reverse phase wiring 152-1-2, and a reverse phase wiring 152-1-3 to have uniform widths. This similarly applies also to the other differential wiring sets 154.

Furthermore, for example, in the case illustrated in B of FIG. 17, in a differential wiring set 154-1, a normal phase wiring 151-1 is divided into a normal phase wiring 151-1-1 and a normal phase wiring 151-1-2 to have unequal widths, and a reverse phase wiring 152-1 is divided into a reverse phase wiring 152-1-1 and a reverse phase wiring 152-1-2 to have unequal widths. This similarly applies also to the other differential wiring sets 154.

In addition, for example, in all the differential wiring sets 154, a normal phase wiring 151-1 and a reverse phase wiring 152, as in the example of C of FIG. 17, may be divided into a structure having mirror symmetry.

For example, in the case illustrated in C of FIG. 17, in a differential wiring set 154-1, a normal phase wiring 151-1 is divided into a normal phase wiring 151-1-1 and a normal phase wiring 151-1-2 to have unequal widths, and, in addition, a reverse phase wiring 152-1 is divided into a reverse phase wiring 152-1-1 having a same width as the normal phase wiring 151-1-2 and a reverse phase wiring 152-1-2 having a same width as the normal phase wiring 151-1-1. This similarly applies to the other differential wiring sets 154.

Also in the case of FIG. 17, similar to the case of FIG. 16, the dividing method (the number of divisions, the width of each wiring, and the like) for the normal phase wiring 151 and the reverse phase wiring 152 is arbitrary but is not limited to that of the example described above. For example, each of the normal phase wiring 151 and the reverse phase wiring 152 may be divided into four or more parts. In addition, a sum of the widths of the wirings after the division may be different between the normal phase wiring 151 and the reverse phase wiring 152. Furthermore, the dividing method may not be uniformized among all the differential wiring sets 154. In addition, only in some differential wiring sets 154, the normal phase wiring 151 and the reverse phase wiring 152 may be divided as in each example of FIG. 17.

In addition, for example, in each differential wiring set 154, the arrangement (for example, the alignment order) of the normal phase wiring 151 and the reverse phase wiring 152 is arbitrary. For example, in each differential wiring set 154, the normal phase wiring 151 and the reverse phase wiring 152 may be, as in A of FIG. 18, arranged to be alternately aligned two times, may be, as in B of FIG. 18, arranged to be alternately aligned three times, or may be, as in C of FIG. 18, arranged to be alternately aligned five times.

For example, in the case of A of FIG. 18, in a differential wiring set 154-1, a normal phase wiring 151-1-1, a normal phase wiring 151-1-2, a reverse phase wiring 152-1-1, a reverse phase wiring 152-1-2, a reverse phase wiring 152-1-3, and a normal phase wiring 151-1-3 are arranged in this order from the left side in the drawing. This similarly applies also to the other differential wiring sets 154.

For example, in the case of B of FIG. 18, in a differential wiring set 154-1, a normal phase wiring 151-1-1, a reverse phase wiring 152-1-1, a normal phase wiring 151-1-2, and a reverse phase wiring 152-1-2 are arranged in this order from the left side in the drawing. This similarly applies also to the other differential wiring sets 154.

For example, in the case of C of FIG. 18, in a differential wiring set 154-1, a normal phase wiring 151-1-1, a reverse phase wiring 152-1-1, a normal phase wiring 151-1-2, a reverse phase wiring 152-1-2, a normal phase wiring 151-1-3, and a reverse phase wiring 152-1-3 are arranged in this order from the left side in the drawing. This similarly applies also to the other differential wiring sets 154.

Also in the case of FIG. 18, similar to the case of FIG. 16, the method of arrangement of the normal phase wiring 151 and the reverse phase wiring 152 is arbitrary but is not limited to that of the example described above. For example, the normal phase wiring 151 and the reverse phase wiring 152 may be arranged to be alternately aligned seven times or more. In addition, the arrangement method may not be uniformized among all the differential wiring sets 154. Furthermore, only in some differential wiring sets 154, the normal phase wiring 151 and the reverse phase wiring 152 may be arranged as in each example of FIG. 18.

In addition, for example, in the differential wiring group 150, gaps of wirings (each distance between wirings adjacent to each other) are arbitrary. For example, gaps of all the wirings may be uniform. In addition, gaps of at least some wirings may be different from a gap of any other wirings. In other words, the gaps of wirings of the differential wiring group 150 may be non-uniform.

In addition, the gaps of the wirings may be either uniform or non-uniform in the longitudinal direction of the wirings. In other words, the gap of wirings may be changed according to a position in the longitudinal direction of the wirings. Such a change in the gap of wirings in the longitudinal direction of the wirings may be generated only in gaps of some wirings or be generated in gaps of all the wirings.

Figure 19:
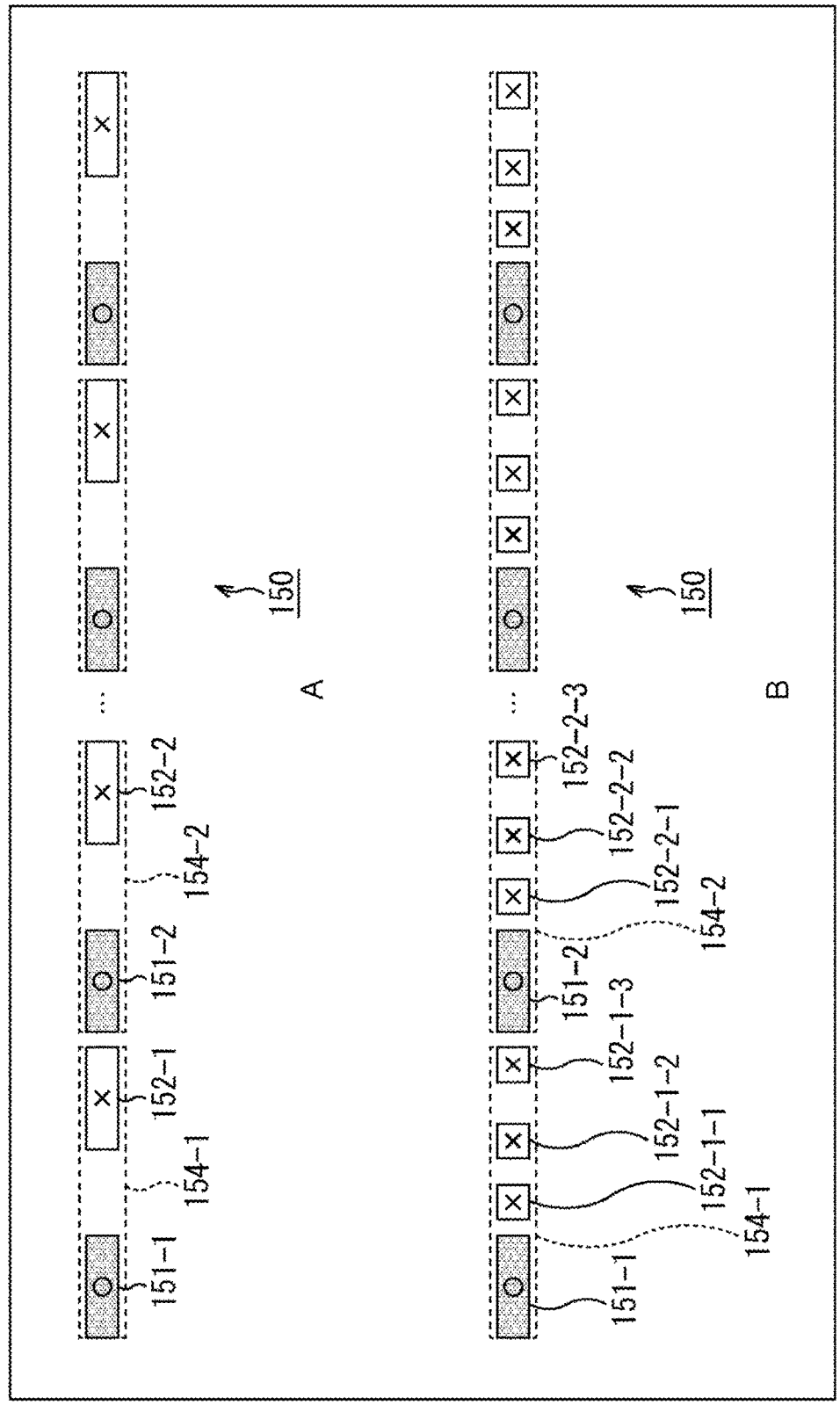
FIG. 19 is a diagram that illustrates an example of the configuration of a conductor group.

For example, as in A of FIG. 19, a gap of wirings between the differential wiring sets 154 and a gap of wirings within the differential wiring set 154 may be different from each other. In the example of A of FIG. 19, a gap (a gap of wirings within the differential wiring set 154-1) between a normal phase wiring 151-1 and a reverse phase wiring 152-1 is larger than a gap (in other words, a gap of wirings between differential wiring sets 154) between a reverse phase wiring 152-1 of a differential wiring set 154-1 and a normal phase wiring 151-2 of a differential wiring set 154-2. This similarly applies also to the other differential wiring sets 154.

The gap of wirings within a differential wiring set 154 may be configured to be narrower than the gap of wirings between differential wiring sets 154. In addition, only in some differential wiring sets 154, a gap of wirings may be configured to be different from the gap of wirings between the differential wiring sets 154.

In addition, for example, gaps of wirings within a differential wiring set 154 may be non-uniform. In other words, within a differential wiring set 154, a gap of at least some wirings may be configured to be different from a gap of any other wiring.

For example, a gap between normal phase wirings 151 may be configured to be different from a gap between reverse phase wirings 152 and a gap between a normal phase wiring 151 and a reverse phase wiring 152. In addition, for example, the gap between reverse phase wirings 152 may be configured to be different from the gap between normal phase wirings 151 and the gap between a normal phase wiring 151 and a reverse phase wiring 152. Furthermore, for example, the gap between a normal phase wiring 151 and a reverse phase wiring 152 may be configured to be different from the gap between normal phase wirings 151 and the gap between reverse phase wirings 152. In addition, for example, the gap between normal phase wirings 151, the gap between the reverse phase wirings 152, and the gap between the normal phase wiring 151 and the reverse phase wiring 152 may be configured to be different from each other.

In addition, for example, at least any one of the gap between normal phase wirings 151, the gap between reverse phase wirings 152, and the gap between a normal phase wiring 151 and a reverse phase wiring 152 may be configured to be the same as the gap of wirings between differential wiring sets 154. Furthermore, all the gap between normal phase wirings 151, the gap between reverse phase wirings 152, and the gap between a normal phase wiring 151 and a reverse phase wiring 152 may be configured to be different from the gap of wirings between differential wiring sets 154.

In addition, for example, in a case where a plurality of adjacencies between normal phase wirings 151 are present within a differential wiring set 154, at least some of such gaps may be configured to be different from any other gap. For example, in a case where the differential wiring set 154 includes normal phase wiring 151-1 to normal phase wiring 151-3 adjacent to each other, the normal phase wiring 151-1 and the normal phase wiring 151-2 are adjacent to each other, and the normal phase wiring 151-2 and the normal phase wiring 151-3 are adjacent to each other. The gaps of the wirings in such adjacencies may be configured to be different from each other.

In a case where a plurality of adjacencies among reverse phase wirings 152 are present within a differential wiring set 154, at least some of such gaps may be configured to be different from any other gap, and, in a case where a plurality of adjacencies between a normal phase wiring 151 and a reverse phase wiring 152 are present, at least some of such gaps may be configured to be different from any other gap. In addition, in only some of differential wiring sets 154, the gaps of the wirings may be configured to be different in this way.

An example in which gaps among the reverse phase wirings 152 are different from each other is illustrated in B of FIG. 19. In the example of B of FIG. 19, in a differential wiring set 154-1, a gap between reverse phase wiring 152-1-2 and reverse phase wiring 152-1-3 is larger than a gap between reverse phase wiring 152-1-1 and reverse phase wiring 152-1-2. This similarly applies to the other differential wiring sets 154.

In the differential wiring set 154-1, the gap between the reverse phase wiring 152-1-2 and the reverse phase wiring 152-1-3 may be narrower than the gap between the reverse phase wiring 152-1-1 and the reverse phase wiring 152-1-2.

In addition, for example, in each differential wiring set 154, the thicknesses (lengths in a fourth direction) of a normal phase wiring 151 and a reverse phase wiring 152 may be configured to be different from each other. For example, as in A of FIG. 20, in each differential wiring set 154, the normal phase wiring 151 may be configured to be thicker than the reverse phase wiring 152.

Figure 20:
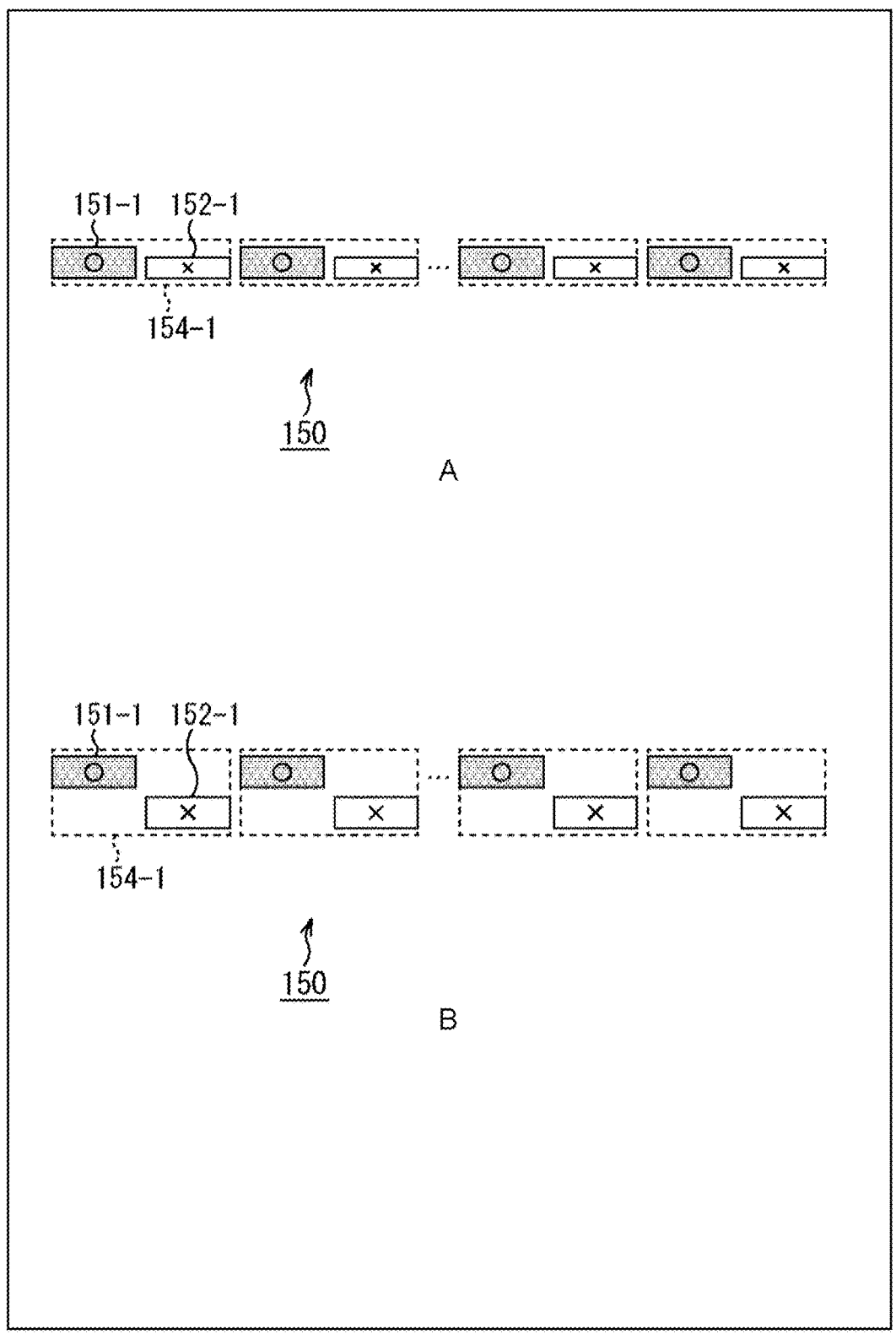
FIG. 20 is a diagram that illustrates an example of the configuration of a conductor group.

For example, in the case of A of FIG. 20, in a differential wiring set 154-1, the normal phase wiring 151-1 is thicker than the reverse phase wiring 152-1. This similarly applies to the other differential wiring set 154.

The normal phase wiring 151 may be configured to be thinner than the reverse phase wiring 152. In addition, in only some differential wiring sets 154, the thicknesses of the normal phase wiring 151 and the reverse phase wiring 152 may be configured to be different from each other. In addition, a differential wiring set 154 in which the normal phase wiring 151 is thicker than the reverse phase wiring 152 and a differential wiring set 154 in which the normal phase wiring 151 is thinner than the reverse phase wiring 152 may be mixed in a differential wiring group 150. Furthermore, the thicknesses of the normal phase wiring 151 may not be uniformized in all the differential wiring sets 154. Similarly, the thicknesses of the reverse phase wirings 152 may not be uniformized in all the differential wiring sets 154.

In addition, for example, in each differential wiring set 154, the position of the normal phase wiring 151 in the fourth direction and the position of the reverse phase wiring 152 in the fourth direction may be configured to be different from each other. For example, as in B of FIG. 20, in each differential wiring set 154, the normal phase wiring 151 may be positioned on a further upper side than the reverse phase wiring 152 in the drawing.

For example, in the case of B of FIG. 20, in a differential wiring set 154-1, a normal phase wiring 151-1 is positioned on a further upper side than a reverse phase wiring 152-1 in the drawing. This similarly applies to the other differential wiring sets 154.

Here, the reverse phase wiring 152 may be configured to be positioned on a further upper side than the normal phase wiring 151 in the drawing. In addition, only in some differential wiring sets 154, the position of the normal phase wiring 151 in the fourth direction and the position of the reverse phase wiring 152 in the fourth direction may be configured to be different from each other. In addition, a differential wiring set 154 in which the normal phase wiring 151 is positioned on a further upper side than the reverse phase wiring 152 in the drawing and a differential wiring set 154 in which the reverse phase wiring 152 is positioned on a further upper side than the normal phase wiring 151 may be mixed in a differential wiring group 150. Furthermore, the positional relation (relative position) between the normal phase wiring 151 and the reverse phase wiring 152 may not be uniformized in all the differential wiring sets 154.

In addition, for example, in the differential wiring group 150, the length (a length in the longitudinal direction (in other words, a direction in which a current flows)) of each wiring is arbitrary. For example, the length of all the wirings may be the same. In addition, the lengths of at least some wirings may be configured to be different from the length of any other wiring. In other words, the lengths of the wirings of the differential wiring group 150 may be non-uniform.

For example, the lengths of wirings of at least some of the differential wiring sets 154 may be configured to be different from the lengths of the wirings of any other differential wiring set 154. In addition, in a differential wiring set 154, the lengths of at least some wirings may be configured to be different from the length of any other wiring.

For example, the length of the normal phase wiring 151 and the length of the reverse phase wiring 152 may be configured to be different from each other. In addition, the lengths of the normal phase wiring 151 may be non-uniform. Furthermore, the lengths of the reverse phase wiring 152 may not be non-uniform. In other words, the lengths of at least some of the normal phase wirings 151 and the lengths of at least some of the reverse phase wirings 152 may be configured to be different from each other.

In addition, for example, the conductivity of each wiring of a differential wiring group 150 is arbitrary. For example, the conductivity of all the wirings may be the same. In addition, the conductivity of at least some wirings may be configured to be different from the conductivity of any other wiring. In other words, the conductivity of the wirings of the differential wiring group 150 may be non-uniform.

For example, the conductivity of wirings of at least some of the differential wiring sets 154 may be configured to be different from the conductivity of wirings of any other differential wiring set 154. In addition, the conductivity of at least some wirings within a differential wiring set 154 may be configured to be different from the conductivity of any other wiring.

For example, the conductivity of the normal phase wiring 151 and the conductivity of the reverse phase wiring 152 may be configured to be different from each other. In addition, the conductivity of each normal phase wiring 151 may be non-uniform. Furthermore, the conductivity of each reverse phase wiring 152 may be non-uniform. In other words, the conductivity of at least some of the normal phase wirings 151 and the conductivity of at least some of the reverse phase wirings 152 may be configured to be different from each other.

In addition, for example, in a differential wiring group 150, the magnitude of electric resistance of each wiring is arbitrary. For example, the magnitudes of electric resistance of all the wirings may be the same. In addition, the magnitudes of electric resistance of at least some wirings may be configured to be different from the magnitude of electric resistance of any other wiring. In other words, the magnitudes of electric resistance of the wirings of the differential wiring group 150 may be non-uniform.

For example, the magnitudes of electric resistance of wirings of at least some of the differential wiring sets 154 may be configured to be different from the magnitudes of electric resistance of wirings of any other differential wiring set 154. In addition, in a differential wiring set 154, the magnitudes of electric resistance of at least some wirings may be configured to be different from the magnitude of electric resistance of any other wiring.

For example, the magnitude of the electric resistance of the normal phase wiring 151 and the magnitude of electric resistance of the reverse phase wiring 152 may be configured to be different from each other. In addition, the magnitudes of electric resistance of the normal phase wiring 151 may be non-uniform. Furthermore, the magnitudes of electric resistance of the reverse phase wiring 152 may be non-uniform. In other words, the magnitudes of electric resistance of at least some of the normal phase wirings 151 and the magnitudes of electric resistance of at least some of reverse phase wirings 152 may be configured to be different from each other.

In addition, for example, in a differential wiring group 150, the magnitude of electric resistance (also referred to as series electric resistance for a wiring) such as a wiring, a component, or the like connected to each wiring in series is arbitrary. For example, the magnitudes of series electric resistance for all the wirings may be the same. In addition, the magnitudes of series electric resistance for at least some of the wirings may be configured to be different from the magnitude of series electric resistance for any other wiring. In other words, the magnitudes of series electric resistance for the wirings of the differential wiring group 150 may be non-uniform.

For example, the magnitudes of series electric resistance for the wirings of at least some of the differential wiring sets 154 may be configured to be different from the magnitude of series electric resistance for the wirings of any other differential wiring set 154. In addition, in a differential wiring set 154, the magnitudes of series electric resistance for at least some of the writings may be configured to be different from the magnitude of series electric resistance for any other wiring.

For example, the magnitude of series electric resistance for the normal phase wiring 151 and the magnitude of series electric resistance for the reverse phase wiring 152 may be configured to be different from each other. In addition, the magnitudes of series electric resistance for the normal phase wirings 151 may be non-uniform. Furthermore, the magnitudes of series electric resistance for the reverse phase wirings 152 may be non-uniform. In other words, the magnitude of series electric resistance for at least some of the normal phase wirings 151 and the magnitudes of series electric resistance for at least some of the reverse phase wirings 152 may be configured to be different from each other.

In addition, for example, in a differential wiring group 150, the magnitude of the joint impedance of the wirings is arbitrary. For example, the magnitudes of the joint impedance of all the wirings may be the same. In addition, the magnitude of the joint impedance of at least some of the wirings may be configured to be different from the magnitude of the joint impedance of any other wiring. In other words, the magnitudes of the joint impedance of the wirings of the differential wiring group 150 may be non-uniform.

For example, the magnitude of the joint impedance of the wirings of at least some of the differential wiring sets 154 may be configured to be different from the magnitude of the joint impedance of the wirings of any other differential wiring set 154. In addition, in a differential wiring set 154, the magnitude of the joint impedance of at least some of the wirings may be configured to be different from the magnitude of the joint impedance of any other wiring.

For example, the magnitude of the joint impedance of the normal phase wiring 151 and the magnitude of the joint impedance of the reverse phase wiring 152 may be configured to be different from each other. In addition, the magnitudes of the joint impedance of the normal phase wirings 151 may be non-uniform. Furthermore, the magnitudes of the joint impedance of the reverse phase wirings 152 may be non-uniform. In other words, the magnitude of the joint impedance of at least some of the normal phase wirings 151 and the magnitude of the joint impedance of at least some of the reverse phase wirings 152 may be configured to be different from each other.

In addition, for example, the magnitude of the joint impedance of a wiring, a component, or the like (also referred to as series joint impedance for the wiring) connected in series to each wiring of a differential wiring group 150 is arbitrary. For example, the magnitudes of the series joint impedance for all the wirings may be the same. In addition, the magnitudes of the series joint impedance for at least some of the wirings may be configured to be different from the magnitude of the series joint impedance for any other wiring. In other words, the magnitudes of the series joint impedance for the wirings of the differential wiring group 150 may be non-uniform.

For example, the magnitude of the series joint impedance for the wirings of at least some of the differential wiring sets 154 may be configured to be different from the magnitude of the series joint impedance of the wirings of any other differential wiring set 154. In addition, the magnitudes of the series joint impedance for at least some of the wirings of a differential wiring set 154 may be configured to be different from the magnitude of the series joint impedance for any other wiring.

For example, the magnitude of the series joint impedance for the normal phase wiring 151 and the magnitude of the series joint impedance for the reverse phase wiring 152 may be configured to be different from each other. In addition, the magnitudes of the series joint impedance for the normal phase wirings 151 may be non-uniform. Furthermore, the magnitudes of the series joint impedance for the reverse phase wiring 152 may be non-uniform. In other words, the magnitudes of the series joint impedance for at least some of the normal phase wirings 151 and the magnitudes of the series joint impedance for at least some of the reverse phase wirings 152 may be configured to be different from each other.

In addition, for example, the number of layers (the number of alignments in the fourth direction) of the normal phase wirings 151 of each differential wiring set 154 and the number of layers of the reverse phase wirings 152 may be configured to be different from each other. For example, as in A of FIG. 21, in each differential wiring set 154, a plurality of layers of reverse phase wirings 152 may be formed for a normal phase wiring 151 of a single layer.

Figure 21:
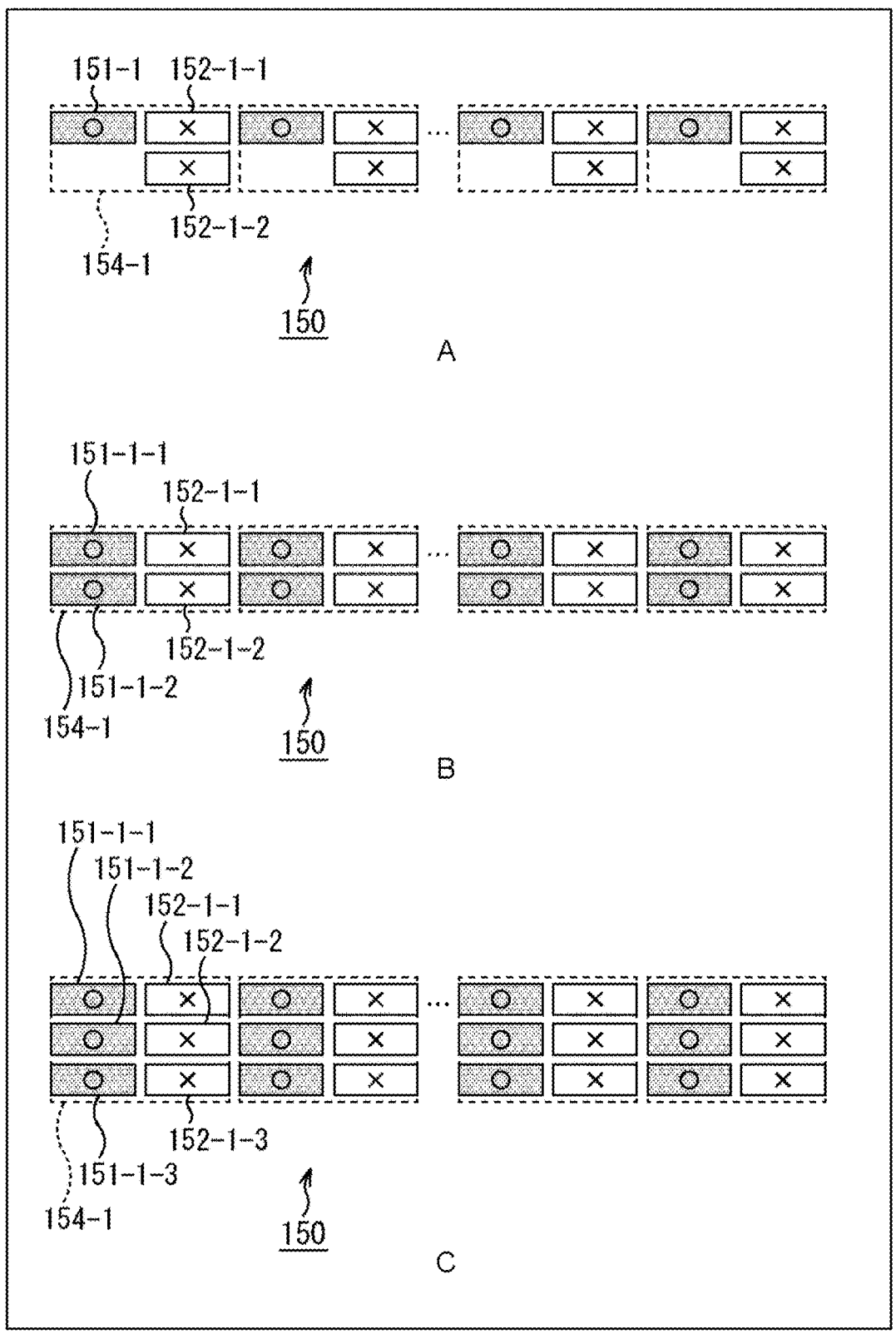
FIG. 21 is a diagram that illustrates an example of the configuration of a conductor group.

For example, in the case of A of FIG. 21, in a differential wiring set 154-1, a normal phase wiring 151-1 of a single layer and reverse phase wirings 152-1-1 and 152-1-2 of two layers are formed. This similarly applies also to the other differential wiring sets 154.

Here, the number of layers of the reverse phase wirings 152 is arbitrary but is not limited to the example of A of FIG. 21. For example, the reverse phase wirings 152 may be formed in three or more layers. In addition, in all the differential wiring sets 154, the number of layers of reverse phase wirings 152 may not be uniformized. For example, only in some of the differential wiring sets 154, reverse phase wirings 152 may be formed in a plurality of layers.

In addition, a reverse phase wiring 152 may be formed in a single layer, and normal phase wirings 151 may be formed in a plurality of layers. In such a case, similar to the case of the reverse phase wirings 152, the number of layers of the normal phase wirings 151 is arbitrary. In addition, in all the differential wiring sets 154, the number of layers of the normal phase wirings 151 may not be uniformized. Furthermore, both the normal phase wirings 151 and the reverse phase wirings 152 may be formed in a plurality of layers.

In such a case, the number of layers of the normal phase wiring 151 and the number of layers of the reverse phase wirings 152 may be the same. For example, in each differential wiring set 154, the normal phase wirings 151 and the reverse phase wirings 152 may be formed in two layers as in B of FIG. 21 or may be formed in three layers as in C of FIG. 21.

For example, in the case of B of FIG. 21, in a differential wiring set 154-1, normal phase wirings 151-1 and 151-2 of two layers and reverse phase wirings 152-1-1 and 152-1-2 of two layers are formed. This similarly applies also to the other differential wiring sets 154.

In addition, for example, in the case of C of FIG. 21, in a differential wiring set 154-1, normal phase wirings 151-1 to 151-3 of three layers and reverse phase wirings 152-1-1 and 152-1-3 of three layers are formed. This similarly applies also to the other differential wiring sets 154.

The number of layers of each of the normal phase wirings 151 and the reverse phase wirings 152 is arbitrary and may be four or more. In addition, in all the differential wiring sets 154, the numbers of layers of the normal phase wirings 151 and the reverse phase wiring 152 may not be uniformized. For example, only in some of the differential wiring sets 154, the normal phase wirings 151 and the reverse phase wirings 152 may be formed in a plurality of layers. In addition, the number of layers of normal phase wirings 151 and the number of layers of reverse phase wirings 152 may be configured to be different from each other. Only in some of the differential wiring sets 154, the number of layers of normal phase wirings 151 and the number of layers of reverse phase wirings 152 may be configured to be different from each other. In other words, only in some of the differential wiring sets 154, the number of layers of normal phase wirings 151 and the number of layers of reverse phase wirings 152 may be configured to be the same.

In addition, in a case where the normal phase wirings 151 and the reverse phase wirings 152 are formed in a plurality of layers, short circuits may be formed between layers of some or all of such wirings. For example, as in A of FIG. 22 or B of FIG. 22, short circuits may be formed using conductors between the layers of the normal phase wirings 151 and between the layers of the reverse phase wirings 152.

Figure 22:
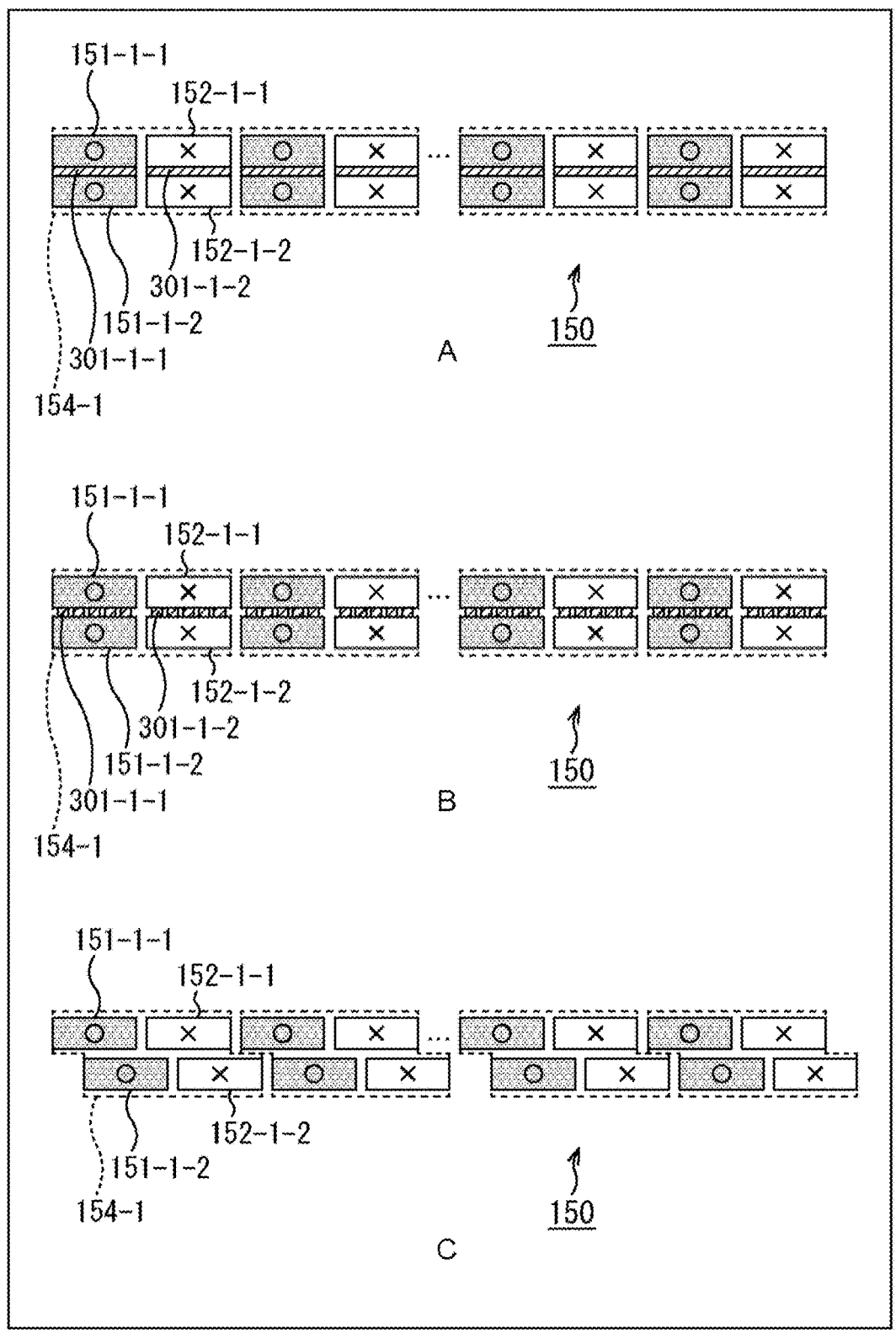
FIG. 22 is a diagram that illustrates an example of the configuration of a conductor group.

In the case of the example illustrated in A of FIG. 22, in a differential wiring set 154-1, a normal phase wiring 151-1-1 and a normal phase wiring 151-1-2 wholly form a short circuit through a conductor 301-1-1. Similarly, a reverse phase wiring 152-1-1 and a reverse phase wiring 152-1-2 wholly form a short circuit through a conductor 301-1-2. This similarly applies also to the other differential wiring sets 154. In the case of the example illustrated in B of FIG. 22, in a differential wiring set 154-1, a normal phase wiring 151-1-1 and a part of a normal phase wiring 151-1-2 form a short circuit through a conductor 301-1-1. Similarly, a reverse phase wiring 152-1-1 and a part of a reverse phase wiring 152-1-2 forma short circuit through a conductor 301-1-2. This similarly applies also to the other differential wiring sets 154. Note that, hereinafter, in a case where the conductor 301-1-1 and a conductor 301-N-2 do not need to be discriminated from each other in description, each thereof will be referred to as a conductor 301-1. In other words, in a case where M of a conductor 301-N-M (here, N and M are natural numbers) does not need to be identified in description, it will be referred to as a conductor 301-N. In addition, in a case where N of a conductor 301-N does not need to be identified in description, it will be referred to as a conductor 301.

Formation of a short circuit in wirings using such a conductor 301 may be performed only between some of the layers. In addition, the formation of a short circuit in wirings using such a conductor 301 may be performed only in some of the differential wiring sets 154.

In addition, in a case where the normal phase wirings 151 and the reverse phase wirings 152 are formed in a plurality of layers, for example, as in C of FIG. 22, the positions of the normal phase wirings 151 and the reverse phase wirings 152 of the layers in the third direction may be configured to be different from each other.

In the case of C of FIG. 22, for example, in a differential wiring set 154-1, the positions of a normal phase wiring 151-1-1 and a reverse phase wiring 152-1-1 of a layer, which is disposed on the upper side in the drawing, in the third direction and the positions of a normal phase wiring 151-1-2 and a reverse phase wiring 152-1-2 of a layer, which is disposed on the lower side in the drawing, in the third direction are different from each other. This similarly applies to the other differential wiring sets 154.

The positional difference between the layers in the third direction may be generated only in some of the differential wiring sets 154. In addition, among all the layers of each differential wiring set 154, differences in the positions in the third direction may not be uniformized.

Figure 23:
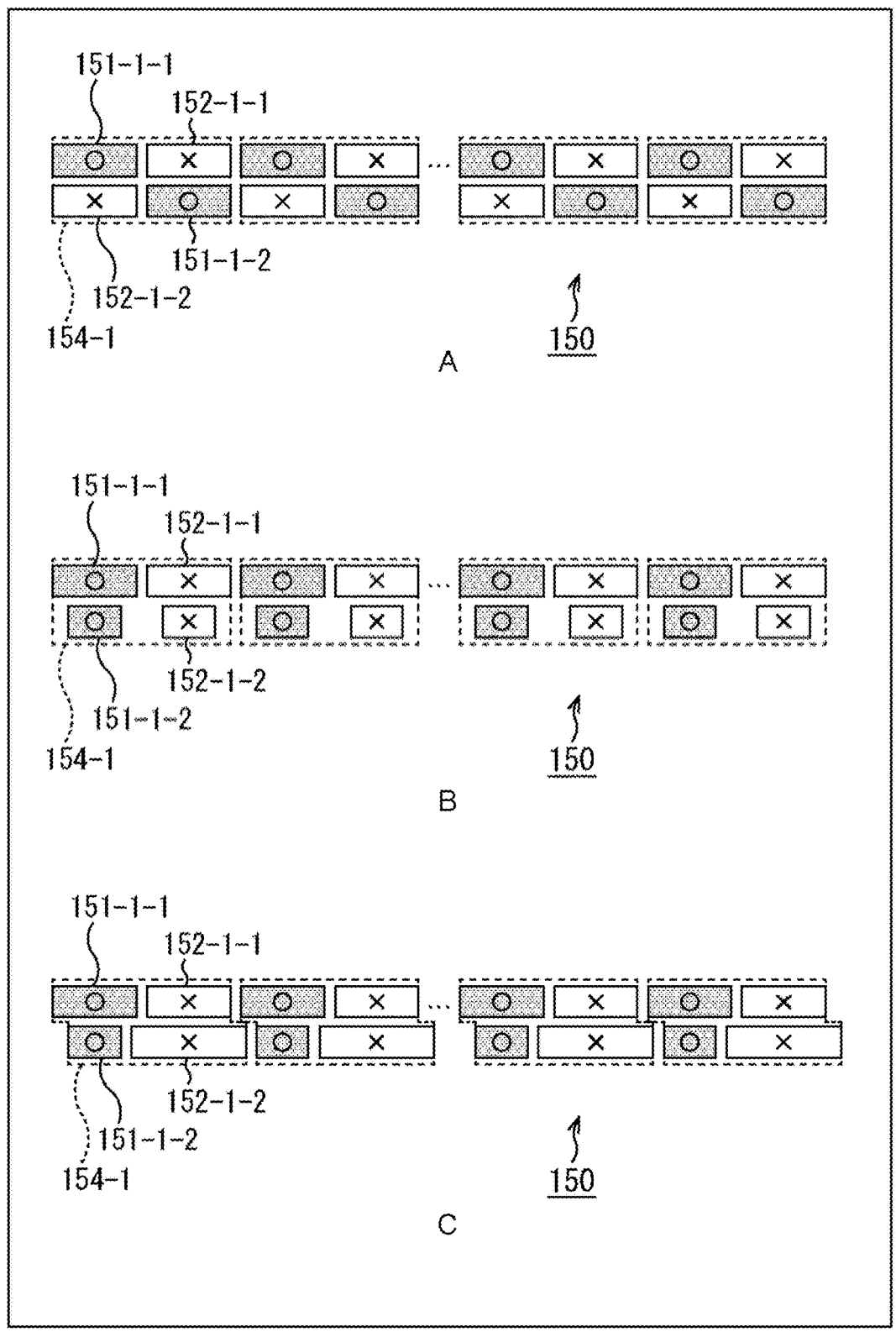
FIG. 23 is a diagram that illustrates an example of the configuration of a conductor group.

In addition, in a case where the normal phase wirings 151 and the reverse phase wirings 152 are formed in a plurality of layers, for example, as in A of FIG. 23, the direction of a current may be configured to be different between layers. In other words, the normal phase wirings 151 and the reverse phase wirings 152 may be formed to be stacked in the fourth direction.

In the case of A of FIG. 23, for example, in a differential wiring set 154-1, a normal phase wring 151-1-1 and a reverse phase wiring 152-1-2 are formed to be stacked in the fourth direction, and a reverse phase wiring 152-1-1 and a normal phase wiring 151-1-2 are formed to be stacked in the fourth direction.

Such a configuration may be configured to be formed only in some of the differential wiring sets 154.

In addition, in a case where the normal phase wirings 151 and the reverse phase wirings 152 are formed in a plurality of layers, the wiring widths of the layers may be configured to be different from each other. For example, as in B of FIG. 23, a wiring width of a layer disposed on the upper side in the drawing may be configured to be longer than a wiring width of a layer disposed on the lower side in the drawing.

In the case of B of FIG. 23, for example, in a differential wiring set 154-1, a wiring width of a normal phase wiring 151-1-1 of a layer disposed on the upper side in the drawing is longer than a wiring width of a normal phase wiring 151-1-2 of a layer disposed on the lower side in the drawing. Similarly, a wiring width of a reverse phase wiring 152-1-1 of the layer disposed on the upper side in the drawing is longer than a wiring width of a reverse phase wiring 152-1-2 of the layer disposed on the lower side in the drawing. This applies also to the other differential wiring sets 154.

In only some of the differential wiring sets 154, the wiring width of the layer disposed on the upper side in the drawing may be configured to be longer than the wiring width of the layer disposed on the lower side. In addition, to the contrary, in some or all of the differential wiring sets 154, the wiring width of the layer disposed on the lower side in the drawing may be configured to be longer than the wiring width of the layer disposed on the upper side.

In addition, for example, as in C of FIG. 23, the method of changing the wiring width may be different for the normal phase wiring 151 and the reverse phase wiring 152.

In the case of C of FIG. 23, for example, in a differential wiring set 154-1, the wiring width of a normal phase wiring 151-1-1 of a layer disposed on the upper side in the drawing is longer than the wiring width of a normal phase wiring 151-1-2 that is on the lower side in the drawing. In contrast to this, the wiring width of a reverse phase wiring 152-1-1 of a layer disposed on the upper side in the drawing is shorter than the wiring width of a reverse phase wiring 152-1-2 that is on the lower side in the drawing. This similarly applies also to the other differential wiring sets 154.

The number of layers of the wiring is arbitrary, and the method (whether or not the wiring width of a certain layer is longer than the wiring width of another layer) of changing the widths of the wirings is arbitrary. The wiring widths of at least some of the layers may be different from the wiring widths of the other layers. In addition, such a configuration may be formed only in some of the differential wiring sets 154.

In addition, in a case where normal phase wirings 151 or reverse phase wirings 152 are formed in a plurality of layers, the thicknesses of such wirings may be configured to be different between the layers. For example, as in A of FIG. 24, a wiring of a layer disposed on the upper side in the drawing may be configured to be thicker than a wiring of a layer disposed on the lower side in the drawing.

Figure 24:
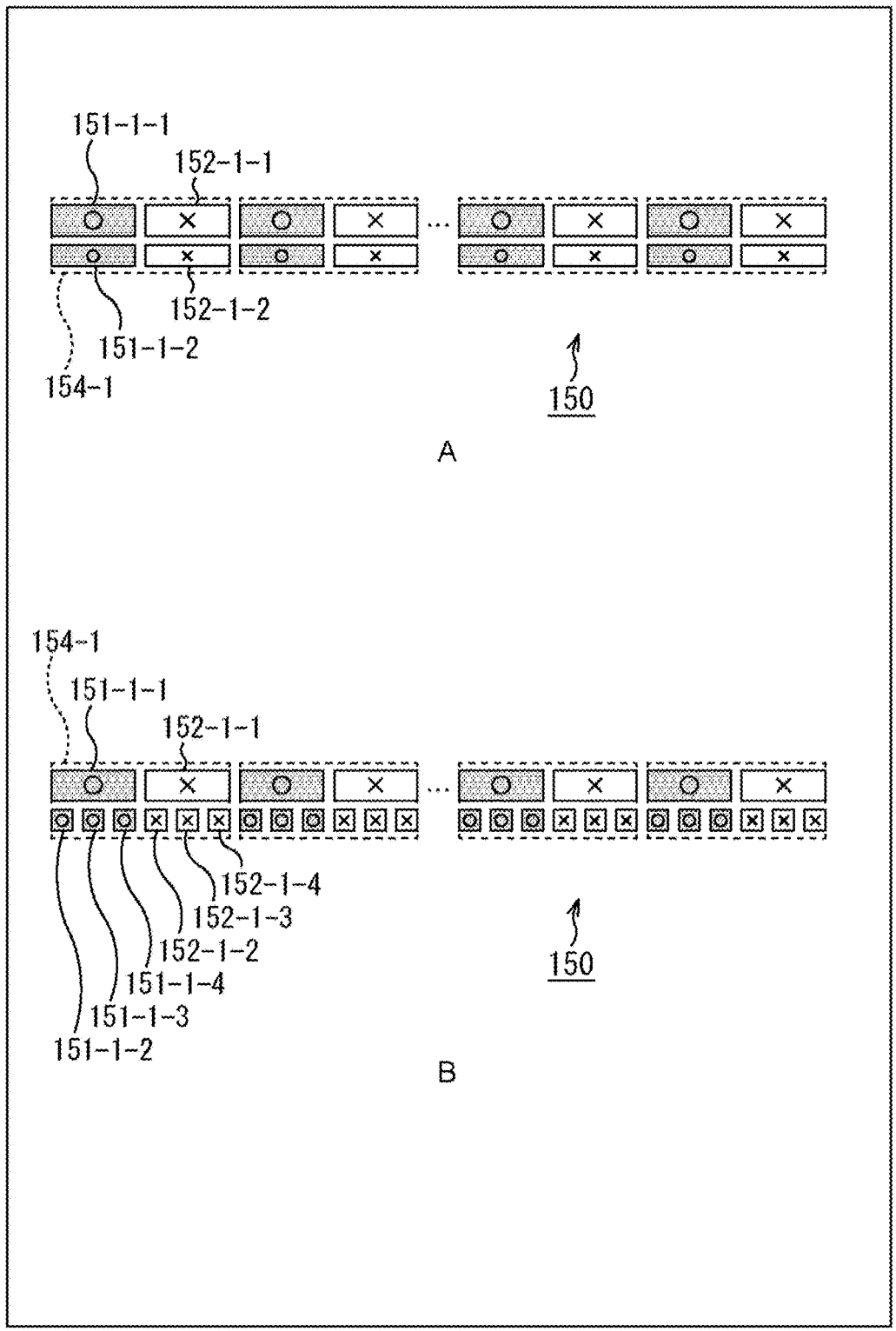
FIG. 24 is a diagram that illustrates an example of the configuration of a conductor group.

In the case of A of FIG. 24, for example, in a differential wiring set 154-1, a normal phase wiring 151-1-1 and a reverse phase wiring 152-1-1 of a layer disposed on the upper side in the drawing are configured to be thicker than a normal phase wiring 151-1-2 and a reverse phase wiring 152-1-2 of a layer disposed on the lower side in the drawing. This similarly applies also to the other differential wiring sets 154.

The number of layers of the wirings is arbitrary, and the method (whether or not a wiring of a certain layer is thicker than a wiring of another layer) of changing the thicknesses of the wirings is arbitrary. The thicknesses of wirings of at least some of the layers may be different from the thicknesses of wirings of the other layers. In addition, such a configuration may be formed only in some of the differential wiring sets 154.

In addition, in a case where the normal phase wirings 151 and the reverse phase wirings 152 are formed in a plurality of layers, the numbers of the normal phase wirings 151 and the reverse phase wirings 152 of the layers may not be uniformized. In other words, for the normal phase wirings 151 or the reverse phase wirings 152 or both thereof, the number of wirings in at least some of the layers may be different from the number of wirings in any other layer. For example, as in B of FIG. 24, the number of the normal phase wirings 151 and the reverse phase wirings 152 may be larger in a layer disposed on the lower side in the drawing than in a layer disposed on the upper side in the drawing.

In the case of B of FIG. 24, for example, in a differential wiring set 154-1, a normal phase wiring 151-1-1 and a reverse phase wiring 152-1-1 are formed on a layer disposed on the upper side in the drawing, and a normal phase wiring 151-1-2 to a normal phase wiring 151-1-4 and a reverse phase wiring 152-1-2 to a reverse phase wiring 152-1-4 are formed in a layer disposed on the lower side in the drawing. This similarly applies also to the other differential wiring sets 154.

The number of wirings of each layer is arbitrary. It is apparent that the number of wirings may be larger in the layer disposed on the upper side in the drawing than in the layer disposed on the lower side in the drawing. In addition, the number of layers of the wirings is arbitrary as long as the number is two or more. Furthermore, such a configuration may be formed only in some of the differential wiring sets 154.

Furthermore, this similarly applies also to conductivity, electric resistance, series electric resistance for a wiring, joint impedance, series joint impedance for a wiring, and a gap between wirings. In other words, for normal phase wirings 151, reverse phase wirings 152, or both thereof, such a value (at least one value thereof) in at least some of the layers may be configured to be different from the value in any other layer.

As above, in a conductor set, between a conductor through which a current flows in the first direction and a conductor through which a current flows in the second direction, at least one of the width, the thickness, the length, the conductivity, the electric resistance, the series electric resistance, the joint impedance, the series joint impedance, the gap, the number, the position in the fourth direction vertical to the first direction and the third direction, and the number of layers in the fourth direction may be configured to be different from each other.

In addition, in a conductor set, each conductor may form a multi-layer structure in the fourth direction that is vertical to the first direction and the third direction. Then, in a conductor set, at least one of the width, the thickness, the length, the conductivity, the electric resistance, the series electric resistance, the joint impedance, the series joint impedance, the gap, the number, the direction of a current, and the position in the third direction of at least some layers of each conductor in the fourth direction may be configured to be different from that of any other layer. In addition, in the conductor set, at least some of the layers of each conductor in the fourth direction may form a short circuit with other layers.

In this way, the configuration of the differential wiring group 150 is arbitrary but is not limited to that of the example described above. The present technology can be applied to a differential wiring group 150 of various configurations.

<Control of Conductor Gap of Side End Portion>

In addition, the configuration example of the wiring of the side end portion is not limited to the example described above with reference to FIGS. 9 to 15.

Figure 25:
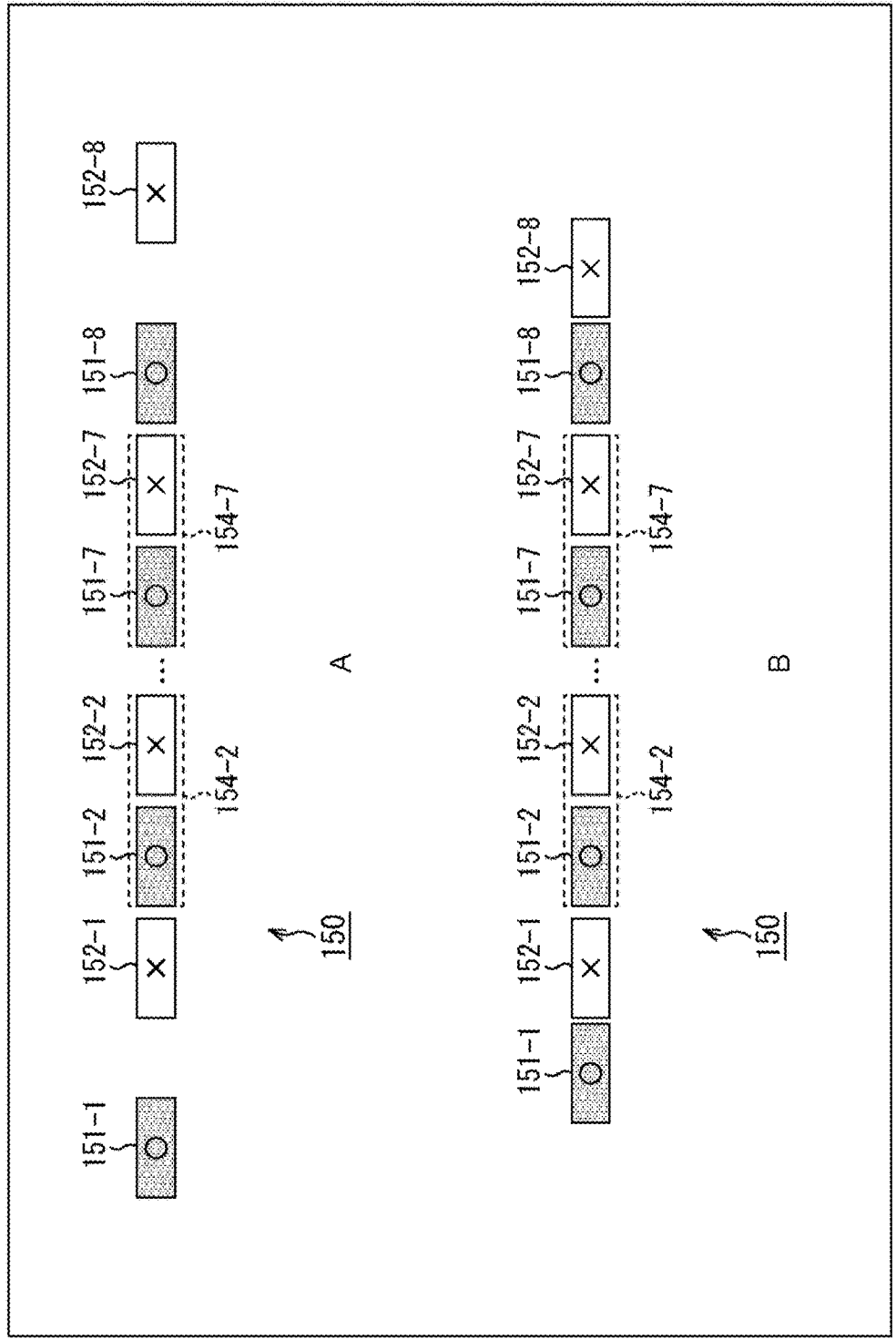
FIG. 25 is a diagram that illustrates an example of control of a gap of a conductor of a side end portion.

For example, as in FIG. 25, a gap between the conductor of the end portion and another conductor adjacent to the conductor of the end portion and a gap between the other conductors may be configured to be different from each other. In an example of A of FIG. 25, a gap between a normal phase wiring 151-1 that is the wiring of the side end portion and a reverse phase wiring 152-1 adjacent to the normal phase wiring 151-1 is arranged to be broader than an inter-wiring gap of the reverse phase wiring 152-1 to the normal phase wiring 151-8. Similarly, a gap between a reverse phase wiring 152-8 that is the wiring of the side end portion and a normal phase wiring 151-8 adjacent to the reverse phase wiring 152-8 is arranged to be broader than an inter-wiring gap of the reverse phase wiring 152-1 to the normal phase wiring 151-8. Only in any one end portion, the gap may be broadened.

In an example of B of FIG. 25, a gap between a normal phase wiring 151-1 that is the wiring of the side end portion and a reverse phase wiring 152-1 adjacent to the normal phase wiring 151-1 is arranged to be narrower than an inter-wiring gap of the reverse phase wiring 152-1 to the normal phase wiring 151-8. Similarly, a gap between a reverse phase wiring 152-8 that is the wiring of the side end portion and a normal phase wiring 151-8 adjacent to the reverse phase wiring 152-8 is arranged to be narrower than an inter-wiring gap of the reverse phase wiring 152-1 to the normal phase wiring 151-8. Only in any one end portion, the gap may be narrowed.

In addition, in order to suppress the magnetic field intensity of a further outer side than the wiring of the side end portion, the degree of broadening or narrowing of a gap between the wiring of the end portion and another wiring adjacent to the wiring of the end portion with respect to the gap between other wirings depends on the amount of current flowing through each wiring. In other words, by appropriately setting a gap between the wiring of the end portion and another wiring adjacent to the wiring of the end portion and configuring the gap between the wiring of the end portion and the another wiring adjacent to the wiring of the end portion and gaps between the other wirings to be different from each other, the magnetic field intensity of a further outer side than the side end portion wiring of the differential wiring group 150 is suppressed to be lower than that of a case where the normal phase wiring 151-1 to the reverse phase wiring 152-8 are arranged at equal intervals. Accordingly, an induced electromotive force of this side end portion can be suppressed to be low. In other words, the generation of a noise in a conductor loop can be suppressed.

<Control of Conductor Thickness of Side End Portion>

Figure 26:
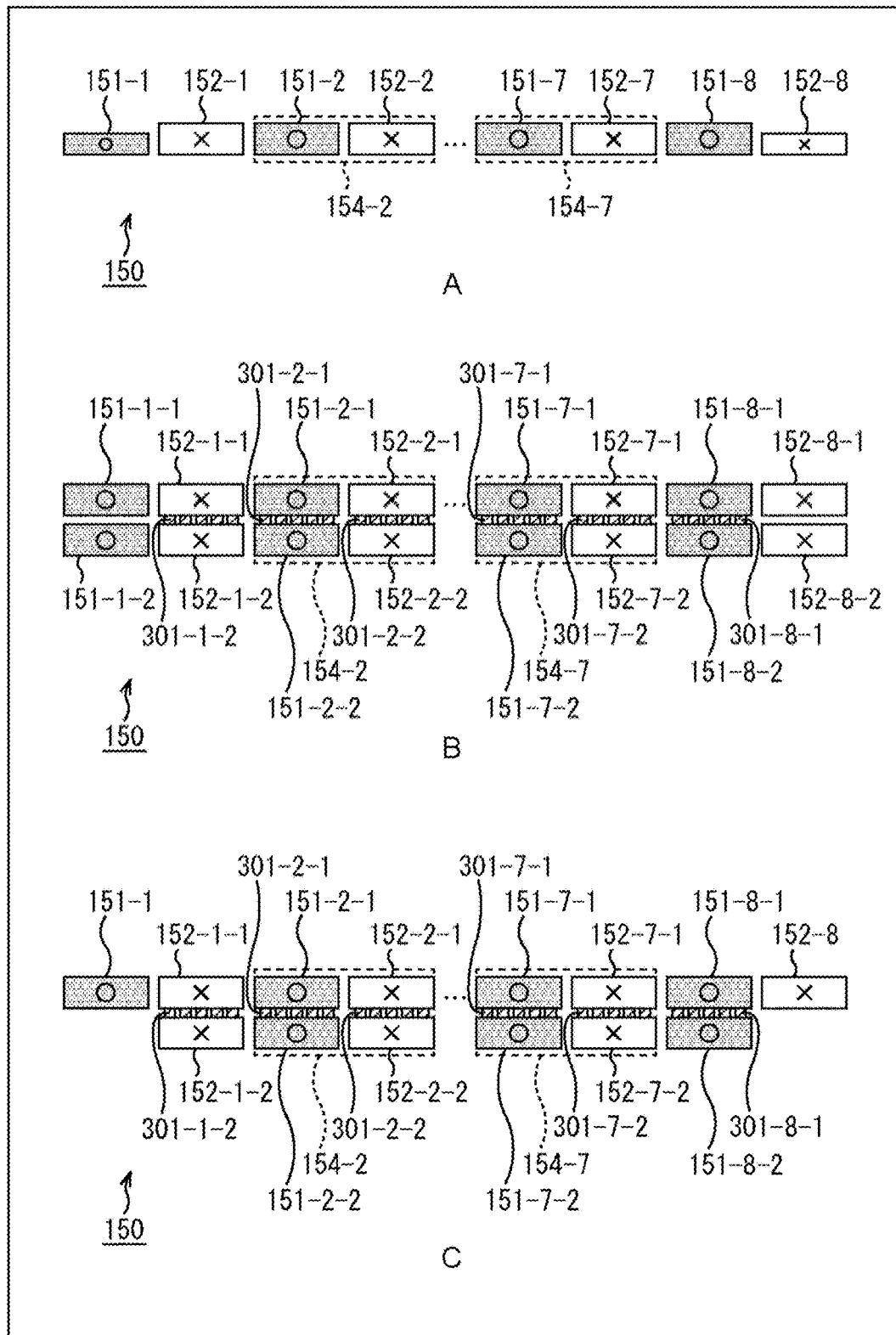
FIG. 26 is a diagram that illustrates an example of control of the thickness of a conductor of a side end portion.

In addition, for example, as in the case of FIG. 26, the thickness of the conductor of the end portion may be configured to be smaller than the thickness of any other conductor. In the case of an example of A of FIG. 26, a normal phase wiring 151 and a reverse phase wiring 152-8 that are wirings of side end portions are formed to be thinner than a reverse phase wiring 152-1 to a normal phase wiring 151-8 that are the other wirings. Only any one of the normal phase wiring 151-1 to the reverse phase wiring 152-8 may be formed to have a thickness smaller than that of the other wirings.

In the case of an example of B of FIG. 26, each wiring is formed in two layers, and, in each of a reverse phase wiring 152-1 to a normal phase wiring 151-8, a layer disposed on the upper side in the drawing and a layer disposed on the lower side in the drawing form a short circuit through a conductor 301. For example, a reverse phase wiring 152-1-1 and a reverse phase wiring 152-1-2 forma short circuit through a conductor 301-1-2. In a differential wiring set 154-2, a normal phase wiring 151-2-1 and a normal phase wiring 151-2-2 form a short circuit through a conductor 301-2-1, and a reverse phase wiring 152-2-1 and a reverse phase wiring 152-2-2 form a short circuit through a conductor 301-2-2. A differential wiring set 154-3 to a differential wiring set 154-7 are configure in this way as well. In the differential wiring set 154-7, a normal phase wiring 151-7-1 and a normal phase wiring 151-7-2 form a short circuit through a conductor 301-7-1, and a reverse phase wiring 152-7-1 and a reverse phase wiring 152-7-2 forma short circuit through a conductor 301-7-2. In addition, a normal phase wiring 151-8-1 and a normal phase wiring 151-8-2 form a short circuit through a conductor 301-8-1.

However, a normal phase wiring 151-1-1 and a normal phase wiring 151-1-2 that are wirings of the side end portions do not form a short circuit. In addition, a reverse phase wiring 152-8-1 and a reverse phase wiring 152-8-2 that are wirings of the side end portions do not form a short circuit. In other words, formation of an inter-layer short circuit is omitted only in the wirings of the side end portions. Accordingly, substantially, the thickness of the wiring of the side end portion is formed to be thinner than the other wirings. In addition, formation of an interlayer short circuit may be omitted only in one wiring of the side end portion. Here, the number of layers of the wirings is arbitrary.

In the case of an example of C of FIG. 26, each wiring is formed in two layers, and, in each of a reverse phase wiring 152-1 to a normal phase wiring 151-8, similar to the case of B of FIG. 26, a layer disposed on the upper side in the drawing and a layer of the lower side in the drawing form a short circuit through a conductor.

However, each of a normal phase wiring 151-1 and a reverse phase wiring 152-8 that are wirings of the side end portions are formed in a single layer. Accordingly, substantially, the thicknesses of the side end portions are formed to be thinner than the other wirings. In addition, only the wiring of only one side end portion may be formed in a single layer. Here, the number of layers of the wirings is arbitrary. The number of layers of each of the wiring of the side end portion may be smaller than the number of layers of the other wirings.

By configuring as such and configuring the thickness of the wiring of each side end portion to be thinner than that of the other wirings, the magnetic field intensity of a further outer side than the wiring of the side end portion of the differential wiring group 150 is suppressed to be lower than that of a case where the thicknesses of all the wirings are the same. Accordingly, the induced electromotive force of this side end portion can be suppressed to be low. In other words, the generation of a noise in a conductor loop can be suppressed.

Note that, as described above when the wiring width is described with reference to FIGS. 12 and 13, particularly, by configuring the thickness of the wiring of the side end portion to be about ½ of the thickness of the other wirings, an induced electromotive force of each side end portion can be further suppressed. In other words, the generation of a noise in a conductor loop can be further suppressed.

<Control of Height Position of Conductor in Side End Portion>

Figure 27:
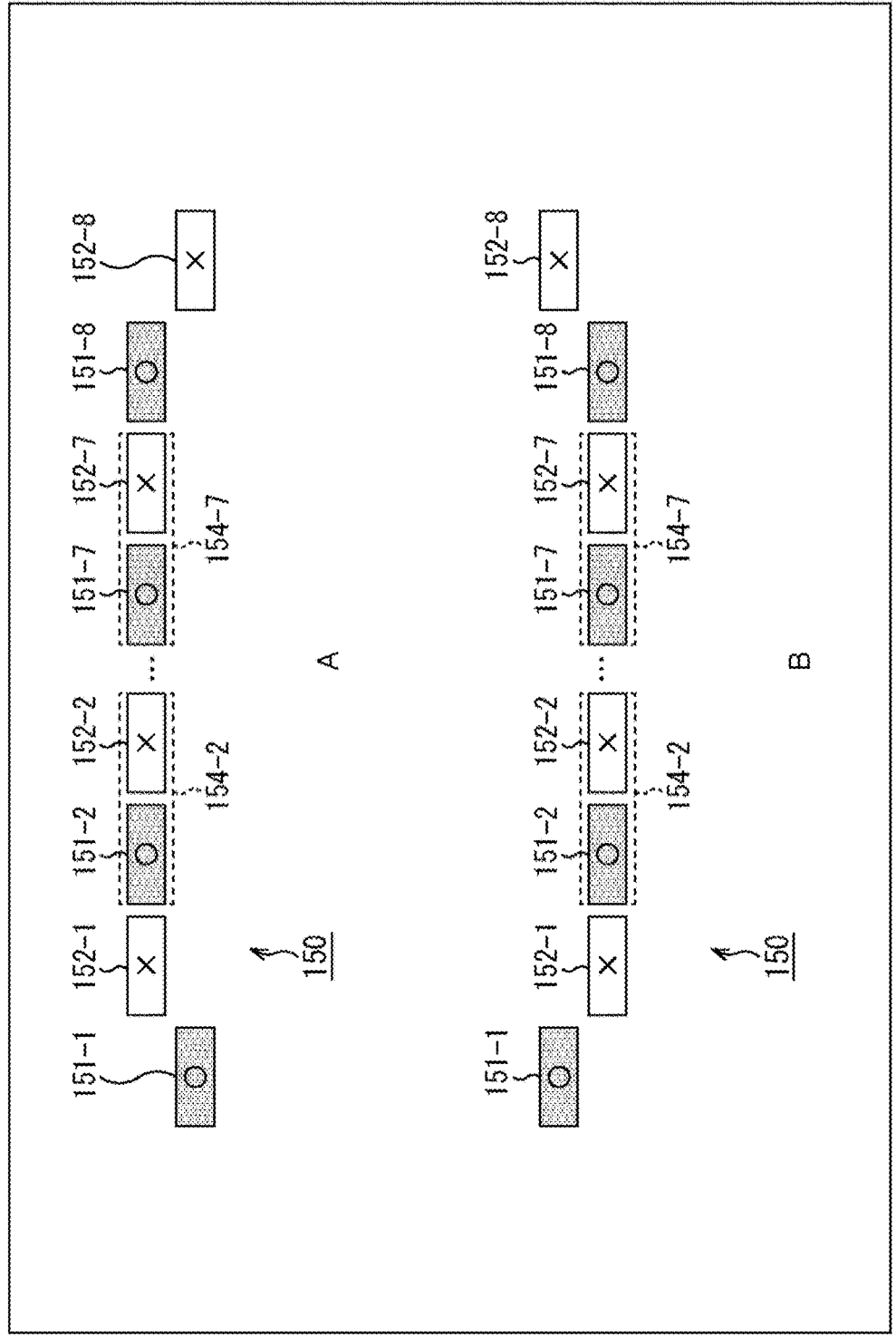
FIG. 27 is a diagram that illustrates an example of control of the height position of a conductor of a side end portion.

Furthermore, for example, as in FIG. 27, the position of the conductor of the end portion in the fourth direction (height direction) vertical to the first direction and the third direction may be configured to be different from the position of another conductor in the fourth direction. In the case of an example of A of FIG. 27, a normal phase wiring 151-1 and a reverse phase wiring 152-8 that are wirings of the side end portions are arranged on a further lower side in the drawing than a reverse phase wiring 152-1 and a normal phase wiring 151-8 that are the other wirings.

By configuring as such, as a distance between the wiring of the side end portion and a conductor loop becomes longer, a magnetic field caused by the wiring of the side end portion becomes weaker at the position of a conductor loop, and accordingly, a magnetic field intensity of a further outer side than the wiring of the side end portion of the differential wiring group 150 is suppressed to be lower than that of a case where the positions of all the wirings in the fourth direction are the same. Accordingly, the induced electromotive force of this side end portion can be suppressed to be low. In other words, the generation of a noise in the conductor loop can be suppressed. In addition, in a case where the conductor loop is presented on the lower side of the wiring, as in an example of B of FIG. 27, the normal phase wiring 151-1 and the reverse phase wiring 152-8 that are wirings of the side end portions may be arranged on a further upper side in the drawing than the reverse phase wiring 152-1 to the normal phase wiring 151-8 that are the other wirings.

<Example of Another Configuration of Wiring of Side End Portion>

Figure 28:
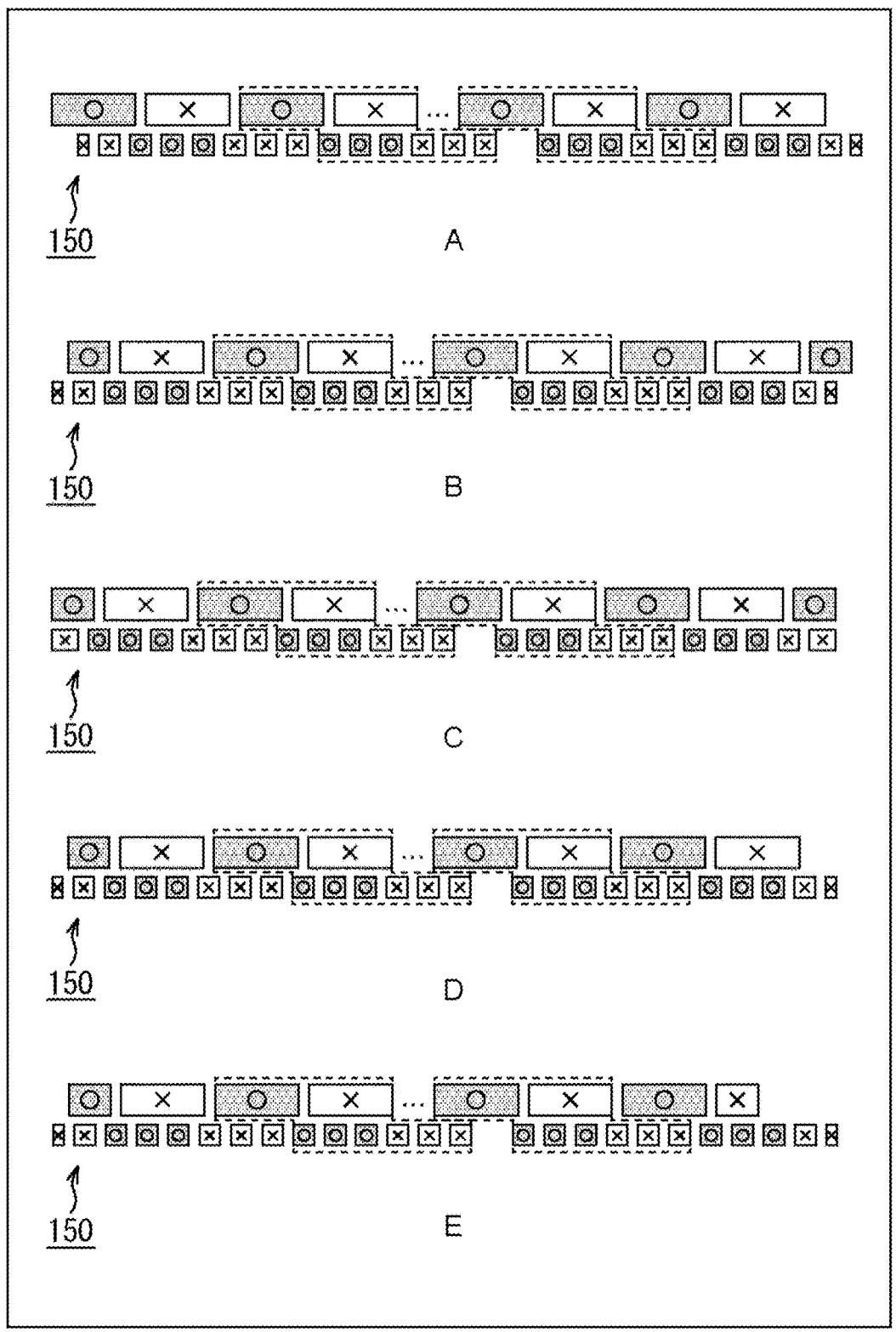
FIG. 28 is a diagram that illustrates an example of the configuration of a side end portion.

Note that, in a case where a normal phase wiring 151 and a reverse phase wiring 152 of the conductor group are formed as a plurality of layers, a positional relation between layers of the wirings of the side end portions is arbitrary. For example, as in A of FIG. 28 and E of FIG. 28, the positions of wirings of side end portions, which are disposed on the left and right sides in the drawing, of a layer of the upper side in the drawing and the positions of wirings of side end portions, which are disposed on the left and right sides in the drawing, of a layer disposed on the lower side in the drawing may be aligned together or be different from each other.

<Control of Electric Resistance of Side End Portion>

Furthermore, the electric resistance of the wirings of the side end portions may be configured to be higher than the electric resistance of the other wirings. For example, the electric resistance of the wirings of the side end portions may be configured to be about twice the electric resistance of the other wirings.

Figure 29:
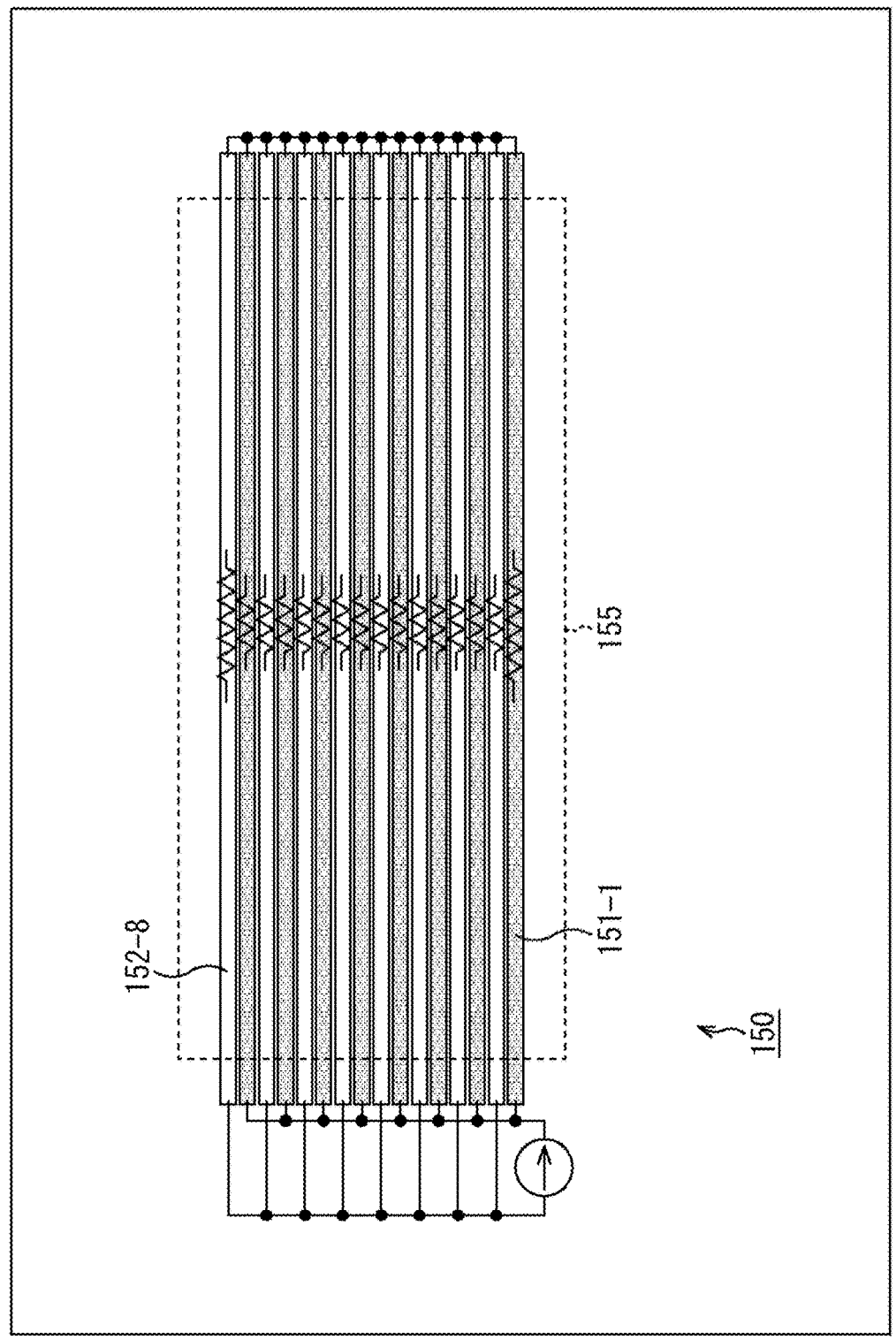
FIG. 29 is a diagram that illustrates an example of control of electric resistance of a conductor of a side end portion.

For example, when the differential wiring group 150 has a configuration of the inside of a dotted-line range 155 of the circuit having a configuration as illustrated in FIG. 29, in a case where a frequency component configuring a wiring current that is a current flowing through each wiring of the differential wiring group 150 is a low frequency component (in the case of a wiring current of a low frequency), each wiring (in other words, each wiring of the differential wiring group 150) of the inside of the dotted-line range 155 has electric resistance. When the electric resistance of a wiring (conductor) is R, the electric resistivity of the wiring (conductor) is ρ, the electrical conductivity (conductivity) of the wiring (conductor) is σ, the length of the wiring (conductor) is l, and the cross-sectional area of the wiring (conductor) is A, the electric resistance R of the wiring (conductor), for example, can be represented as in the following Equation (6).

[Mathematical Formula 4]

$$R = \rho \frac{l}{A} = \frac{l}{\sigma A} \quad (6)$$

In other words, in a case where a frequency component configuring a wiring current is a low frequency component (in the case of a wiring current of a low frequency), by configuring the electric resistance R of the wirings (in an example illustrated in FIG. 29, a normal phase wiring 151-1 and a reverse phase wiring 152-8) of side end portions to be higher than the electric resistance R of the other wirings, the amounts of currents flowing through the wirings of the side end portions can be configured to be lower than the amounts of currents flowing through the other wirings. In other words, as described with reference to FIG. 11, the magnetic field intensities of the side end portions can be suppressed to be low, and induced electromotive forces of the side end portions can be suppressed to be low. In other words, the generation of a noise in a conductor loop can be suppressed.

In addition, as described with reference to FIG. 11, particularly, by configuring the amounts of the currents flowing through the wirings of the side end portions to be about ½ of the amounts of currents flowing through the other wirings, induced electromotive forces of the side end portions can be further suppressed. In other words, particularly, by configuring the electric resistance R of the wirings of the side end portions to be about twice the electric resistance R of the other wirings, the induced electromotive forces of the side end portions can be further suppressed. In other words, the generation of a noise in the conductor loop can be further suppressed.

Note that the method of configuring the electric resistance R of the wirings of the side end portions to be higher than the electric resistance R of the other wirings as described above is arbitrary. For example, the electric resistivity ρ of each of the wirings of the side end portions may be configured to be higher than the electric resistivity ρ of the other wirings on the basis of Equation (6). In addition, for example, the electric conductivity (conductivity) σ of each of the wirings of the side end portions may be configured to be lower than the electric conductivity (conductivity) σ of the other wirings. Furthermore, for example, the length l of each of the wirings of the side end portions may be configured to be longer than the length l of the other wirings. In addition, for example, the cross-sectional area A of each of the wirings of the side end portions may be configured to be narrower than the cross-sectional area A of the other wirings. Furthermore, for example, in order to configure the electric resistance R of each of the wirings of the side end portions to be twice the electric resistance R of the other wirings, the electric resistivity ρ of each of the wirings of the side end portions may be configured to be twice the electric resistivity ρ of the other wirings, the electric conductivity (conductivity) σ of each of the wirings of the side end portions may be configured to be ½ of the electric conductivity (conductivity) σ of the other wirings, the length l of each of the wirings of the side end portions may be configured to be twice the length l of the other wirings, or the cross-sectional area A of each of the wirings of the side end portions may be ½ of the cross-sectional area A of the other wirings.

<Control of Joint Impedance of Side End Portion>

Furthermore, the joint impedance of each of the wirings of the side end portions may be configured to be higher than the joint impedance of each of the other wirings. For example, the joint impedance of each of the wirings of the side end portions may be configured to be about twice the joint impedance of each of the other wirings.

For example, in a case where the frequency component configuring a wiring current is a high frequency component (in the case of a wiring current of a high frequency), each wiring (in other words, each wiring of the differential wiring group 150) of the inside of the dotted-line range 155 illustrated in FIG. 29 has joint impedance. When the joint impedance of a wiring (conductor) is Z, the electric resistance of the wiring (conductor) is R, the inductance of the wiring (conductor) is L, the capacitance of the wiring (conductor) is C, and each AC frequency of a wiring current is co, the joint impedance Z of the wiring (conductor), for example, can be represented as in the following Equation (7).

[Mathematical Formula 5]

$$Z = R + j\omega L + \frac{1}{j\omega C} \quad (7)$$

In other words, in a case where the frequency component configuring a wiring current is a high frequency component (in the case of a wiring current of a high frequency), by configuring the joint impedance Z of each of the wirings (in the case of an example illustrated in FIG. 29, a normal phase wiring 151-1 and a reverse phase wiring 152-8) of the side end portions to be higher than the joint impedance Z of each of the other wirings, the amount of a current flowing through each of the wirings of the side end portions can be configured to be lower than the amount of a current flowing through each of the other wirings. In other words, as described with reference to FIG. 11, the magnetic field intensities of the side end portions can be suppressed to be low, and the induced electromotive forces of the side end portions can be suppressed. In other words, the generation of a noise in a conductor loop can be suppressed.

Particularly, by configuring the joint impedance Z of each of the wirings of the side end portions to be about twice the joint impedance Z of each of the other wirings, the amount of a current flowing through each of the wirings of the side end portions can be configured to be about ½ of the amount of a current flowing through each of the other wirings, and the induced electromotive forces of the side end portions can be further suppressed to be low. In other words, the generation of a noise in a conductor loop can be suppressed.

Note that the method of configuring the joint impedance Z of each of the wirings of the side end portions to be higher than the joint impedance Z of each of the other wirings as described above is arbitrary. For example, on the basis of Equation (7), the electric resistance R of each of the wirings of the side end portions may be configured to be higher than the electric resistance R of each of the other wirings. In addition, for example, the inductance L of each of the wirings of the side end portions may be configured to be higher than the inductance L of each of the other wirings. Furthermore, for example, the capacitance C of each of the wirings of the side end portions may be configured to have such a value that "ωL−1/ωC" is larger than that of the case of the capacitance C of each of the other wirings.

<Control of Series Electric Resistance for Wiring of Side End Portion>

Furthermore, the series electric resistance (electric resistance of wirings, devices, and the like connected in series to the wiring of the side end portion outside the dotted-line range 155) for each of the wirings of the side end portions may be configured to be higher than the series resistance for each of the other wirings. For example, the series electric resistance for each of the wirings of the side end portions may be configured to be about twice the series electric resistance for each of the other wirings.

Figure 30:
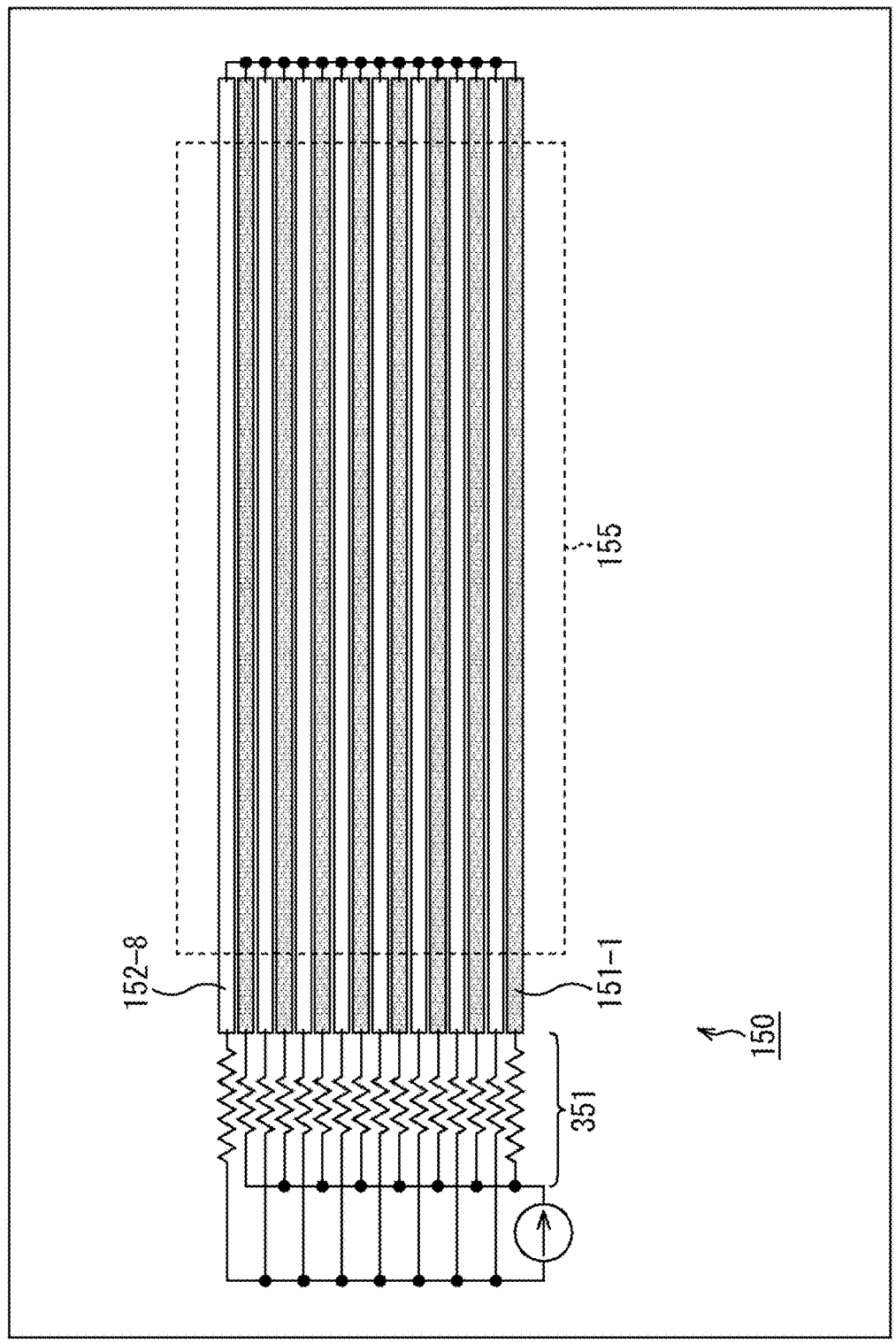
FIG. 30 is a diagram that illustrates an example of control of series electric resistance of a side end portion.

For example, when the differential wiring group 150 has a configuration illustrated inside the dotted-line range 155 of the circuit having the configuration as illustrated in FIG. 30, in a case where a wiring current that is a current flowing through each wiring of the differential wiring group 150 is a low frequency component (in the case of a wiring current of a low frequency), wirings, devices, and the like, which are disposed outside the dotted-line range 155, connected in series to each wiring (in other words, each wiring of the differential wiring group 150) disposed inside the dotted-line range 155 has electric resistance (series electric resistance for the wiring). A resistor 351 illustrated in FIG. 30 illustrates series electric resistance for this wiring as a component. In other words, the resistor 351 is connected in series to each wiring of the differential wiring group 150 outside the dotted-line range 155.

In a case where the resistance value (in other words, series electric resistance for the wiring) of the resistor 351 is significantly high, and the electric resistance of each wiring of the differential wiring group 150 is low to be ignorable with respect to the resistance value of the resistor 351, by configuring the series electric resistance for each of the wrings of the side end portions to be higher than the series electric resistance for the other wirings, the amount a current flowing through each of the wirings of the side end portion can be lower than the amount of a current flowing through each of the other wirings. In other words, as described with reference to FIG. 11, the magnetic field intensities of the side end portions can be suppressed to be low, and the induced electromotive forces of the side end portions can be suppressed to be low. In other words, the generation of a noise in a conductor loop can be suppressed.

Particularly, by configuring the series electric resistance for each of the wirings of the side end portions to be about twice the series electric resistance for each of the other wirings, the amount of a current flowing through each of the wirings of the side end portions can be configured to be about ½ of the amount of a current flowing through each of the other wirings, and accordingly, the induced electromotive forces of the side end portions can be further suppressed to be low. In other words, the generation of a noise in a conductor loop can be further suppressed.

Note that the method of configuring the series electric resistance for each of the wirings of the side end portions to be higher than the series electric resistance for each of the other wirings is arbitrary. For example, the electric resistivity ρ of the resistor 351 for each of the wirings of the side end portions may be configured to be higher than the electric resistivity ρ of the resistor 351 for the other wirings. In addition, for example, the electric conductivity (conductivity) σ of the resistor 351 for each of the wirings of the side end portions may be configured to be lower than the electric conductivity (conductivity) σ of the resistor 351 for the other wirings. Furthermore, for example, the length l of the resistor 351 for the wirings of the side end portions may be configured to be longer than the length l of the resistor 351 for the other wirings. In addition, for example, the cross-sectional area A of the resistor 351 for each of the wirings of the side end portions may be configured to be narrower than the cross-sectional area A of the resistor 351 for the other wirings. Furthermore, for example, in order to configure the series electric resistance R for each of the wirings of the side end portions to be twice the series electric resistance R for the other wirings, the electric resistivity ρ of the resistor 351 for each of the wirings of the side end portions may be configured to be twice the electric resistivity ρ of the resistor 351 for the other wirings, the electric conductivity (conductivity) σ of the resistor 351 for each of the wirings of the side end portions may be configured to be ½ of the electric conductivity (conductivity) σ of the resistor 351 for the other wirings, the length l of the resistor 351 for each of the wirings of the side end portions may be configured to be twice the length l of the resistor 351 for the other wirings, or the cross-sectional area A of the resistor 351 for each of the wirings of the side end portions may be configured to be ½ of the cross-sectional area A of the resistor 351 for the other wirings.

In addition, in a case where not only the series electric resistance for the wirings of the differential wiring group 150 but also the electric resistance of the wiring is not ignorable, a sum thereof may be controlled similar to the case of the control of the wirings for the electric resistance and the case of the control of the wirings for the series electric resistance.

<Control of Series Joint Impedance for Wiring of Side End Portion>

Furthermore, the series joint impedance (joint impedance of a wiring, a device, and the like connected in series to the wiring of the side end portion outside the dotted-line range 155) for each of the wirings of the side end portions may be configured to be higher than the series joint impedance for the other wirings. For example, the series joint impedance for each of the wirings of the side end portions may be configured to be about twice the series joint impedance for the other wirings.

For example, when the differential wiring group 150 has a configuration of the inside of the dotted-line range 155 of the circuit having a configuration as illustrated in FIG. 30, in a case where a frequency component configuring a wiring current that is a current flowing through each wiring of the differential wiring group 150 is a high frequency component (in the case of a wiring current of a high frequency), a wiring, a device, and the like, which are disposed outside the dotted-line range 155, connected in series to each wiring (in other words, each wiring of the differential wiring group 150) inside the dotted-line range 155 has joint impedance (series joint impedance for the wiring). The resistor 351 illustrated in FIG. 30 can be regarded as illustrating of series joint impedance for the wiring as a component. In other words, the resistor 351 is connected in series to each wiring of the differential wiring group 150 outside the dotted-line range 155.

In a case where the joint impedance (in other words, series joint impedance for the wiring) of the resistor 351 is significantly high, and the joint impedance of each wiring of the differential wiring group 150 is low to be ignorable with respect to the joint impedance of the resistor 351, by configuring the series joint impedance for each of the wrings of the side end portions to be higher than the series joint impedance for the other wirings, the amount a current flowing through each of the wirings of the side end portion can be lower than the amount of a current flowing through each of the other wirings. In other words, as described with reference to FIG. 11, the magnetic field intensities of the side end portions can be suppressed to be low, and the induced electromotive forces of the side end portions can be suppressed to be low. In other words, the generation of a noise in a conductor loop can be suppressed.

Particularly, by configuring the series joint impedance for each of the wirings of the side end portions to be about twice the series joint impedance for the other wirings, the amount of a current flowing through each of the wirings of the side end portions can be about ½ of the amount of a current flowing through the other wirings, the induced electromotive forces of the side end portions can be further suppressed to be low. In other words, the generation of a noise in the conductor loop can be further suppressed.

Note that the method of configuring the series joint impedance for each of the wirings of the side end portions to be higher than the series joint impedance of the other wirings is arbitrary. For example, the electric resistance R of the resistor 351 for each of the wirings of the side end portions may be configured to be higher than the electric resistance R of the resistor 351 for the other wirings. In addition, for example, the inductance L of the resistor 351 for each of the wirings of the side end portions may be configured to be higher than the inductance L of the resistor 351 for each of the other wirings. Furthermore, for example, the capacitance C of the resistor 351 for each of the wirings of the side end portions may be configured to have such a value that "$\omega L - 1/\omega C$" is larger than that of the case of the capacitance C of the resistor 351 for each of the other wirings. In other words, for example, in order to configure the series joint impedance for each of the wirings of the side end portions to be twice the series joint impedance for the other wirings, the electric resistance R of the resistor 351 for each of the wirings of the side end portions may be configured to be twice the electric resistance R of the resistor 351 for the other wirings, or the inductance L of the resistor 351 for each of the wings of the side end portions may be configured to be twice the inductance L of the resistor 351 for the other wirings. In addition, the capacitance C of the resistor 351 for each of the wirings of the side end may be configured to have such a value that "$\omega L - 1/\omega C$" is twice that of the case of the capacitance C of the resistor 351 for the other wirings.

In addition, in a case where not only the series joint impedance of the differential wiring group 150 for the wiring but also the joint impedance of the wiring is not ignorable, a sum thereof may be controlled similar to the case of the control of the wirings for the joint impedance and the case of the control of the wirings for the series joint impedance.

<Control of Material of Wiring of Side End Portion>

In order to control each parameter described above for controlling the amounts of currents, as the material of the wirings of the side end portions, a material different from the material of the other wirings may be used.

<Control of Amount of Current of Additional Conductor of Side End Portion>

Note that, while an example has been described with reference to FIG. 14 in which the additional wiring 201 through which a current flows in a direction opposite to that of the current flowing through the wirings of the side end portions is disposed near the wirings of the side end portions, control similar to the control for the wirings of the side end portions described above may be performed also for the additional wiring 201.

As described with reference to FIGS. 14 and 15, the magnetic field generated according to currents flowing through the wirings of the side end portions may be suppressed by a magnetic field generated according to a current flowing through the additional wiring 201. In other words, through the additional wiring 201, a current of a current amount smaller than the current amount of the wirings of the side end portions may flow in a direction in which the magnetic field generated according to the current suppresses the magnetic field generated according to the current flowing through the wirings of the side end portions. Particularly, by configuring the amount of the current flowing through the additional wiring 201 to be about ½ of the amount of the current flowing through the wirings of the side end portions, similar to the case of the control of the amount of the current flowing through the wirings of the side end portions described above, the induced electromotive forces of the side end portions can be further suppressed to be low. In other words, the generation of a noise in the conductor loop can be further suppressed.

<Control of Additional Conductor>

As the method of decreasing the amount of the current flowing through the additional wiring 201 more than the current flowing through the wirings of the side end portions, while an example in which the wiring width of the additional wiring is controlled has been described with reference to FIGS. 14 and 15, similar to the case of the wirings of the side end portions described above, the method is not limited to that of this example.

<Control of Cross-Sectional Area of Additional Conductor of Side End Portion>

For example, the cross-sectional area of a face of the conductor (additional wiring 201) through which a current flows in a direction opposite to that of the current flowing through the conductor (the wiring of the side end portion) of the end portion that is vertical to the first direction may be configured to be narrower than the cross-sectional area of a face of the wiring of the side end portion that is vertical to the first direction. By configuring as such, the induced electromotive forces of the side end portions can be suppressed to be low. In other words, the generation of a noise in the conductor loop can be suppressed. Particularly, by configuring the cross-sectional area of a face of the additional wiring 201 that is vertical to the first direction to be about ½ of the cross-sectional area of a face of the wiring of the side end portion that is vertical to the first direction, the induced electromotive forces of the side end portions can be further suppressed to be low. In other words, the generation of a noise in the conductor loop can be further suppressed.

In order to decrease the cross-sectional area of the face of the additional wiring 201 that is vertical to the first direction in this way, for example, similar to the example illustrated in FIG. 12, the width of the additional wiring 201 may be configured to be smaller than the width of the wiring of the side end portion. Particularly, the width of the additional wiring 201 may be configured to be about ½ of the width of the wiring of the side end portion such that the cross-sectional area of the face of the additional wiring 201 that is vertical to the first direction is about ½ of the cross-sectional area of the face of the wiring of the side end portion that is vertical to the first direction.

Similarly, the thickness of the additional wiring 201 may be configured to be controlled. For example, in order to decrease the cross-sectional area of the face of the additional wiring 201 that is vertical to the first direction, for example, similar to the example illustrated in FIG. 26, the thickness of the additional wiring 201 may be configured to be smaller than the thickness of the wiring of the side end portion. Particularly, the thickness of the additional wiring 201 may be configured to be about ½ of the thickness of the wiring of the side end portion such that the cross-sectional area of the face of the additional wiring 201 that is vertical to the first direction is about ½ of the cross-sectional area of the face of the wiring of the side end portion that is vertical to the first direction. In addition, the control of the thickness may be performed on the basis of the presence of a short circuit between layers of wirings formed in multiple layers and an increase/decrease in the number of layers.

<Control of Electric Resistance of Additional Conductor>

Furthermore, in a case where a frequency component configuring the wiring current is a low frequency component (in the case of a wiring current of a low frequency), the electric resistance of the additional wiring 201 may be controlled. For example, in order to decrease the amount of the current flowing through the additional wiring 201 more than the amount of the current flowing through the wiring of the side end portion, for example, similar to the example illustrated in FIG. 29, the electric resistance of the additional wiring 201 may be configured to be higher than the electric resistance of the wiring of the side end portion. Particularly, by configuring the electric resistance of the additional wiring 201 to be about twice the electric resistance of the wiring of the side end portion, the induced electromotive force of the side end portion can be further suppressed to be low. In other words, the generation of a noise in the conductor loop can be further suppressed.

<Control of Joint Impedance of Additional Conductor of Side End Portion>

Furthermore, in a case where a frequency component configuring the wiring current is a high frequency component (in the case of a wiring current of a high frequency), the joint impedance of the additional wiring 201 may be controlled. For example, in order to decrease the amount of the current flowing through the additional wiring 201 more than the amount of the current flowing through the wiring of the side end portion, for example, similar to the example illustrated in FIG. 29, the joint impedance of the additional wiring 201 may be configured to be higher than the joint impedance of the wiring of the side end portion. Particularly, by configuring the joint impedance of the additional wiring 201 to be about twice the joint impedance of the wiring of the side end portion, the induced electromotive forces of the side end portions can be further suppressed to be low. In other words, the generation of a noise in the conductor loop can be further suppressed.

<Control of Series Electric Resistance for Additional Conductor of Side End Portion>

Furthermore, in a case where a frequency component configuring the wiring current is a low frequency component (in the case of a wiring current of a low frequency), the series electric resistance for the additional wiring 201 may be controlled. For example, in order to decrease the amount of the current flowing through the additional wiring 201 more than the amount of the current flowing through the wiring of the side end portion, for example, similar to the example illustrated in FIG. 30, the series electric resistance for the additional wiring 201 may be configured to be higher than the series electric resistance for the wiring of the side end portion. Particularly, by configuring the series electric resistance for the additional wiring 201 to be about twice the series electric resistance for the wiring of the side end portion, the induced electromotive force of the side end portion can be further suppressed to be low. In other words, the generation of a noise in the conductor loop can be further suppressed.

Note that the method of configuring the series electric resistance for the additional wiring 201 to be higher than the series electric resistance for each of the wirings of the side end portions is arbitrary. For example, the electric resistivity ρ of the resistor 351 for the additional wiring 201 may be configured to be higher than the electric resistivity ρ of the resistor 351 for each of the wirings of the side end portions. In addition, for example, the electric conductivity (conductivity) σ of the resistor 351 for the additional wiring 201 may be configured to be lower than the electric conductivity (conductivity) σ of the resistor 351 for each of the wirings of the side end portions. Furthermore, for example, the length l of the resistor 351 for the additional wiring 201 may be configured to be longer than the length l of the resistor 351 for the wirings of the side end portions. In addition, for example, the cross-sectional area A of the resistor 351 for the additional wiring 201 may be configured to be narrower than the cross-sectional area A of the resistor 351 for each of the wirings of the side end portions. Furthermore, for example, in order to configure the series electric resistance R for the additional wiring 201 to be twice the series electric resistance R for each of the wirings of the side end portions, the electric resistivity ρ of the resistor 351 for the additional wiring 201 may be configured to be twice the electric resistivity ρ of the resistor 351 for each of the wirings of the side end portions, the electric conductivity (conductivity) σ of the resistor 351 for the additional wiring 201 may be configured to be ½ of the electric conductivity (conductivity) σ of the resistor 351 for each of the wirings of the side end portions, the length l of the resistor 351 for the additional wiring 201 may be configured to be twice the length l of the resistor 351 for each of the wirings of the side end portions, or the cross-sectional area A of the resistor 351 for the additional wiring 201 may be configured to be ½ of the cross-sectional area A of the resistor 351 for the wirings of the side end portions.

In addition, in a case where not only the series electric resistance for the additional wiring 201 but also the electric resistance of the additional wiring 201 is not ignorable, a sum thereof may be controlled similar to the case of the control of the additional wiring 201 for the electric resistance and the case of the control of the additional wiring 201 for the series electric resistance.

<Control of Series Joint Impedance of Side End Portion for Additional Conductor>

Furthermore, in a case where a frequency component configuring the wiring current is a high frequency component (in the case of a wiring current of a high frequency), the series joint impedance for the additional wiring 201 may be controlled. For example, in order to decrease the amount of the current flowing through the additional wiring 201 more than the amount of the current flowing through the wiring of the side end portion, for example, similar to the example illustrated in FIG. 30, the series joint impedance of the additional wiring 201 may be configured to be higher than the series joint impedance of the wiring of the side end portion. Particularly, by configuring the series joint impedance for the additional wiring 201 to be about twice the series joint impedance of the wiring of the side end portion, the induced electromotive forces of the side end portions can be further suppressed to be low. In other words, the generation of a noise in the conductor loop can be further suppressed.

Note that the method of configuring the series joint impedance for the additional wiring 201 to be higher than the series joint impedance for each of the wirings of the side end portions is arbitrary. For example, the electric resistance R of the resistor 351 for the additional wiring 201 may be configured to be higher than the electric resistance R of the resistor 351 for the other wirings. In addition, for example, the inductance L of the resistor 351 for the additional wiring 201 may be configured to be higher than the inductance L of the resistor 351 for each of the wirings of the side end portions. Furthermore, for example, the capacitance C of the resistor 351 for the additional wiring 201 may be configured to have such a value that "$\omega L - 1/\omega C$" is larger than that of the case of the capacitance C of the resistor 351 for each of the wirings of the side end portions. In addition, for example, in order to configure the series joint impedance for the additional wiring 201 to be twice the series joint impedance for each of the wirings of the side end portions, the electric resistance R of the resistor 351 for the additional wiring 201 may be configured to be twice the electric resistance R of the resistor 351 for each of the wirings of the side end portions, or the inductance L of the resistor 351 for the additional wiring 201 may be configured to be twice the inductance L of the resistor 351 for each of the wirings of the side end portions. In addition, the capacitance C of the resistor 351 for the additional wiring 201 may be configured to have such a value that "$\omega L - 1/\omega C$" is twice that of the case of the capacitance C of the resistor 351 for each of the wirings of the side end portions.

In addition, in a case where not only the series joint impedance for the additional wiring 201 but also the joint impedance of the additional wiring 201 is not ignorable, a sum thereof may be controlled similar to the case of the control of the additional wiring 201 for the joint impedance and the case of the control of the additional wiring 201 for the series joint impedance.

<Control of Material of Additional Wiring>

In order to control each parameter described above for controlling the amounts of currents, as the material of the additional wiring, a material different from the material of the wirings of the side end portions may be used.

<Other Control of Additional Conductor of Side End Portion>

In addition to the description presented above, for example, similar to the control described with reference to FIG. 27, the position of the additional wiring 201 in the fourth direction vertical to the first direction and the third direction may be controlled.

<Example of Application of Structure>

The conductor, which has been described as above, generating magnetic fluxes passing through the loop plane of a conductor loop may overlap or does not overlap the conductor loop. In addition, this conductor may be formed in a plurality of stacked chips or the same chip (for example, the pixel/analog processing unit 111) as that of the conductor loop.

Figure 31:
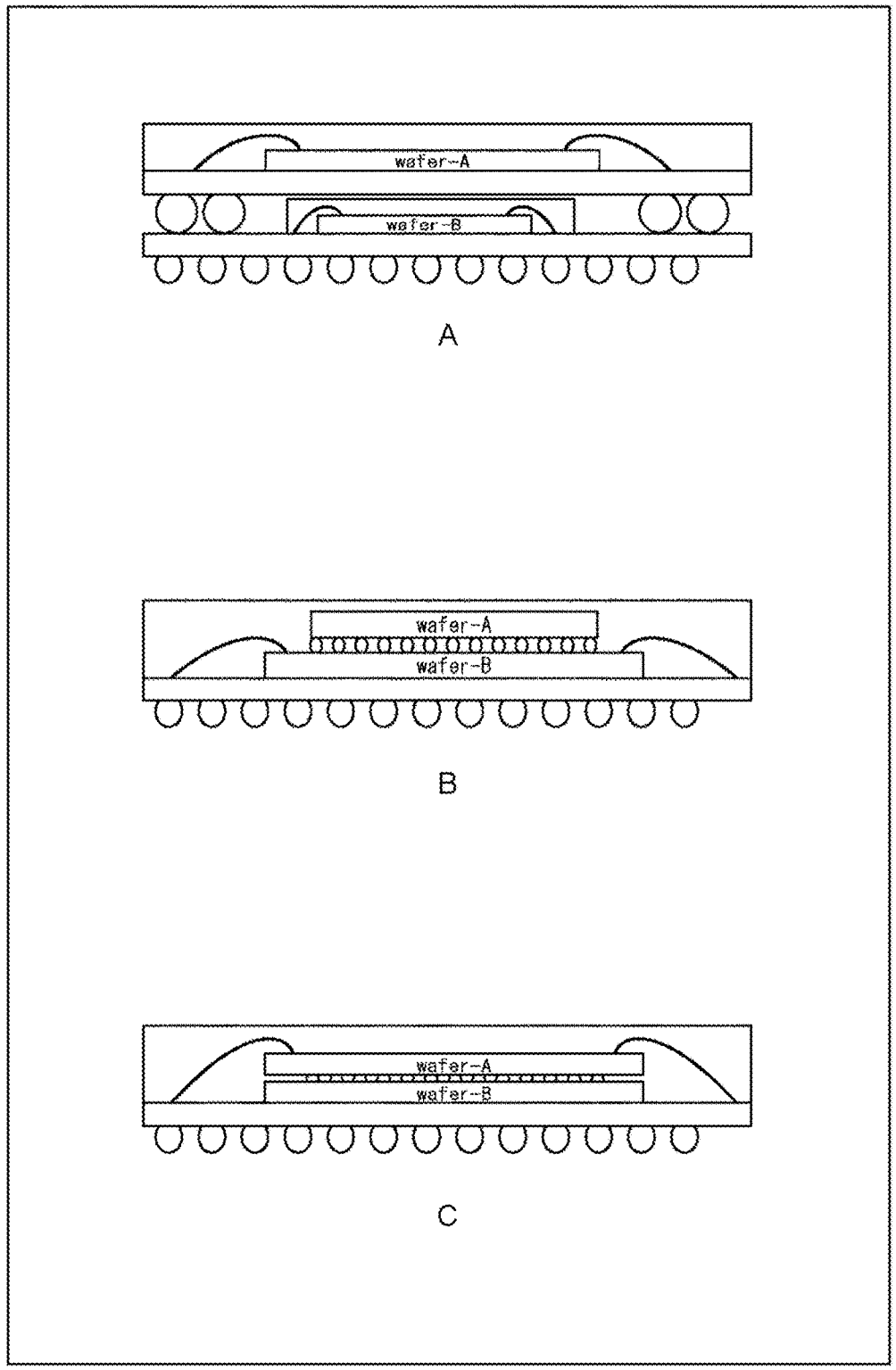
FIG. 31 is a diagram that illustrates an example of a stacking structure of a chip.

In addition, a plurality of chips of the image sensor 100 described with reference to FIG. 2 may overlap each other in some way. For example, as illustrated in A of FIG. 31, packages each sealed for each chip may overlap each other, or, similar to the examples of B of FIG. 31 or C of FIG. 31, a plurality of chips may be sealed to be packaged in a state in which the plurality of chips overlap each other. In addition, in such a case, for example, as illustrated in B of FIG. 31, a bonding wire for an external electrode may be connected to a chip of a lower layer, or, similar to the example illustrated in C of FIG. 31, a bonding wire for an external electrode may be connected to a chip of an upper layer.

In addition, as above, while the imaging device (image sensor 100) has been described as an example of a circuit board to which the present technology is applied, the present technology is not limited to this example. Thus, the present technology can be applied to a circuit board of an arbitrary device other than the imaging device.

In addition, as above, while the semiconductor substrate has been described as an example of a circuit board to which the present technology is applied, the present technology is not limited thereto. Thus, the present technology, for example, can be applied to a circuit board other than the semiconductor substrate such as a printed board.

2. Second Embodiment

<Imaging Apparatus>

Figure 32:
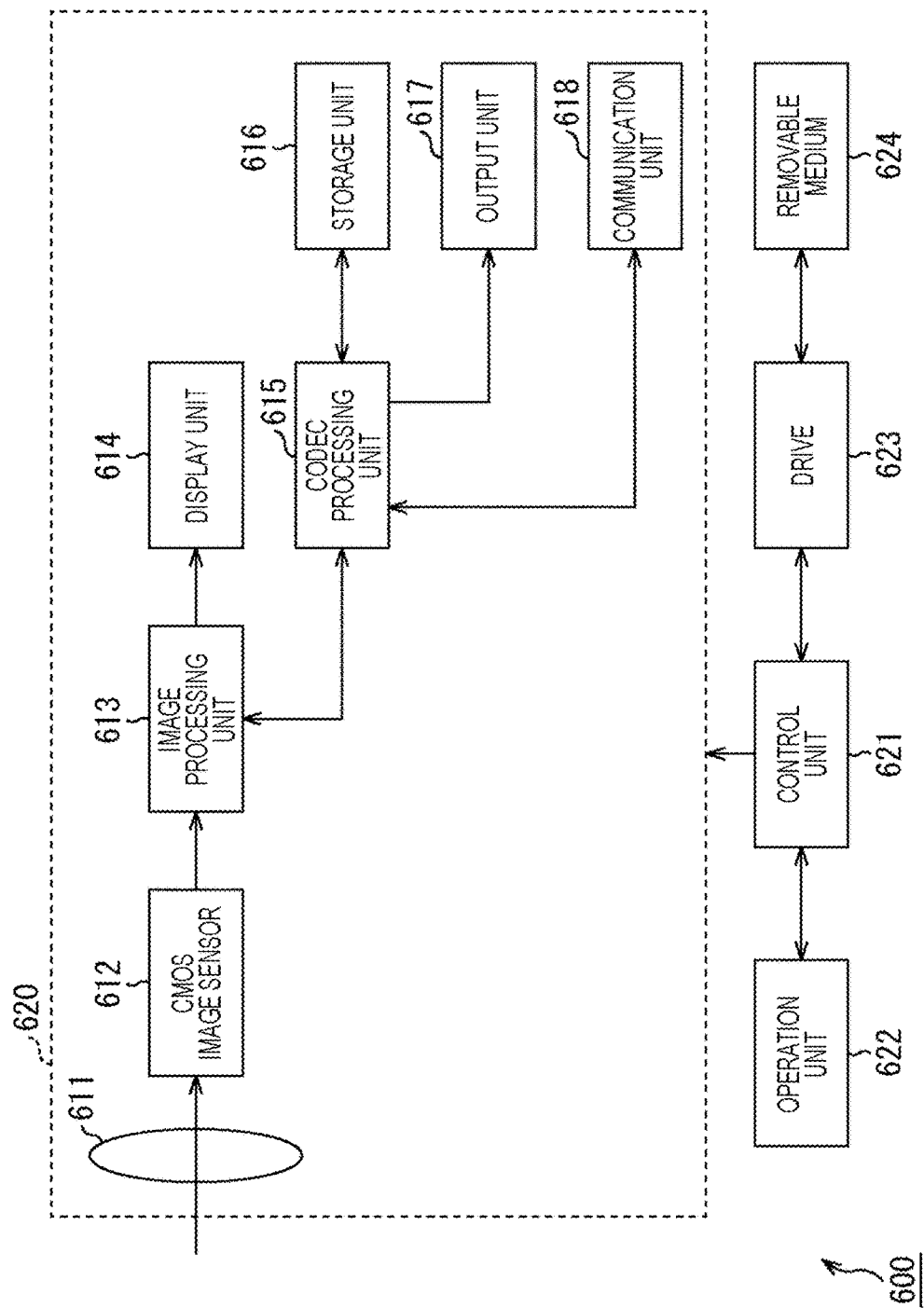
FIG. 32 is a diagram that illustrates an example of a main configuration of an imaging apparatus.

Note that the present technology can be applied to any device or apparatus other than the imaging device. For example, the present technology may be applied to an apparatus (an electronic apparatus or the like) including an imaging device such as an imaging apparatus. FIG. 32 is a block diagram that illustrates an example of a main configuration of an imaging apparatus as an example of an electronic apparatus to which the present technology is applied. The imaging apparatus 600 illustrated in FIG. 32 is an apparatus that images a subject and outputs the image of the subject as an electric signal.

As illustrated in FIG. 32, the imaging apparatus 600 includes an optical unit 611, a CMOS image sensor 612, an image processing unit 613, a display unit 614, a codec processing unit 615, a storage unit 616, an output unit 617, a communication unit 618, a control unit 621, an operation unit 622, and a drive 623.

The optical unit 611 is configured by a lens that adjusts a focal point up to a subject and collects light from an in-focus position, a diaphragm adjusting the exposure, a shutter controlling the timing for imaging, and the like. The optical unit 611 transmits light (incident light) from a subject and supplies the light to the CMOS image sensor 612.

The CMOS image sensor 612 performs A/D conversion of a signal (pixel signal) for each pixel by performing photoelectric conversion of incident light, performs signal processing such as CDS, and supplies captured image data after the processing to the image processing unit 613.

The image processing unit 613 performs image processing of the captured image data acquired by the CMOS image sensor 612. More specifically, the image processing unit 613, for example, performs various kinds of image processing such as a mixed color correction, a black level correction, white balance adjustment, de-mosaic processing, matrix processing, a gamma correction, and a YC conversion for the captured image data supplied from the CMOS image sensor 612. The image processing unit 613 supplies the captured image data for which the image processing has been performed to the display unit 614.

The display unit 614, for example, is configured by a liquid crystal display or the like and displays an image (for example, an image of a subject) of the captured image data supplied from the image processing unit 613.

In addition, the image processing unit 613 supplies the captured image data for which the image processing has been performed to the codec processing unit 615 as is necessary.

The codec processing unit 615 performs a coding process of a predetermined system for the captured image data supplied from the image processing unit 613 and supplies acquired coded data to the storage unit 616. In addition, the codec processing unit 615 reads coded data stored in the storage unit 616, generates decoded image data by decoding the read coded data, and supplies the decoded image data to the image processing unit 613.

The image processing unit 613 performs predetermined image processing for the decoded image data supplied from the codec processing unit 615. The image processing unit 613 supplies the decoded image data for which the image processing has been performed to the display unit 614. The display unit 614, for example, is configured by a liquid crystal display and the like and displays an image of the decoded image data supplied from the image processing unit 613.

In addition, the codec processing unit 615 may supply coded data acquired by coding captured image data supplied from the image processing unit 613 or coded data of captured image data read from the storage unit 616 to the output unit 617 so as to output the coded data to the outside of the imaging apparatus 600. In addition, the codec processing unit 615 may supply captured image data before coding or decoded image data acquired by decoding coded data read from the storage unit 616 to the output unit 617 so as to output the supplied data to the outside of the imaging apparatus 600.

In addition, the codec processing unit 615 may transmit captured image data, coded data of captured image data, or decoded image data to another apparatus through the communication unit 618. Furthermore, the codec processing unit 615 may acquire captured image data of coded data of image data through the communication unit 618. The codec processing unit 615 appropriately performs coding, decoding, or the like for captured image data or coded data of image data acquired through the communication unit 618. The codec processing unit 615 may supply the image data or the coded data that is acquired to the image processing unit 613 as described above or output the acquired data to the storage unit 616, the output unit 617, or the communication unit 618.

The storage unit 616 stores coded data supplied from the codec processing unit 615 or the like. The coded data stored in the storage unit 616 is read by the codec processing unit 615 and is decoded as is necessary. The captured image data acquired through the decoding process is supplied to the display unit 614, and a captured image corresponding to the captured image data is displayed.

The output unit 617 includes an external output interface such as an external output terminal and outputs various kinds of data supplied through the codec processing unit 615 to the outside of the imaging apparatus 600 through the external output interface.

The communication unit 618 supplies various kinds of information such as image data or coded data supplied from the codec processing unit 615 to another apparatus that is a communication counterpart of predetermined communication (wired communication or wireless communication). In addition, the communication unit 618 acquires various kinds of information such as image data or coded data from another apparatus that is a communication counterpart of predetermined communication (wired communication or wireless communication) and supplies the acquired information to the codec processing unit 615.

The control unit 621 controls the operation of each processing unit (each processing unit illustrated inside a dotted line 620, the operation unit 622, and the drive 623) of the imaging apparatus 600.

The operation unit 622, for example, is configured by an arbitrary input device such as a jog shuttle dial (trademark), keys, buttons, or a touch panel and, for example, receives an operation input from a user or the like and supplies a signal corresponding to the operation input to the control unit 621.

The drive 623 reads information, for example, stored on a removable medium 624 such as a magnetic disk, an optical disc, a magneto-optical disk, or a semiconductor memory loaded therein. The drive 623 reads various kinds of information such as a program or data from the removable medium 624 and supplies the read information to the control unit 621. In addition, in a case where a writable removable medium 624 is loaded into the drive 623, for example, the drive 623 stores various kinds of information such as image data or coded data supplied through the control unit 621 on the removable medium 624.

As the CMOS image sensor 612 of the imaging apparatus 600 described above, the present technology described in each embodiment is applied. In other words, as the CMOS image sensor 612, the image sensor 100 described above is used. With this arrangement, the CMOS image sensor 612 can suppress degradation of the image quality of a captured image. Accordingly, the imaging apparatus 600 images a subject, thereby acquiring a captured image of improved image quality.

A series of the processes described above can be performed either by hardware or by software. In a case where the series of the processes is performed by software, a program configuring the software is installed from a network or a recording medium.

This recording medium, for example, as illustrated in FIG. 32, is configured by the removable medium 624, on which a program is stored, distributed for delivering the program to a user separately from the apparatus main body. This removable medium 624 includes a magnetic disk (including a flexible disk) or an optical disc (including a CD-ROM or a DVD). In addition, the removable medium 624 includes a magneto-optical disc (Mini Disc (MD)), a semiconductor memory, or the like.

In such a case, the program can be installed to the storage unit 616 by loading the removable medium 624 into the drive 623.

In addition, this program can be provided through a wired or wireless transmission medium such as a local area network, the Internet, or a digital satellite broadcast. In such a case, the program can be received by the communication unit 618 and be installed to the storage unit 616.

Furthermore, this program may be installed to a read only memory (ROM) disposed inside the storage unit 616 or the control unit 621 in advance.

Note that the program executed by a computer may be a program that performs a process in a time series in accordance with the sequence described in this specification or a program performing processes in parallel or performing a process at necessary timing such as at the time of being called.

Furthermore, in this specification, a step describing a program stored on a recording medium includes not only a process performed in a time series in accordance with the described sequence but also a process that is not necessarily performed in a time series but is performed parallel or individually.

In addition, the process of each step described above can be performed by each device described above or an arbitrary device other than each device described above. In such a case, the device performing the process may include a function (a functional block or the like) that is necessary for performing the process described above. In addition, information necessary for the process may be transmitted to the device as is appropriate.

Furthermore, in this specification, a system represents an aggregation of a plurality of constituent elements (devices, modules (components), and the like) regardless whether or not all the constituent elements are disposed inside a same casing. Thus, both a plurality of apparatuses that are housed in separate casings and are connected through a network and one apparatus in which a plurality of modules are housed in one casing are systems.

In addition, the configuration described above as one device (or a processing unit) may be divided to configure a plurality of devices (or processing units). To the contrary, a configuration described above as a plurality of devices (or processing units) may be configured altogether as one device (or a processing unit). In addition, a configuration other than that described above may be added to each device (or each processing unit). Furthermore, a part of the configuration of a certain device (or a certain processing unit) may be included in the configuration of another device (or another processing unit) as long as the configuration or the operation of the whole system is substantially the same.

As above, while preferred embodiments of the present disclosure have been described in detail with reference to the accompanying drawings, the technical scope of the present disclosure is not limited to such examples. It is apparent that a person skilled in the art of the technical field of the present disclosure can reach at various modified examples or various corrected examples in the categories of a technical idea described in the claims, and it is understood that such examples naturally belong to the technical scope of the present disclosure.

For example, the present technology can take a configuration of cloud computing in which one function is divided into a plurality of devices and is processed altogether by the devices through a network.

In addition, each step described in the flowchart described above may be either performed by one device or performed by a plurality of devices in a shared manner.

Furthermore, in a case where a plurality of processes are included in one step, the plurality of processes included in one step may be either performed by one device or performed by a plurality of devices in a shared manner.

In addition, the present technology is not limited thereto but may be performed as all the configurations mounted in a device configuring such a device or a system, for example, a processor as system large scale integration (LSI) or the like, a module using a plurality of processors and the like, a unit using a plurality of modules and the like, a set (in other words, a partial configuration of a device) acquired by adding other functions to a unit, or the like.

In addition, the present technology can take configurations as below.

(1) A circuit board including:

a conductor group, in which a conductor through which a current flows in a first direction and a conductor through which a current flows in a second direction that is approximately the opposite direction of the first direction are aligned in a third direction at positions at which an induced electromotive force is generated in a conductor loop in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

(2) The circuit board according to (1), in which a current of the conductor of the end portion is smaller than a current of another conductor.

(3) The circuit board according to (2) in which a current of the conductor of the end portion is about ½ of a current of another conductor.

(4) The circuit board according to any of (1) to (3), in which a cross-sectional area of a face of the conductor of the end portion that is vertical to the first direction is narrower than a cross-sectional area of a face of another conductor that is vertical to the first direction.

(5) The circuit board according to (4), in which the cross-sectional area of the face of the conductor of the end portion that is vertical to the first direction is about ½ of the cross-sectional area of the face of another conductor that is vertical to the first direction.

(6) The circuit board according to (4) or (5), in which a width of the conductor of the end portion is narrower than a width of another conductor.

(7) The circuit board according to any of (4) to (6), in which a thickness of the conductor of the end portion is smaller than a thickness of another conductor.

(8) The circuit board according to any of (1) to (7), in which electric resistance of the conductor of the end portion is higher than electric resistance of another conductor.

(9) The circuit board according to (8), in which electric resistance of the conductor of the end portion is about twice electric resistance of another conductor.

(10) The circuit board according to any of (1) to (9), in which joint impedance of the conductor of the end portion is higher than joint impedance of another conductor.

(11) The circuit board according to (10), in which the joint impedance of the conductor of the end portion is about twice the joint impedance of another conductor.

(12) The circuit board according to any of (1) to (11), in which series electric resistance for the conductor of the end portion is higher than series electric resistance for another conductor.

(13) The circuit board according to (12), in which the series electric resistance for the conductor of the end portion is about twice the series electric resistance for another conductor.

(14) The circuit board according to any of (1) to (13), in which series joint impedance of the conductor of the end portion is higher than series joint impedance of another conductor.

(15) The circuit board according to (14), in which the series joint impedance of the conductor of the end portion is about twice the series joint impedance of another conductor.

(16) The circuit board according to any of (1) to (15), further including a conductor through which the current flows in the opposite direction of the direction of the current of the conductor of the end portion near the conductor of the end portion.

(17) The circuit board according to (16), in which the current of the conductor through which the current flows in the opposite direction of the direction of the current of the conductor of the end portion is smaller than the current of the conductor of the end portion.

(18) The circuit board according to (17), in which the current of the conductor through which the current flows in the opposite direction of the direction of the current of the conductor of the end portion is about ½ of the current of the conductor of the end portion.

(19) The circuit board according to (16), in which a cross-sectional area of a face of the conductor through which the current flows in the opposite direction of the direction of the current of the conductor of the end portion that is vertical to the first direction is narrower than a cross-sectional area of a face of the conductor of the end portion that is vertical to the first direction.

(20) The circuit board according to (19), in which the cross-sectional area of the face of the conductor through which the current flows in the opposite direction of the direction of the current of the conductor of the end portion that is vertical to the first direction is about ½ of the cross-sectional area of the face of the conductor of the end portion that is vertical to the first direction.

(21) The circuit board according to (19) or (20), in which a width of the conductor through which the current flows in the opposite direction of the direction of the current of the conductor of the end portion is narrower than a width of the conductor of the end portion.

(22) The circuit board according to any of (19) to (21), in which thickness of the conductor through which the current flows in the opposite direction of the direction of the current of the conductor of the end portion is smaller than a thickness of the conductor of the end portion.

(23) The circuit board according to any of (16) to (22), in which electric resistance of the conductor through which the current flows in the opposite direction of the direction of the current of the conductor of the end portion is higher than electric resistance of the conductor of the end portion.

(24) The circuit board according to (23), in which electric resistance of the conductor through which the current flows in the opposite direction of the direction of the current of the conductor of the end portion is about twice electric resistance of the conductor of the end portion.

(25) The circuit board according to any of (16) to (24), in which joint impedance of the conductor through which the current flows in the opposite direction of the direction of the current of the conductor of the end portion is higher than joint impedance of the conductor of the end portion.

(26) The circuit board according to (25), in which the joint impedance of the conductor through which the current flows in the opposite direction of the direction of the current of the conductor of the end portion is about twice the joint impedance of the conductor of the end portion.

(27) The circuit board according to any of (16) to (26), in which series electric resistance for the conductor through which the current flows in the opposite direction of the direction of the current of the conductor of the end portion is higher than series electric resistance for the conductor of the end portion.

(28) The circuit board according to (27), in which series electric resistance for the conductor through which the current flows in the opposite direction of the direction of the current of the conductor of the end portion is about twice series electric resistance for the conductor of the end portion.

(29) The circuit board according to any of (16) to (28), in which series joint impedance for the conductor through which the current flows in the opposite direction of the direction of the current of the conductor of the end portion is higher than series joint impedance for the conductor of the end portion.

(30) The circuit board according to (29), in which the series joint impedance for the conductor through which the current flows in the opposite direction of the direction of the current of the conductor of the end portion is about twice the series joint impedance for the conductor of the end portion.

(31) The circuit board according to any of (1) to (30), in which a gap between the conductor of the end portion and another conductor adjacent to the conductor of the end portion and a gap between other conductors are different from each other.

(32) The circuit board according to any of (1) to (31), in which a position of the conductor of the end portion in a fourth direction vertical to the first direction and the third direction is different from a position of another conductor in the fourth direction.

(33) The circuit board according to any of (1) to (32), in which a current changing with respect to a time flows at approximately same timing in each conductor of the conductor group as the current.

(34) The circuit board according to any of (1) to (33), in which the conductor group has a periodical structure in which a plurality of conductor sets each formed by the conductors through which the current flows in the first direction aligned in predetermined order in the third direction and the conductor through which the current flows in the second direction are aligned in the third direction.

(35) The circuit board according to (34), in which at least any one of a width, a thickness, a length, conductivity, electric resistance, series electric resistance, joint impedance, series joint impedance, a gap, the number, a position in a fourth direction vertical to the first direction and the third direction, and the number of layers in the fourth direction is different between the conductor through which the current flows in the first direction and the conductor through which the current flows in the second direction in the conductor set.

(36) The circuit board according to (34) or (35), in which, in the conductor set, each conductor forms a multi-layer structure in a fourth direction vertical to the first direction and the third direction.

(37) The circuit board according to (36), in which, in the conductor set, at least any one of a width, a thickness, a length, conductivity, electric resistance, series electric resistance, joint impedance, series joint impedance, a gap, the number, the direction of the current, and a position in the third direction is different between at least some of the layers of each conductor in the fourth direction and the other layer.

(38) The circuit board according to (36) or (37), in which, in the conductor set, at least some of the layers of each conductor in the fourth direction form a short circuit with the other layer.

(39) An imaging device including:
a pixel unit including a plurality of pixels that performs photoelectric conversion of light transmitted from a subject in which a conductor loop formed by conductors having a size and a shape according to a selected pixel in selecting the pixel is substantially configured; and
a conductor group, in which a conductor through which a current flows in a first direction and a conductor through which a current flows in a second direction that is approximately the opposite direction of the first direction are aligned in a third direction at positions at which an induced electromotive force is generated in the conductor loop formed by the pixel unit in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

(40) An electronic apparatus including:
an imaging unit that images a subject; and
an image processing unit that performs image processing of image data acquired by imaging performed by the imaging unit,
in which the imaging unit includes:
a pixel unit including a plurality of pixels that performs photoelectric conversion of light transmitted from the subject in which a conductor loop formed by conductors having a size and a shape according to a selected pixel in selecting the pixel is substantially configured; and
a conductor group, in which a conductor through which a current flows in a first direction and a conductor through which a current flows in a second direction that is approximately the opposite direction of the first direction are aligned in a third direction at positions at which an induced electromotive force is generated in the conductor loop formed by the pixel unit in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

REFERENCE SIGNS LIST

100 Image sensor
101 Pixel chip
102 Logic chip
111 Pixel/analog processing unit
112 Digital processing unit
121 Pixel array
122 A/D converter
123 Vertical scanning unit
131 Unit Pixel
132 Vertical signal line
133 Control line
141 Photodiode
142 Transfer transistor
143 Reset transistor
144 Amplification transistor
145 Select transistor
150 Differential wiring group
151 Normal phase wiring
152 Reverse phase wiring
154 Differential wiring set
201 Additional wiring
301 Conductor
600 Imaging apparatus
612 CMOS image sensor

What is claimed is:
1. A circuit board comprising:
a conductor group, in which a conductor through which a current flows in a first direction and a conductor through which a current flows in a second direction that is approximately the opposite direction of the first direction are aligned in a third direction at positions at which an induced electromotive force is generated in a conductor loop in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

2. The circuit board according to claim 1, wherein a current of the conductor of the end portion is smaller than a current of another conductor.

3. The circuit board according to claim 1, wherein a cross-sectional area of a face of the conductor of the end portion that is vertical to the first direction is narrower than a cross-sectional area of a face of another conductor that is vertical to the first direction.

4. The circuit board according to claim 3, wherein the cross-sectional area of the face of the conductor of the end portion that is vertical to the first direction is about ½ of the cross-sectional area of the face of another conductor that is vertical to the first direction.

5. The circuit board according to claim 3, wherein a width of the conductor of the end portion is narrower than a width of another conductor.

6. The circuit board according to claim 3, wherein a thickness of the conductor of the end portion is smaller than a thickness of another conductor.

7. The circuit board according to claim 1, wherein electric resistance of the conductor of the end portion is higher than electric resistance of another conductor.

8. The circuit board according to claim 1, wherein series electric resistance for the conductor of the end portion is higher than series electric resistance for another conductor.

9. The circuit board according to claim 1, further comprising a conductor through which the current flows in the opposite direction of the direction of the current of the conductor of the end portion near the conductor of the end portion.

10. The circuit board according to claim 9, wherein the current of the conductor through which the current flows in the opposite direction of the direction of the current of the conductor of the end portion is smaller than the current of the conductor of the end portion.

11. The circuit board according to claim 9, wherein a cross-sectional area of a face of the conductor through which the current flows in the opposite direction of the direction of the current of the conductor of the end portion that is vertical to the first direction is narrower than a cross-sectional area of a face of the conductor of the end portion that is vertical to the first direction.

12. The circuit board according to claim 9, wherein electric resistance of the conductor through which the current flows in the opposite direction of the direction of the current of the conductor of the end portion is higher than electric resistance of the conductor of the end portion.

13. The circuit board according to claim 9, wherein series electric resistance for the conductor through which the current flows in the opposite direction of the direction of the current of the conductor of the end portion is higher than series electric resistance for the conductor of the end portion.

14. The circuit board according to claim 1, wherein a gap between the conductor of the end portion and another conductor adjacent to the conductor of the end portion and a gap between other conductors are different from each other.

15. The circuit board according to claim 1, wherein a position of the conductor of the end portion in a fourth direction vertical to the first direction and the third direction is different from a position of another conductor in the fourth direction.

16. The circuit board according to claim 1, wherein a current changing with respect to a time flows at approximately same timing in each conductor of the conductor group as the current.

17. The circuit board according to claim 1, wherein the conductor group has a periodical structure in which a plurality of conductor sets each formed by the conductors through which the current flows in the first direction aligned in predetermined order in the third direction and the conductor through which the current flows in the second direction are aligned in the third direction.

18. The circuit board according to claim 17, wherein at least any one of a width, a thickness, a length, conductivity, electric resistance, series electric resistance, joint impedance, series joint impedance, a gap, the number, a position in a fourth direction vertical to the first direction and the third direction, and the number of layers in the fourth direction is different between the conductor through which the current flows in the first direction and the conductor through which the current flows in the second direction in the conductor set.

19. An imaging device comprising:
a pixel unit including a plurality of pixels that performs photoelectric conversion of light transmitted from a subject in which a conductor loop formed by conductors having a size and a shape according to a selected pixel in selecting the pixel is substantially configured; and
a conductor group, in which a conductor through which a current flows in a first direction and a conductor through which a current flows in a second direction that is approximately the opposite direction of the first direction are aligned in a third direction at positions at which an induced electromotive force is generated in the conductor loop formed by the pixel unit in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

20. An electronic apparatus comprising:
an imaging unit that images a subject; and
an image processing unit that performs image processing of image data acquired by imaging performed by the imaging unit,
wherein the imaging unit includes:
a pixel unit including a plurality of pixels that performs photoelectric conversion of light transmitted from the subject in which a conductor loop formed by conductors having a size and a shape according to a selected pixel in selecting the pixel is substantially configured; and
a conductor group, in which a conductor through which a current flows in a first direction and a conductor through which a current flows in a second direction that is approximately the opposite direction of the first direction are aligned in a third direction at positions at which an induced electromotive force is generated in the conductor loop formed by the pixel unit in accordance with a magnetic field generated according to the currents, having a structure in which a conductor of at least one end portion of the conductor group in the third direction suppresses an induced electromotive force generated in the conductor loop in accordance with a magnetic field generated on the periphery of the conductor group in the third direction.

* * * * *